(12) United States Patent
Suzaki

(10) Patent No.: US 12,207,549 B2
(45) Date of Patent: *Jan. 21, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Yuji Suzaki, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 702 days.

This patent is subject to a terminal disclaimer.

(21) Appl. No.: 17/328,549

(22) Filed: May 24, 2021

(65) Prior Publication Data

US 2022/0045279 A1 Feb. 10, 2022

(30) Foreign Application Priority Data

Jul. 31, 2020 (KR) .................. 10-2020-0095833

(51) Int. Cl.
- H10K 85/60 (2023.01)
- H10K 50/11 (2023.01)
- H10K 85/40 (2023.01)
- H10K 101/10 (2023.01)

(52) U.S. Cl.
CPC .......... H10K 85/657 (2023.02); H10K 85/40 (2023.02); H10K 50/11 (2023.02); H10K 2101/10 (2023.02)

(58) Field of Classification Search
CPC ................ H10K 85/60; H10K 50/11
See application file for complete search history.

(56) References Cited

U.S. PATENT DOCUMENTS

| | | | |
|---|---|---|---|
| 9,012,599 B2 | 4/2015 | Stoessel et al. | |
| 10,374,166 B2 | 8/2019 | Hatakeyama et al. | |
| 2018/0331303 A1 | 11/2018 | Akashi | |
| 2021/0098716 A1* | 4/2021 | Lee .................... | H10K 50/121 |

FOREIGN PATENT DOCUMENTS

| | | | |
|---|---|---|---|
| CN | 109456326 | 3/2019 | |
| DE | 198 08 088 | 8/1999 | |
| JP | 11-339868 | 12/1999 | |
| JP | 2012-507507 | 3/2012 | |
| JP | 6009356 | 10/2016 | |
| KR | 10-1506919 | 3/2015 | |
| KR | 10-1546215 | 8/2015 | |
| KR | 10-1781235 | 9/2017 | |
| KR | 2021010406 A * | 1/2021 | ........... C07D 471/04 |
| WO | 2010/050778 | 5/2010 | |
| WO | 2015/102118 | 7/2015 | |

OTHER PUBLICATIONS

Zhang et al. "Synthesis, characterization, and electroluminescent properties of star shaped donor-acceptor dendrimers with carbazole dendrons as peripheral branches and heterotriangulene as central core" Tetrahedron, vol. 65, No. 23, pp. 4455-4463. (Year: 2009).*

David Hall et al., "Improving Processability and Efficiency of Resonant TADF Emitters: A Design Strategy", Advanced Optical Materials, 2020, pp. 1-10, vol. 8, 1901627.

Masaki Numata et al., "High efficiency pure blue thermally activated delayed fluorescence molecules having 10H-phenoxaborin and acridan units", Chem. Commun., Apr. 30, 2015, pp. 9443-9446, vol. 51.

In Seob Park et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", Advanced Functional Materials, 2018, pp. 1-12, vol. 28, 1802031.

Dieter HEllwinkel et al., "8.12-Dihydro-4H-benzo[1.9]chinolizino[3. 4.5.6.7-defg]acridin-trion-(4.8.12) und 5.9-Dihydro-chino[3.2.1-de]acridin-dion-(5.9)", Chem. Ber., 1971, pp. 1001-1016, vol. 104.

Yi Yuan et al., "The Design of Fused Amine/Carbonyl System for Efficient Thermally Activated Delayed Fluorescence: Novel Multiple Resonance Core and Electron Acceptor", Advanced Optical Material, 2019, pp. 1-6, 1801536.

Xing Li et al., "Thermally Activated Delayed Fluorescence Carbonyl Derivatives for Organic Light-Emitting Diodes with Extremely Narrow Full Width at Half-Maximum", ACS Applied Materials & Interfaces, Mar. 20, 2019, pp. 13472-13480, vol. 11.

Atsushi Ohwada et al., "Reaction of phenylhydrazines with arenes in the presence of aluminium trichloride", J. Chem Soc., Perkin Trans. I, Oct. 29, 2001, p. 3064-3068.

* cited by examiner

*Primary Examiner* — Kamal A Saeed
(74) *Attorney, Agent, or Firm* — KILE PARK REED & HOUTTEMAN PLLC

(57) ABSTRACT

An organic electroluminescence device includes a first electrode, a second electrode, and an emission layer disposed between the first electrode and the second electrode, wherein the emission layer includes a polycyclic compound represented by Formula 1, thereby showing improved emission efficiency.

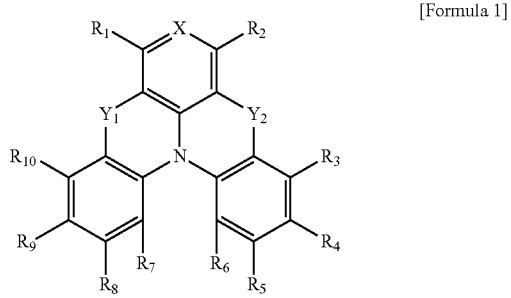

[Formula 1]

7 Claims, 6 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION(S)

This claims priority to and benefits of Korean Patent Application No. 10-2020-0095833 under 35 U.S.C. § 119, filed on Jul. 31, 2020 in the Korean Intellectual Property Office, the entire contents of which are incorporated herein by reference.

BACKGROUND

1. Technical Field

The disclosure herein relates to an organic electroluminescence device and a polycyclic compound used therein.

2. Description of the Related Art

Active development continues for an organic electroluminescence display as an image display. The organic electroluminescence display is different from a liquid crystal display and is a so-called self-luminescent display in which holes and electrons injected from a first electrode and a second electrode recombine in an emission layer so that a light-emitting material including an organic compound in the emission layer emits light to achieve display.

In the application of an organic electroluminescence device to a display, the improvement of emission efficiency and the life of the organic electroluminescence device is required, and continuous development is required for materials in an organic electroluminescence device which stably achieves such characteristics.

To accomplish the production of an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

SUMMARY

The disclosure provides an organic electroluminescence device showing excellent emission efficiency.

The disclosure also provides a polycyclic compound which is a material for an organic electroluminescence device having excellent emission efficiency properties.

According to an embodiment of the inventive concept, an organic electroluminescence device may include a first electrode; a second electrode disposed on the first electrode; and an emission layer disposed between the first electrode and the second electrode and including a polycyclic compound represented by Formula 1 below.

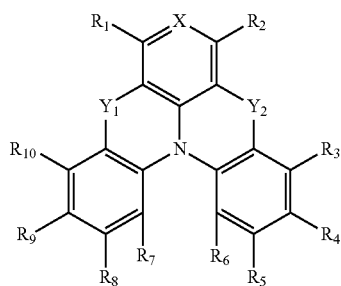

[Formula 1]

In Formula 1, X may be N or $-C(R_{11})$, $Y_1$, and $Y_2$ may each independently be $-C=O$, $-C=S$, or $-S=O$, $R_1$ to $R_{11}$ may each independently be a hydrogen atom, a deuterium atom, a halogen atom, a cyano group, a nitro group, a carbonyl group, a substituted or unsubstituted thio group, a substituted or unsubstituted amine group, a substituted or unsubstituted oxy group, a substituted or unsubstituted silyl group, a substituted or unsubstituted boryl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and at least one of $R_1$ to $R_{11}$ may be represented by Formula 2 or Formula 3 below.

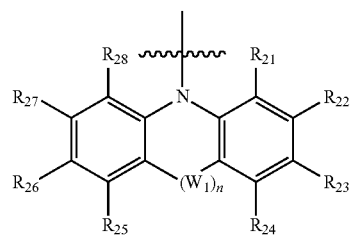

[Formula 2]

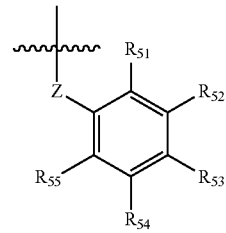

[Formula 3]

In Formula 2, n may be 0 or 1, $W_1$ may be a direct linkage, $-B(R_{29})$, $-C=O$, O, S, $-SO$, $-SO_2$, $-N(R_{30})$, $-P=O$, $-P(R_{31})$, or $-Si(R_{32})(R_{33})$. In Formula 3, Z may be $-B(R_{56})$, $-C=O$, O, S, $-SO$, $-SO_2$, $-N(R_{57})$, $-P=O$, $-P(R_{58})$, or $-Si(R_{59})(R_{60})$. In Formula 2 and Formula 3, $R_{21}$ to $R_{33}$, and $R_{51}$ to $R_{60}$ may each independently be a hydrogen atom, a deuterium atom, a halogen atom, a cyano group, a nitro group, a carbonyl group, a substituted or unsubstituted silyl group, a substituted or unsubstituted boryl group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group selected from $R_1$ to $R_{11}$, $R_{21}$ to $R_{33}$, and $R_{51}$ to $R_{60}$ to form a ring.

In an embodiment, Formula 1 may be represented by one of Formula 1-A1 to Formula 1-A6 below.

[Formula 1-A1]
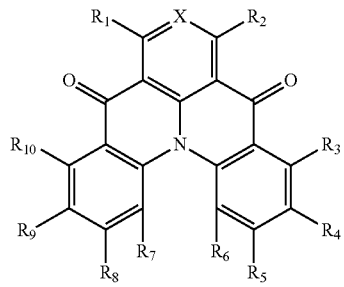

[Formula 1-A2]
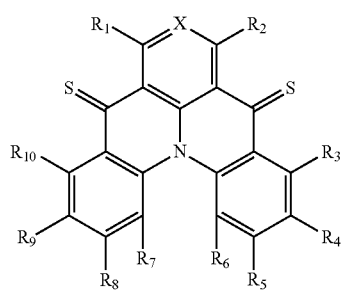

[Formula 1-A3]
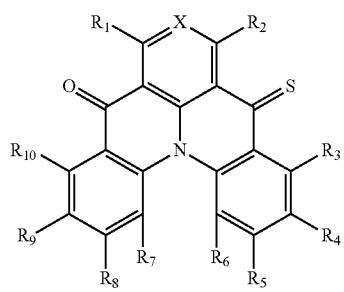

[Formula 1-A4]
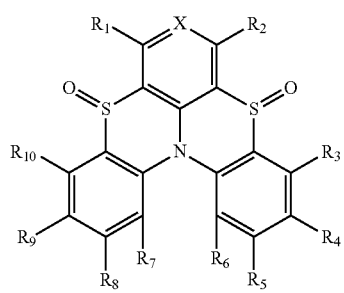

[Formula 1-A5]
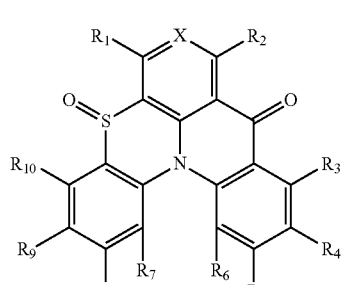

[Formula 1-A6]
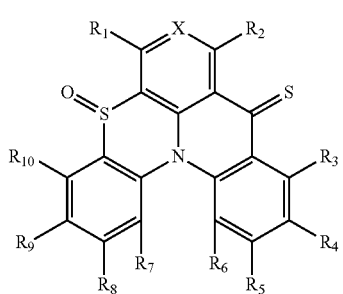

In Formula 1-A1 to Formula 1-A6, $R_1$ to $R_{11}$, and X may be the same as defined in Formula 1.

In an embodiment, Formula 1 may be represented by Formula 1-B1 or Formula 1-B2 below.

[Formula 1-B1]
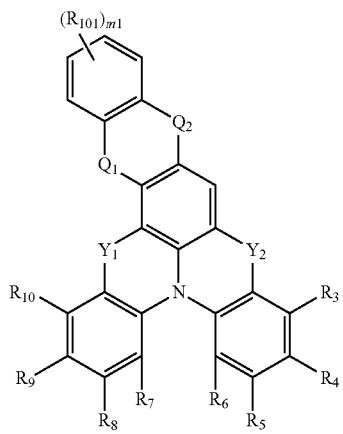

[Formula 1-B2]
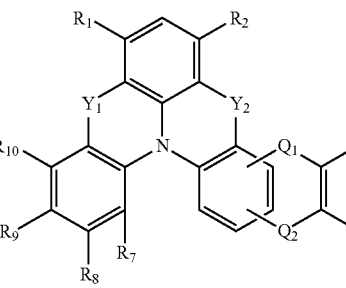

In Formula 1-B1 and Formula 1-B2, $Q_1$ and $Q_2$ may each independently be a direct linkage, —C($R_{102}$), —C=O, —B($R_{103}$), —N($R_{104}$), O, S, P, —P=O, or —Si($R_{105}$)($R_{106}$), m may be an integer from 1 to 4, $R_{101}$ to $R_{106}$ may each independently be a hydrogen atom, a deuterium atom, a halogen atom, a cyano group, a nitro group, a substituted or unsubstituted carbonyl group, a substituted or unsubstituted silyl group, a substituted or unsubstituted boryl group, a substituted or unsubstituted oxy group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and $R_1$ to $R_{10}$, X, $Y_1$, and $Y_2$ may be the same as defined in Formula 1.

In an embodiment, at least one of $Q_1$ and $Q_2$ may be $-B(R_{103})$, or $-N(R_{104})$.

In an embodiment, Formula 1-B2 may be represented by one of Formula 1-B2-1 to Formula 1-B2-3 below.

[Formula 1-B2-1]

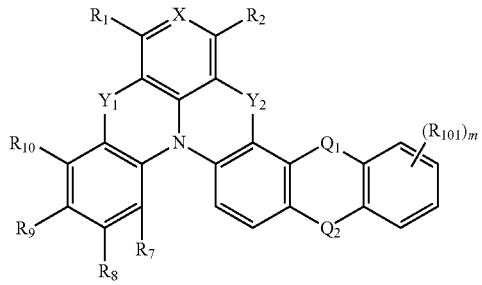

[Formula 1-B2-2]

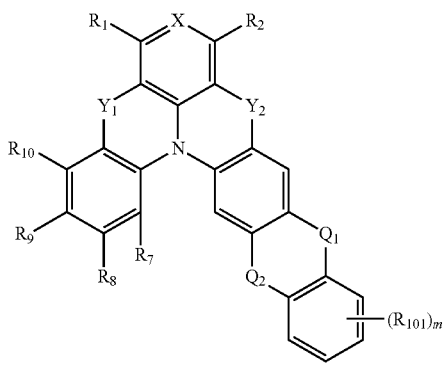

[Formula 1-B2-3]

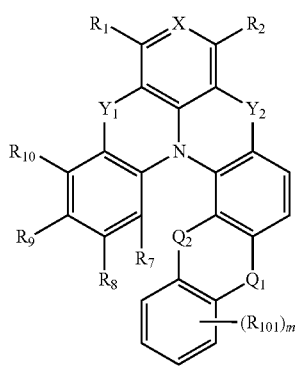

In Formula 1-B2-1 to Formula 1-B2-3, $R_1$, $R_2$, $R_7$ to $R_{10}$, $R_{101}$, m, $Q_1$, $Q_2$, X, $Y_1$, and $Y_2$ may be the same as defined in Formula 1-B2.

In an embodiment, Formula 1 may be represented by Formula 1-C below.

[Formula 1-C]

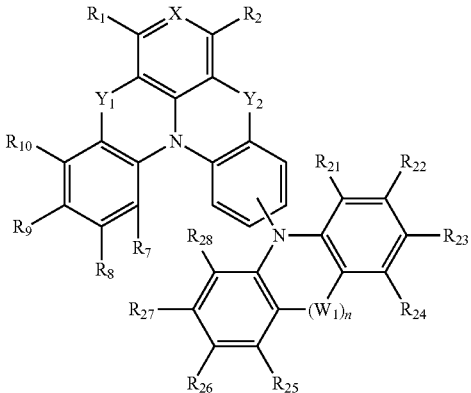

In Formula 1-C, $R_1$, $R_2$, $R_7$ to $R_{10}$, X, $Y_1$, $Y_2$, $R_{21}$ to $R_{28}$, n, and $W_1$ may be the same as defined in Formula 1 and Formula 2.

In an embodiment, in Formula 1, when X is $-C(R_{11})$, $R_{11}$ may be a hydrogen atom, a deuterium atom, a methyl group, an isopropyl group, a t-butyl group, a substituted amine group, or a substituted phenyl group.

In an embodiment, Formula 2 may be represented by Formula 2-1 or Formula 2-2 below.

[Formula 2-1]

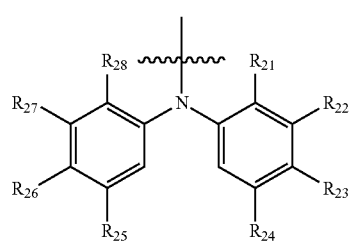

[Formula 2-2]

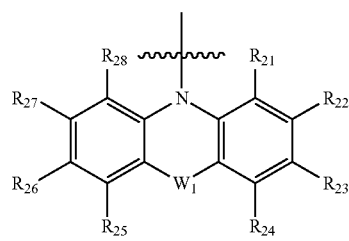

In Formula 2-1 and Formula 2-2, $R_{21}$ to $R_{28}$, and $W_1$ may be the same as defined in Formula 2.

In an embodiment, the organic electroluminescence device may have an external quantum efficiency in a range of about 10% to about 20%, at a luminance of about 1,000 $cd/m^2$.

In an embodiment, the emission layer may emit delayed fluorescence.

According to an embodiment of the inventive concept, an organic electroluminescence device may include a first electrode; a second electrode disposed on the first electrode; and an emission layer disposed between the first electrode and the second electrode and including a polycyclic compound represented by Formula 1 above, wherein the polycyclic compound may have an external quantum efficiency in a range of about 10% to about 20%, at a luminance of about 1,000 $cd/m^2$.

In another embodiment of the inventive concept, there is provided a polycyclic compound represented by Formula 1.

BRIEF DESCRIPTION OF THE DRAWINGS

The accompanying drawings are included to provide a further understanding of the inventive concept and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
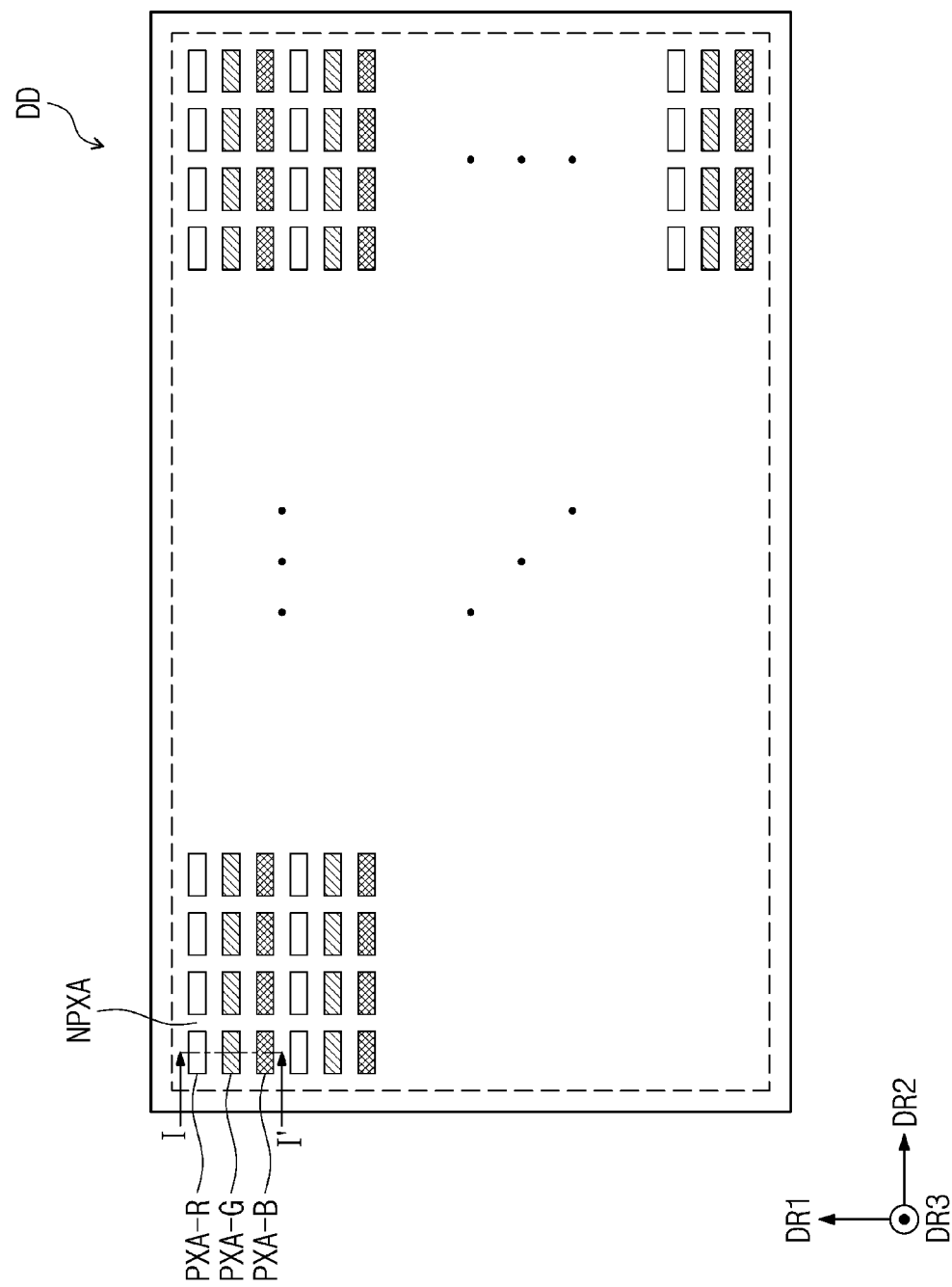
FIG. 1 is a plan view showing a display apparatus according to an embodiment.

The inventive concept may have various modifications and may be embodied in different forms, and embodiments will be explained in detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

It will be understood that when an element (or region, layer, part, etc.) is referred to as being "on", "connected to" or "coupled to" another element, it can be directly on, connected to, or coupled to the other element, or one or more intervening elements may be present therebetween.

Like reference numerals refer to like elements throughout the specification. In the drawings, the thicknesses, the ratios, and the dimensions of constituent elements may be exaggerated for effective explanation of technical contents. Therefore, as the sizes and thicknesses of components in the drawings may be arbitrarily illustrated for convenience of explanation, such embodiments of the disclosure are not limited thereto.

As used herein, the expressions used in the singular such as "a," "an," and "the" are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element.

The terms "below", "beneath", "on" and "above" are used for explaining the relation of elements shown in the drawings. The terms are relative concept and are explained based on the direction shown in the drawing.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or 5% of the stated value.

It will be further understood that the terms "comprises," "comprising," "includes," "including," "have," "having," "contains," "containing," and the like specify the presence of stated features, numerals, steps, operations, elements, parts, or the combination thereof, but do not preclude the presence or addition of one or more other features, numerals, steps, operations, elements, parts, or the combination thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, an organic electroluminescence device according to an embodiment of the inventive concept and a polycyclic compound of an embodiment included therein will be explained with reference to accompanying drawings.

Figure 2:
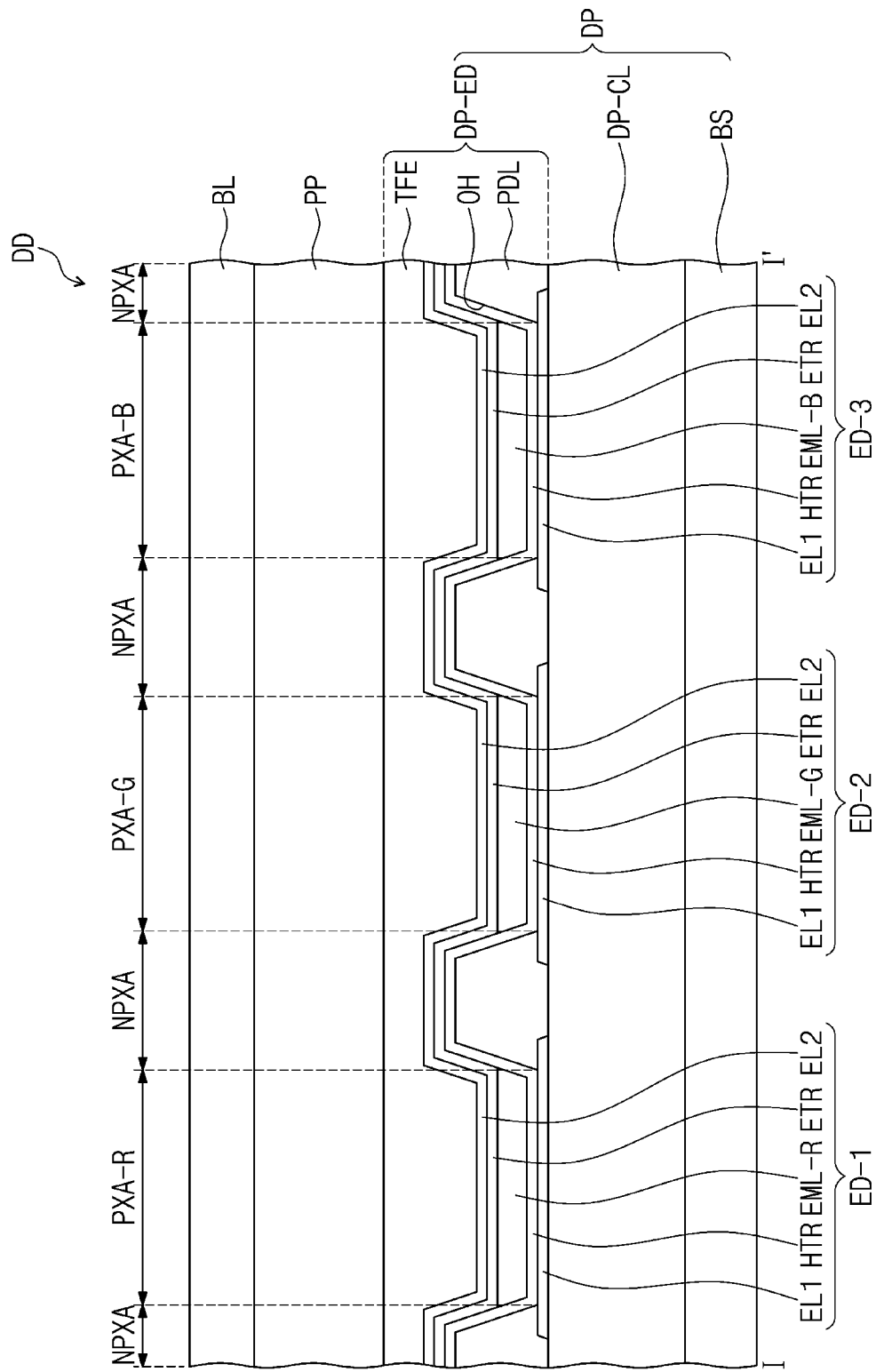
FIG. 2 is a schematic cross-sectional view showing a display apparatus according to an embodiment.

FIG. 1 is a plan view showing an embodiment of a display apparatus DD. FIG. 2 is a schematic cross-sectional view showing a display apparatus DD of an embodiment. FIG. 2 is a schematic cross-sectional view showing a part corresponding to line I-I' in FIG. 1. The display apparatuses DD and DD-TD of embodiments may include an organic electroluminescence device ED according to an embodiment. At least one of organic electroluminescence devices ED-1, ED-2, and ED-3, which will be explained later, may be the organic electroluminescence device ED according to an embodiment. At least one of organic electroluminescence devices ED-1, ED-2, and ED-3 may include a polycyclic compound of an embodiment. An organic electroluminescence device ED-BT (FIG. 8) with a tandem structure, which will be explained later, may include the polycyclic compound of an embodiment in at least one emission layer among multiple emission layers.

The display apparatus DD according to an embodiment may be an apparatus activated by electrical signals. For example, the display apparatus DD may be a personal computer, a laptop computer, a personal digital terminal, a car navigation unit, a game console, a smart phone, a tablet, or a camera. These are only suggested embodiments, and others may be employed as long as they do not deviate from the inventive concept.

The display apparatus DD may include a display panel DP and an optical layer PP disposed on the display panel DP. The display panel DD may include organic electroluminescence devices ED-1, ED-2, and ED-3. The display panel DD may include multiple organic electroluminescence devices ED-1, ED-2, and ED-3. The optical layer PP may be disposed on the display panel DP and control light that is reflected by external light at the display panel DP. The optical layer PP may include, for example, a polarization layer or a color filter layer. In contrast to the drawings, the optical layer PP may be omitted in the display device DD of an embodiment.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one among an acrylic resin, a silicon-based resin, and an epoxy-based resin.

The display panel DP may include a base layer BS, a circuit layer DP-CL provided on the base layer BS and a display device layer DP-ED. The display device layer DP-ED may include a pixel definition layer PDL, organic electroluminescence devices ED-1, ED-2, and ED-3 disposed between the pixel definition layers PDL, and an encapsulating layer TFE disposed on the organic electroluminescence devices ED-1, ED-2, and ED-3.

The base layer BS may be a member providing a base surface where the display device layer DP-ED is disposed. The base layer BS may be a glass substrate, a metal substrate, a plastic substrate, etc. However, an embodiment of the inventive concept is not limited thereto, and the base layer BS may be an inorganic layer, an organic layer, or a composite material layer.

In an embodiment, the circuit layer DP-CL is disposed on the base layer BS, and the circuit layer DP-CL may include multiple transistors (not shown). Each of the transistors (not shown) may include a control electrode, an input electrode, and an output electrode. For example, the circuit layer DP-CL may include switching transistors and driving transistors for driving the organic electroluminescence devices ED-1, ED-2, and ED-3 of the display device layer DP-ED.

Each of the organic electroluminescence devices ED-1, ED-2, and ED-3 may have the structure of an organic electroluminescence device ED of an embodiment according to FIG. 3 to FIG. 6, which will be explained later. Each of the organic electroluminescence devices ED-1, ED-2, and ED-3 may include a first electrode EL1, a hole transport region HTR, emission layers EML-R, EML-G, and EML-B, an electron transport region ETR, and a second electrode EL2.

In FIG. 2, an embodiment is shown where the emission layers EML-R, EML-G, and EML-B of organic electroluminescence devices ED-1, ED-2, and ED-3, which are in opening portions OH defined in the pixel definition layer PDL, are disposed, and the hole transport region HTR, the electron transport region ETR and the second electrode EL2 are provided as common layers in all organic electroluminescence devices ED-1, ED-2, and ED-3. However, an embodiment of the inventive concept is not limited thereto. Different from FIG. 2, in an embodiment, the hole transport region HTR and the electron transport region ETR may be patterned and provided in the opening portions OH defined in the pixel definition layer PDL. For example, in an embodiment, the hole transport region HTR, the emission layers EML-R, EML-G, and EML-B, and the electron transport region ETR of the organic electroluminescence devices ED-1, ED-2, and ED-3 may be patterned by an ink jet printing method and provided.

The encapsulating layer TFE may cover the organic electroluminescence devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer protects the display device layer DP-ED from moisture and/or oxygen, and the encapsulating organic layer protects the display device layer DP-ED from foreign materials such as dust particles. The encapsulating inorganic layer may include a silicon nitride layer, a silicon oxy nitride layer, a silicon oxide layer, a titanium oxide layer, or an aluminum oxide layer, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed while charging the opening portion OH.

Referring to FIG. 1 and FIG. 2, the display apparatus DD may include a non-luminous area NPXA and luminous areas PXA-R, PXA-G, and PXA-B. The luminous areas PXA-R, PXA-G, and PXA-B may be areas emitting light produced from the organic electroluminescence devices ED-1, ED-2, and ED-3, respectively. The luminous areas PXA-R, PXA-G, and PXA-B may be separated from each other on a plane.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may be areas corresponding to the pixel definition layer PDL. In the disclosure, each of the luminous areas PXA-R, PXA-G, and PXA-B may correspond to each pixel. The pixel definition layer PDL may define each of the organic electroluminescence devices ED-1, ED-2, and ED-3. The emission layers EML-R, EML-G, and EML-B of the organic electroluminescence devices ED-1, ED-2, and ED-3 may be disposed and defined in the opening portions OH defined by the pixel definition layer PDL.

The luminous areas PXA-R, PXA-G, and PXA-B may be divided into numbers of groups according to the color of light produced from the organic electroluminescence devices ED-1, ED-2, and ED-3. In the display apparatus DD of an embodiment, shown in FIG. 1 and FIG. 2, three luminous areas PXA-R, PXA-G, and PXA-B emitting red light, green light and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, multiple organic electroluminescence devices ED-1, ED-2, and ED-3 may emit light having different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, each of the red luminous area PXA-R, the green luminous area PXA-G, and the blue luminous area PXA-B may correspond to the first organic electroluminescence device ED-1, the second organic electroluminescence device ED-2, and the third organic electroluminescence device ED-3. The third organic electroluminescence device ED-3 emitting blue light may include the polycyclic compound of an embodiment, which will be explained later.

However, an embodiment of the inventive concept is not limited thereto, and the first to third organic electroluminescence devices ED-1, ED-2, and ED-3 may emit light in the same wavelength region, or at least one thereof may emit light in a different wavelength region. For example, the first to third organic electroluminescence devices ED-1, ED-2, and ED-3 may each emit blue light.

The luminous areas PXA-R, PXA-G, and PXA-B in the display apparatus DD according to an embodiment may be arranged in a stripe shape. Referring to FIG. 1, multiple red luminous areas PXA-R, multiple green luminous areas PXA-G and multiple blue luminous areas PXA-B may be arranged along a second directional axis DR2. The red luminous area PXA-R, the green luminous area PXA-G, and the blue luminous area PXA-B may be arranged by turns along a first directional axis DR1.

In FIG. 1 and FIG. 2, the areas of the luminous areas PXA-R, PXA-G, and PXA-B are shown similar, but an embodiment of the inventive concept is not limited thereto. The areas of the luminous areas PXA-R, PXA-G, and PXA-B may be different from each other according to the wavelength region of light emitted. The areas of the luminous areas PXA-R, PXA-G, and PXA-B may mean areas on a plane defined by the first directional axis DR1 and the second directional axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the properties of display quality required for the display apparatus DD. For example, the arrangement type of the luminous areas PXA-R, PXA-G, and PXA-B may be a pentile arrangement type, or a diamond arrangement type.

The areas of the luminous areas PXA-R, PXA-G, and PXA-B may be different from each other. For example, in an embodiment, the area of the green luminous area PXA-G may be smaller than the area of the blue luminous area PXA-B, but an embodiment of the inventive concept is not limited thereto.

FIG. 3 to FIG. 6 are schematic cross-sectional views showing organic electroluminescence devices according to embodiments. The organic electroluminescence device ED according to an embodiment may include a first electrode EL1, a hole transport region HTR, an emission layer EML, an electron transport region ETR, and a second electrode EL2.

Figure 3:
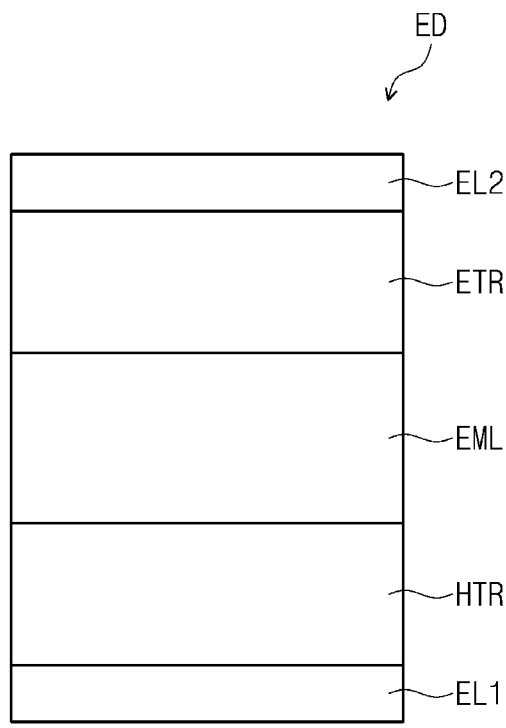
FIG. 3 is a schematic cross-sectional view showing an organic electroluminescence device of an embodiment.
Figure 4:
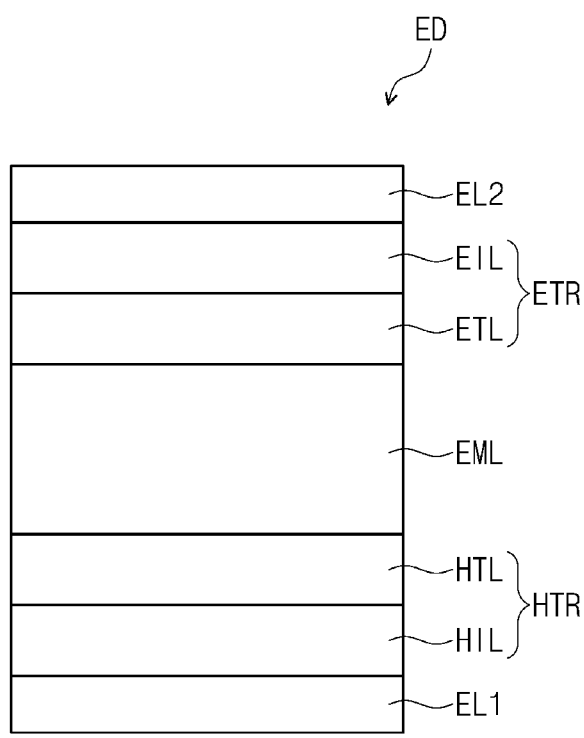
FIG. 4 is a schematic cross-sectional view showing an organic electroluminescence device of an embodiment.
Figure 5:
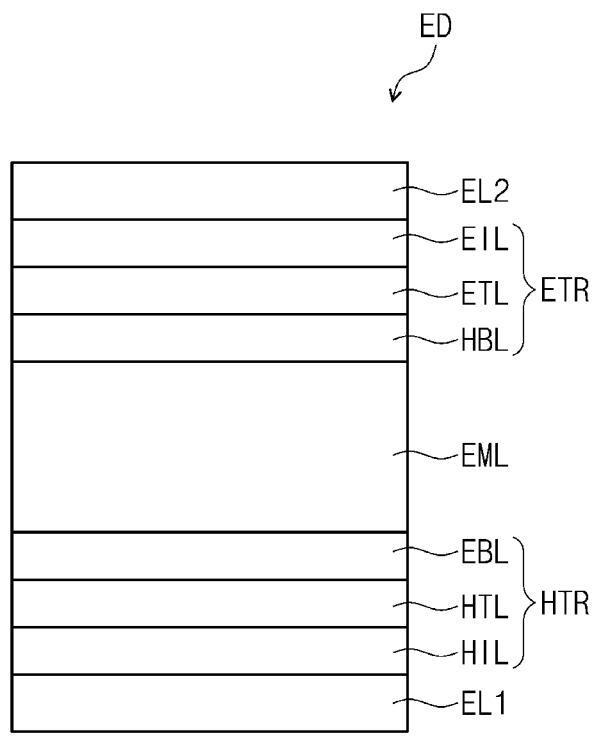
FIG. 5 is a schematic cross-sectional view showing an organic electroluminescence device of an embodiment.
Figure 6:
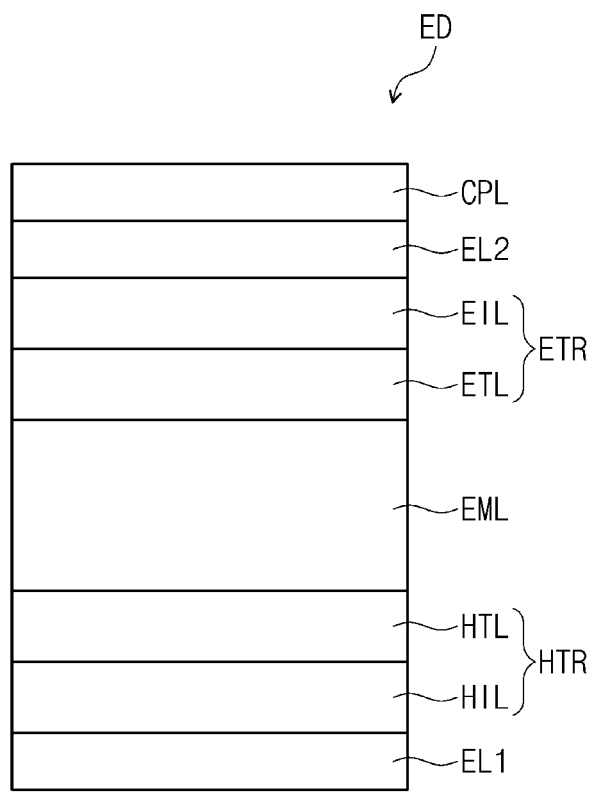
FIG. 6 is a schematic cross-sectional view showing an organic electroluminescence device of an embodiment.

In comparison to FIG. 3, FIG. 4 shows the cross-sectional view of an organic electroluminescence device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows the cross-sectional view of an organic electroluminescence device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows the cross-sectional view of an organic electroluminescence device ED of an embodiment, including a capping layer CPL disposed on the second electrode EL2.

The first electrode EL1 has conductivity. The first electrode EL1 may be formed using a metal material, a metal alloy, or a conductive compound. The first electrode EL1 may be an anode or a cathode. However, an embodiment of the inventive concept is not limited thereto.

The first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). The first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, an embodiment of the inventive concept is not limited thereto. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission auxiliary layer (not shown), and an electron blocking layer EBL. The thickness of the hole transport region HTR may be in a range of about 50 Å to about 15,000 Å.

The hole transport region HTR may have a single layer formed using a single material, a single layer formed using multiple different materials, or a multilayer structure including multiple layers formed using multiple different materials.

For example, the hole transport region HTR may have the structure of a single layer of a hole injection layer HIL or a hole transport layer HTL, and may have a structure of a single layer formed using a hole injection material and a hole transport material. For example, the hole transport region HTR may have a structure of a single layer formed using multiple of different materials, or a structure stacked from the first electrode EL1 of hole injection layer HIL/hole transport layer HTL, hole injection layer HIL/hole transport layer HTL/buffer layer (not shown), hole injection layer HIL/buffer layer (not shown), hole transport layer HTL/buffer layer, or hole injection layer HIL/hole transport layer HTL/electron blocking layer EBL, without limitation.

The hole transport region HTR may be formed using various methods such as a vacuum deposition method, a spin coating method, a cast method, a *Langmuir*-Blodgett (LB)

method, an inkjet printing method, a laser printing method, and a laser induced thermal imaging (LITI) method.

The hole transport region HTR may include, for example, a phthalocyanine compound such as copper phthalocyanine, $N^1,N^{1'}$—([1,1'-biphenyl]-4,4'-diyl)bis($N^1$-(phenyl-$N^4$,$N^4$-di-m-tolylbenzene-1,4-diamine (DNTPD), 4,4',4''-[tris(3-methylphenyl)phenylamino]triphenylamine (m-MTDATA), 4,4',4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2', 3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include a compound represented by Formula H-1 below.

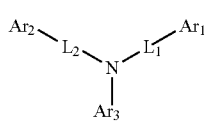

[Formula H-1]

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_n$ may be a substituted or unsubstituted aryl group of 6 to 30 ring-forming carbon atoms.

The compound represented by Formula H-1 may be a monoamine compound. Otherwise, the compound represented by Formula H-1 may be a diamine compound in which at least one of $Ar_1$ to $Ar_n$ may include an amine group as a substituent. Further, the compound represented by Formula H-1 may be a carbazole-based compound in which a substituted or unsubstituted carbazole group is included in at least one of $Ar_1$ and $Ar_2$, or a fluorene-based compound in which a substituted or unsubstituted fluorene group is included in at least one of $Ar_1$ and $Ar_2$.

The compound represented by Formula H-1 may be represented by a compound represented in Compound Group H below. However, the compounds illustrated in Compound Group H are embodiments, and the compound represented by Formula H-1 is not limited to those represented in Compound Group H below.

[Compound Group H]

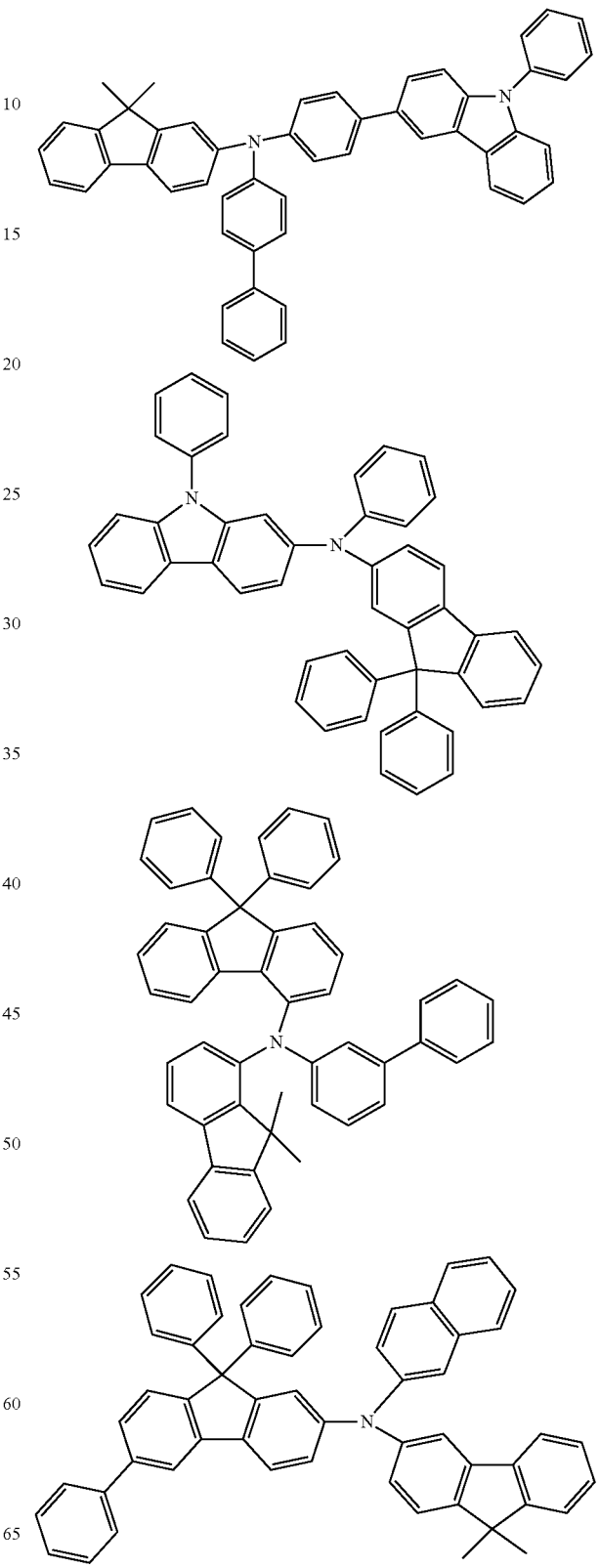

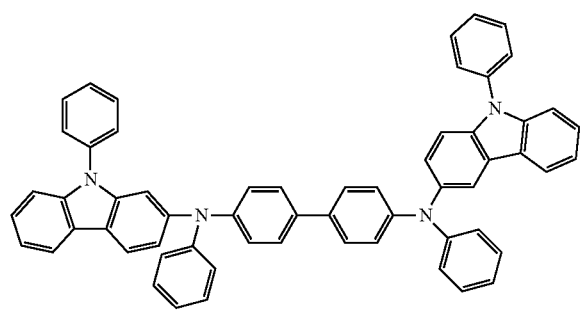
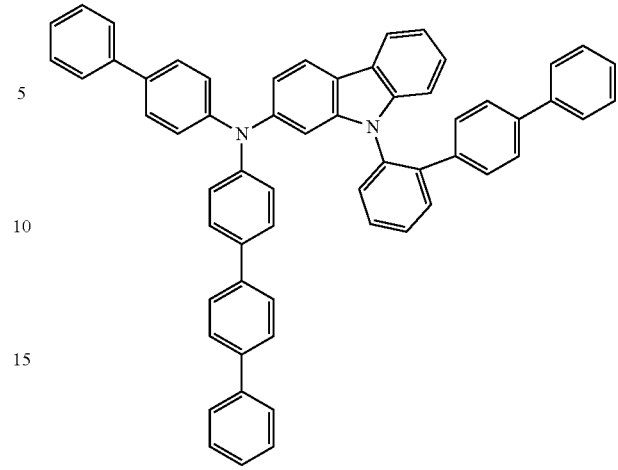
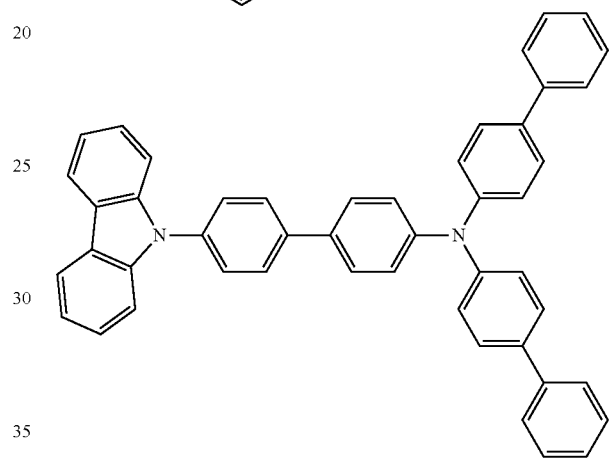
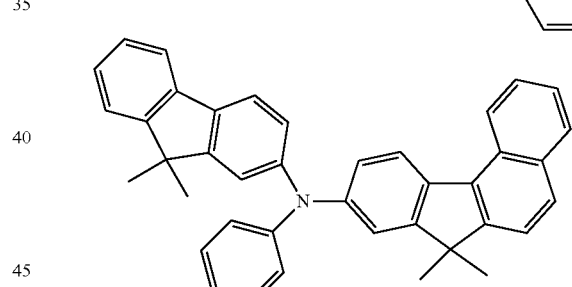
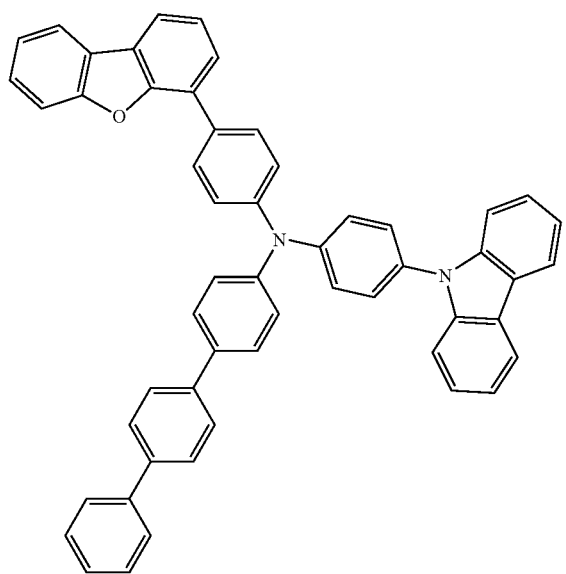

17
-continued

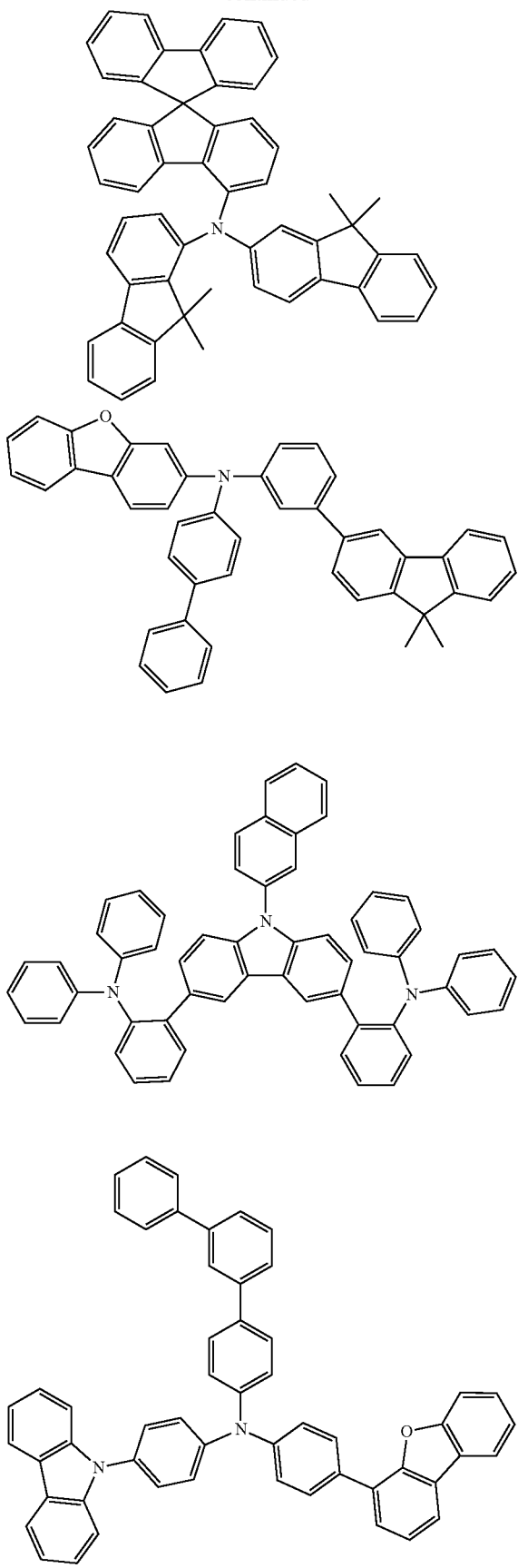

18
-continued

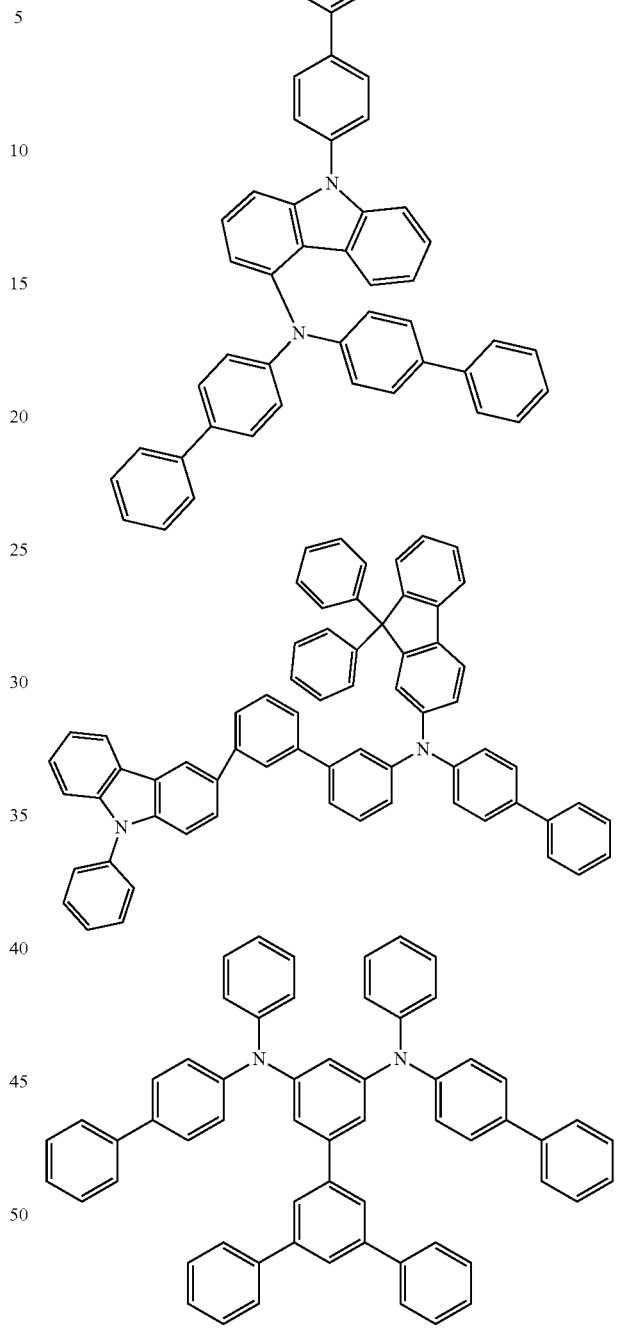

A thickness of the hole transport region HTR may be in a range of about 100 Å to about 10,000 Å. For example, the thickness of the hole transport region HTR may be in a range of about 100 Å to about 5,000 Å. A thickness of the hole injection region HIL may be, for example, in a range of about 30 Å to about 1,000 Å, and a thickness of the hole transport layer HTL may be in a range of about 30 Å to about 1,000 Å. For example, a thickness of the electron blocking layer EBL may be in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may include at least one among halogenated metal compounds, quinone derivatives, metal oxides, and cyano group-containing compounds, without limitation. For example, the p-dopant may include halogenated metal compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide, and molybdenum oxide, cyano group-containing compounds such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile, without limitation.

As described above, the hole transport region HTR may further include at least one of a hole butter layer (now shown) and an electron blocking layer EBL in addition to the hole injection layer HIL and the hole transport layer HTL. The hole buffer layer (not shown) may compensate an optical resonance distance according to the wavelength of light emitted from an emission layer EML and may increase light emission efficiency. Materials which may be included in a hole transport region HTR may be used as materials included in a hole buffer layer (not shown). The electron blocking layer EBL may be a layer that prevents electron injection from the electron transport region ETR to the hole transport region HTR.

The emission layer EML may be provided on the hole transport region HTR. The emission layer EML may have a thickness of, for example, in a range of about 100 Å to about 1,000 Å. For example, the thickness of the emission layer EML may be in a range of about 100 Å to about 300 Å. The emission layer EML may have a single layer formed using a single material, a single layer formed using multiple different materials, or a multilayer structure having multiple layers formed using multiple different materials.

In the organic electroluminescence device ED of an embodiment, the emission layer EML may include the polycyclic compound of an embodiment.

In the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkynyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the description, the term "combined with an adjacent group to form a ring" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles or polycycles. The ring formed via the combination with an adjacent group may be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may be a fluorine atom, a chlorine atom, a bromine atom, or an iodine atom.

In the description, the alkyl may be a linear, branched, or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the aryl group means an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the heteroaryl group may include one or more among B, O, N, P, Si and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the description, the silyl group includes an alkyl silyl group and an aryl silyl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the carbon number of a carbonyl group is not specifically limited, but the carbon number may be 1 to 40, 1 to 30, or 1 to 20. For example, the carbonyl group may have the structures below, but is not limited thereto.

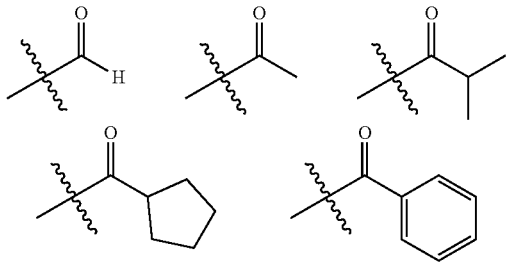

In the description, the thiol group may include an alkyl thio group and an aryl thio group. The thiol group may mean the above-defined alkyl group or aryl group combined with a sulfur atom. Examples of the thiol group include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, the oxy group may mean the above-defined alkyl group or aryl group combined with an oxygen atom. The oxy group may include an alkoxy group and an aryl oxy group. The alkoxy group may be a linear, branched, or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, an embodiment of the inventive concept is not limited thereto.

In the description, the carbon number of the amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methylanthracenylamine group, a triphenylamine group, etc., without limitation.

In the description, the boryl group may mean the above-defined alkyl group or aryl group combined with a boron atom. The boryl group includes an alkyl boryl group and an aryl boryl group. Examples of the boryl group include a trimethylboryl group, a triethylboryl group, a t-butyldimethylboryl group, a triphenylboryl group, a diphenylboryl group, a phenylboryl group, etc., without limitation.

In the description,

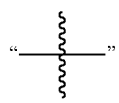

means a position to be connected.

The emission layer EML of the organic electroluminescence device ED of an embodiment may include a polycyclic compound of an embodiment, represented by Formula 1 below.

[Formula 1]

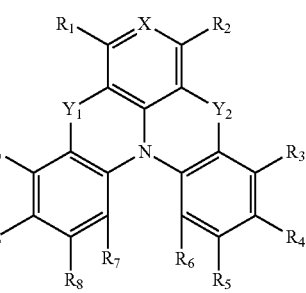

In Formula 1, X may be N or —C($R_{11}$). According to an embodiment, when X is —C($R_{11}$) in Formula 1, Ru may be a hydrogen atom, a deuterium atom, a methyl group, an isopropyl group, a t-butyl group, a substituted amine group, or a substituted phenyl group. The substituted amine group may be an amine group substituted with a phenyl group, and the phenyl group may be substituted or unsubstituted. The substituted phenyl group may be a phenyl group substituted with a methyl group.

In Formula 1, $Y_1$ and $Y_2$ may each independently be —C=O, —C=S, or —S=O. For example, $Y_1$ and $Y_2$ may be the same. For example, $Y_1$ and $Y_2$ may be different from each other. In Formula 1, $R_1$ to $R_{11}$ may each independently be a hydrogen atom, a deuterium atom, a halogen atom, a cyano group, a nitro group, a carbonyl group, a substituted or unsubstituted thio group, a substituted or unsubstituted amine group, a substituted or unsubstituted oxy group, a substituted or unsubstituted silyl group, a substituted or unsubstituted boryl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. Any one among $R_3$ to $R_6$, and any one among $R_7$ to $R_{10}$ may not be combined with each other to form a ring. For example, $R_6$ and $R_7$ may not be combined with each other to form a ring. For example, $R_5$ and $R_7$ may not be combined with each other to form a ring.

In Formula 1, any one among $R_1$ to $R_{11}$ may be a silyl group, or a boryl group. The silyl group may be a silyl group substituted with an aryl group, or an alkyl group. The boryl group may be a boryl group substituted with an aryl group. For example, the silyl group may be substituted with a phenyl group, or a methyl group. The boryl group may be substituted with a phenyl group, and the phenyl group may be substituted or unsubstituted. However, these are only illustrations, and an embodiment of the inventive concept is not limited thereto.

In Formula 1, any one among $R_1$ to $R_{11}$ may be a deuterium atom. The polycyclic compound of an embodiment may include at least one deuterium atom as a substituent.

In Formula 1, at least one of $R_1$ to $R_{11}$ may be represented by Formula 2 or Formula 3 below. At least one of $R_1$ to $R_{11}$ may be a substituted or unsubstituted diphenylamine.

[Formula 2]

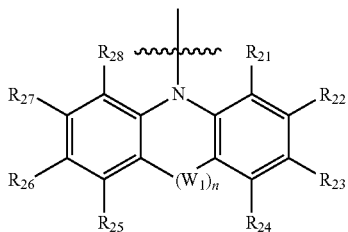

[Formula 3]

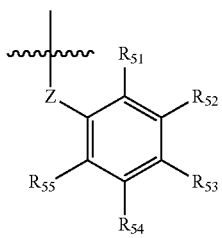

In Formula 2, n may be 0 or 1. If n is 0, a phenyl group including $R_{21}$ to $R_{24}$ and a phenyl group including $R_{25}$ to $R_{29}$ may be combined by only a nitrogen atom. If n is 1, a phenyl group including $R_{21}$ to $R_{24}$ and a phenyl group including $R_{25}$ to $R_{29}$ may form a fused cycle of three rings together with a ring group including a nitrogen atom and $W_1$.

In Formula 2, $W_1$ may be a direct linkage, —$B(R_{29})$, —C=O, O, S, —SO, —$SO_2$, —$N(R_{30})$, —P=O, —$P(R_{31})$, or —$Si(R_{32})(R_{33})$. In Formula 3, Z may be —$B(R_{56})$, —C=O, O, S, —SO, —$SO_2$, —$N(R_{57})$, —P=O, —$P(R_{58})$, or —$Si(R_{59})(R_{60})$.

In Formula 2 and Formula 3, $R_{21}$ to $R_{33}$, and $R_{51}$ to $R_{60}$ may each independently be a hydrogen atom, a deuterium atom, a halogen atom, a cyano group, a nitro group, a carbonyl group, a substituted or unsubstituted silyl group, a substituted or unsubstituted boryl group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group selected from $R_1$ to $R_{11}$, $R_{21}$ to $R_{33}$, and $R_{51}$ to $R_{60}$ to form a ring.

For example, in Formula 2 and Formula 3, $R_{29}$ to $R_{33}$, and $R_{56}$ to $R_{60}$ may be each independently a substituted or unsubstituted aryl group. $R_{29}$ to $R_{33}$, and $R_{56}$ to $R_{60}$ may be each independently a substituted or unsubstituted phenyl group. However, these are illustrations, and an embodiment of the inventive concept is not limited thereto.

In Formula 1, if any one among $R_3$ to $R_5$ is represented by Formula 2, $R_{21}$ to $R_{28}$ may be combined with any one among $R_3$ to $R_5$ to form an aryl group, or a heteroaryl group. If $R_3$ is represented by Formula 2, $R_{21}$ or $R_{28}$ may be combined with carbon bonded to $R_4$, or $R_4$ to form an aryl group, or a heteroaryl group. If $R_4$ is represented by Formula 2, $R_{21}$ or $R_{28}$ may be combined with carbon bonded to $R_3$, or $R_3$ to form an aryl group, or a heteroaryl group. If $R_4$ is represented by Formula 2, $R_{21}$ or $R_{28}$ may be combined with carbon bonded to $R_5$, or $R_5$ to form an aryl group, or a heteroaryl group. If $R_5$ is represented by Formula 2, $R_{21}$ or $R_{28}$ may be combined with carbon bonded to $R_4$, or $R_4$ to form an aryl group or a heteroaryl group.

If any one among $R_3$ to $R_5$ is represented by Formula 3, $R_{51}$ may be combined with any one among $R_3$ to $R_5$ to form an aryl group or a heteroaryl group. If $R_3$ is represented by Formula 3, $R_{51}$ may be combined with carbon bonded to $R_4$, or $R_4$ to form an aryl group, or a heteroaryl group. If $R_4$ is represented by Formula 3, $R_{51}$ may be combined with carbon bonded to $R_3$, or $R_3$ to form an aryl group, or a heteroaryl group. If $R_4$ is represented by Formula 3, $R_{51}$ may be combined with carbon bonded to $R_5$, or $R_5$ to form an aryl group, or a heteroaryl group. If $R_5$ is represented by Formula 3, $R_{51}$ may be combined with carbon bonded to $R_4$, or $R_4$ to form an aryl group or a heteroaryl group.

If any one among $R_1$, $R_2$, and $R_{11}$ is represented by Formula 2, $R_{21}$ or $R_{28}$ may be combined with any one among $R_1$, $R_2$ and $R_{11}$ to form an aryl group or a heteroaryl group. If $R_1$ is represented by Formula 2, $R_{21}$ or $R_{28}$ may be combined with carbon bonded to $R_{11}$, or $R_{11}$ to form an aryl group, or a heteroaryl group. If $R_2$ is represented by Formula 2, $R_{21}$ or $R_{28}$ may be combined with carbon bonded to $R_{11}$, or $R_{11}$ to form an aryl group, or a heteroaryl group. If $R_{11}$ is represented by Formula 2, $R_{21}$ or $R_{28}$ may be combined with carbon bonded to $R_1$, or $R_1$ to form an aryl group, or a heteroaryl group. If $R_1$ is represented by Formula 2, $R_{21}$ or $R_{28}$ may be combined with carbon bonded to $R_2$, or $R_2$ to form an aryl group or a heteroaryl group.

If any one among $R_1$, $R_2$, and $R_{11}$ is represented by Formula 3, $R_{51}$ may be combined with any one among $R_1$, $R_2$ and $R_{11}$ to form an aryl group, or a heteroaryl group. If $R_1$ is represented by Formula 3, $R_{51}$ may be combined with carbon bonded to $R_{11}$, or $R_{11}$ to form an aryl group, or a heteroaryl group. If $R_2$ is represented by Formula 3, $R_{51}$ may be combined with carbon bonded to $R_{11}$, or $R_{11}$ to form an aryl group, or a heteroaryl group. If $R_1$ is represented by Formula 3, $R_{51}$ may be combined with carbon bonded to $R_1$, or $R_1$ to form an aryl group, or a heteroaryl group. If $R_{11}$ is represented by Formula 3, $R_{51}$ may be combined with carbon bonded to $R_2$, or $R_2$ to form an aryl group or a heteroaryl group.

The polycyclic compound of an embodiment may be symmetric with a nitrogen atom forming the fused ring of five rings as a center. The polycyclic compound of an embodiment may have the same left and right with a nitrogen atom positioned at para to $Y_1$ and $Y_2$ as a center. For example, $Y_1$ and $Y_2$ may be the same. For example, $R_1$, and $R_2$ may be the same. For example, $R_4$ and $R_9$ may be the same. For example, $R_5$ and $R_7$ may be the same. However, these are illustrations, and an embodiment of the inventive concept is not limited thereto.

Formula 1 may be represented by any one among Formula 1-A1 to Formula 1-A6 below.

[Formula 1-A1]

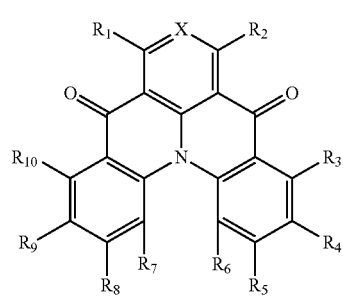

25

-continued

[Formula 1-A2]

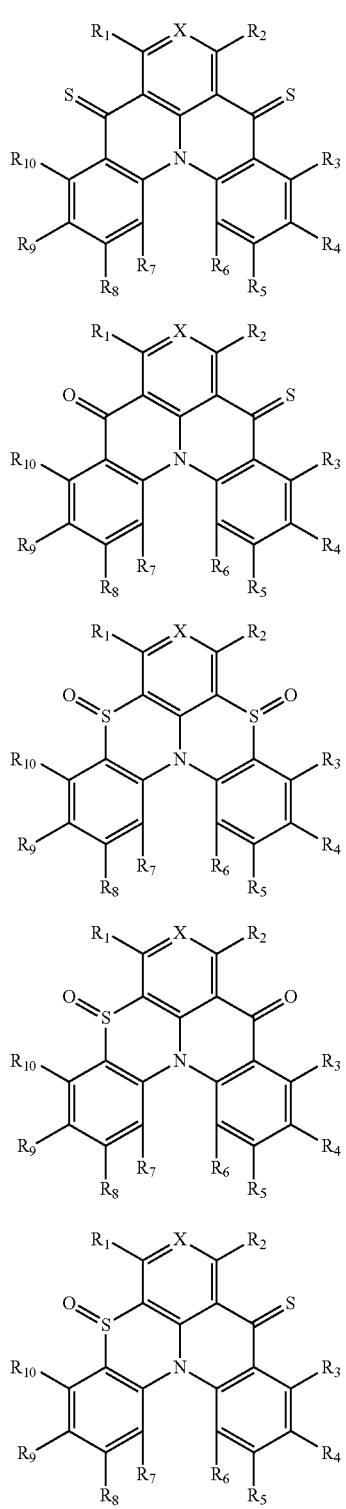

[Formula 1-A3]

[Formula 1-A4]

[Formula 1-A5]

[Formula 1-A6]

Formula 1-A1 corresponds to Formula 1 where both $Y_1$ and $Y_2$ are —C=O. Formula 1-A2 corresponds to Formula 1 where both $Y_1$ and $Y_2$ are —C=S. Formula 1-A3 corresponds to Formula 1 where $Y_1$ is —C=O, and $Y_2$ is —C=S. Formula 1-A4 corresponds to Formula 1 where both $Y_1$ and $Y_2$ are —S=O. Formula 1-A5 corresponds to Formula 1 where $Y_1$ is —S=O, and $Y_2$ is —C=O. Formula 1-A6 corresponds to Formula 1 where $Y_1$ is —S=O, and $Y_2$

26 is —C=S. In Formula 1-A1 to Formula 1-A6, the same definition of $R_1$ to $R_{11}$, and X in reference to Formula 1 may be applied.

According to an embodiment, Formula 1 may be represented by Formula 1-B1 or Formula 1-B2 below.

[Formula 1-B1]

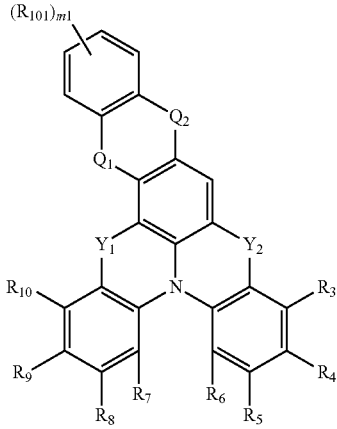

[Formula 1-B2]

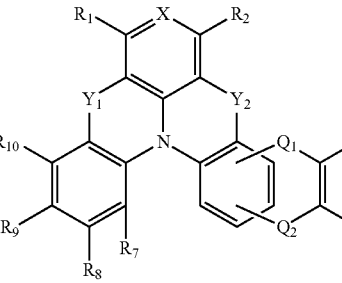

Formula 1-B1 represents Formula 1 where $R_1$ is represented by Formula 3, or where X is $CR_{11}$ and $R_{11}$ is represented by Formula 3. Formula 1-B1 may represent Formula 1 where $R_1$ is represented by Formula 2, or where X is $CR_{11}$ and $R_{11}$ is represented by Formula 2. Formula 1-B2 represents Formula 1 where any one among $R_3$ to $R_6$ is represented by Formula 3. Formula 1-B2 may represent Formula 1 where any one among $R_3$ to $R_6$ is represented by Formula 2.

In Formula 1-B1 and Formula 1-B2, $Q_1$ and $Q_2$ may each independently be a direct linkage, —C($R_{102}$), —C=O, —B($R_{103}$), —N($R_{104}$), O, S, P, —P=O, or —Si($R_{105}$)($R_{106}$). At least one among $Q_1$ and $Q_2$ may be —B($R_{103}$) or —N($R_{104}$). For example, at least one among $Q_1$ and $Q_2$ may be a boryl group substituted with a phenyl group, and the phenyl group may be substituted or unsubstituted. At least one among $Q_1$ and $Q_2$ may be an amine group substituted with a phenyl group, and the phenyl group may be substituted or unsubstituted. However, these are only illustrations, and an embodiment of the inventive concept is not limited thereto.

In Formula 1-B1 and Formula 1-B2, m may be an integer from 1 to 4. If m is an integer of 2 or more, each $R_{101}$ group may be the same or different.

In Formula 1-B1 and Formula 1-B2, $R_{101}$ to $R_{106}$ may each independently be a hydrogen atom, a deuterium atom, a halogen atom, a cyano group, a nitro group, a substituted or unsubstituted carbonyl group, a substituted or unsubstituted silyl group, a substituted or unsubstituted boryl group, a substituted or unsubstituted oxy group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. In Formula 1-B1 and Formula 1-B2, groups $R_1$ to $R_{10}$, X, $Y_1$, and $Y_2$ may be the same as defined in Formula 1.

In Formula 1-B2, any one among $R_1$, $R_2$, $R_7$ to $R_{10}$, and $R_{101}$ may be a deuterium atom. For example, all of $R_1$, $R_2$, $R_7$ to $R_{10}$, and $R_{101}$ may be deuterium. In Formula 1-B2, m may be an integer of 2 or more, and each $R_{101}$ group may be deuterium. However, these are only illustrations, and an embodiment of the inventive concept is not limited thereto.

According to an embodiment, Formula 1-B2 may be represented by any one among Formula 1-B2-1 to Formula 1-B2-3 below.

[Formula 1-B2-1]

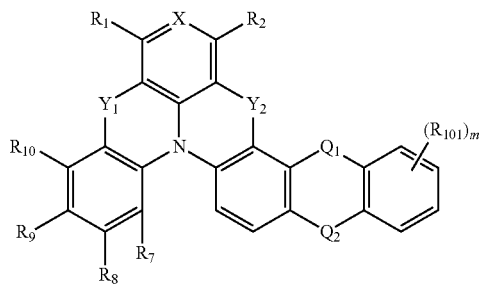

[Formula 1-B2-2]

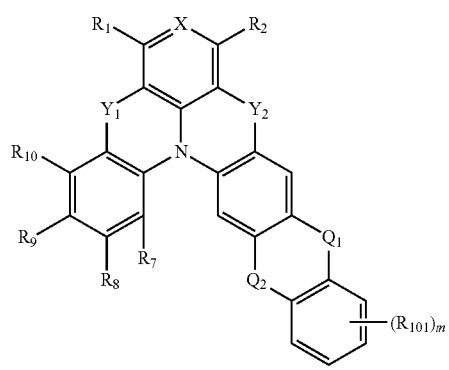

[Formula 1-B2-3]

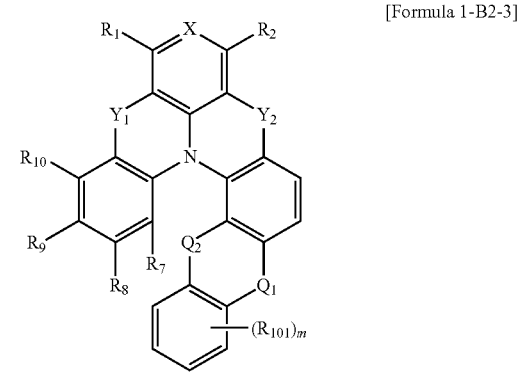

Formula 1-B2-1 to Formula 1-B2-3 represent Formula 1-B2 having different bonding positions of a ring group including $Q_1$ and $Q_2$. Formula 1-B2-1 may represent Formula 1 where at least one among $R_3$ and $R_4$ is represented by Formula 2 or Formula 3. Formula 1-B2-2 may represent Formula 1-B2 where at least one among $R_4$ and $R_5$ is represented by Formula 2 or Formula 3. Formula 1-B2-3 may represent Formula 1-B2 where at least one among $R_5$ and $R_6$ is represented by Formula 2 or Formula 3. In Formula 1-B2-1 to Formula 1-B2-3, the same definition of $R_1$, $R_2$, $R_7$ to $R_{10}$, $R_{10}1$, m, $Q_1$, $Q_2$, X, $Y_1$, and $Y_2$ in reference to Formula 1-B2 above may be applied.

Formula 1 may be represented by Formula 1-C below.

[Formula 1-C]

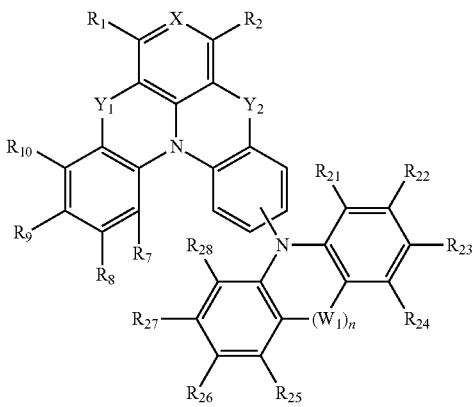

Formula 1-C represents Formula 1 where Formula 2 is combined with a ring group that includes $R_3$ to $R_6$. For example, Formula 1-C represents Formula 1 where any one among $R_3$ to $R_6$ is represented by Formula 2. In Formula 1-C, the same definition of $R_1$, $R_2$, $R_7$ to $R_{10}$, X, $Y_1$, $Y_2$, $R_{21}$ to $R_{28}$, n, and $W_1$ in reference to Formula 1 and Formula 2 may be applied.

In Formula 1-C, at least one among $R_1$, $R_2$, $R_7$ to $R_{10}$, and $R_{21}$ to $R_{28}$ may be a deuterium atom. For example, all of $R_1$, $R_2$, $R_7$ to $R_{10}$, and $R_{21}$ to $R_{28}$ may be deuterium. However, these are only illustrations, and an embodiment of the inventive concept is not limited thereto.

According to an embodiment, Formula 2 may be represented by Formula 2-1 or Formula 2-2 below.

[Formula 2-1]

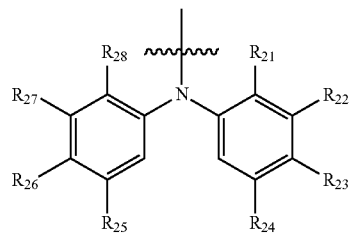

[Formula 2-2]

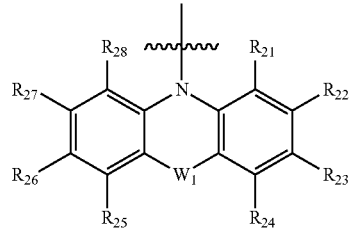

Formula 2-1 represents Formula 2 where "is 0. Formula 2-2 represents Formula 2 where n is 1. In Formula 2-1 and Formula 2-2, the same definition of $R_{21}$ to $R_{28}$, and $W_1$ in reference to Formula 2 may be applied.

The polycyclic compound of an embodiment includes a substituent in a five-ring group including a nitrogen atom as a ring-forming atom, and multi resonance of the polycyclic compound may be enlarged by the substituent. The polycyclic compound of an embodiment may include an electron donor group in the five-ring group, or may form a fused ring through the combination with a substituent connected to the five-ring group. Accordingly, the polycyclic compound of an embodiment may enlarge multi resonance, and improved emission efficiency may be shown.

The polycyclic compound of an embodiment may be any one among the compounds represented in Compound Group 1 below. The organic electroluminescence device ED of an embodiment may include at least one polycyclic compound among the polycyclic compounds represented in Compound Group 1 in an emission layer EML. Ph in the compounds in Compound Group 1 represents a phenyl group.

[Compound Group 1]

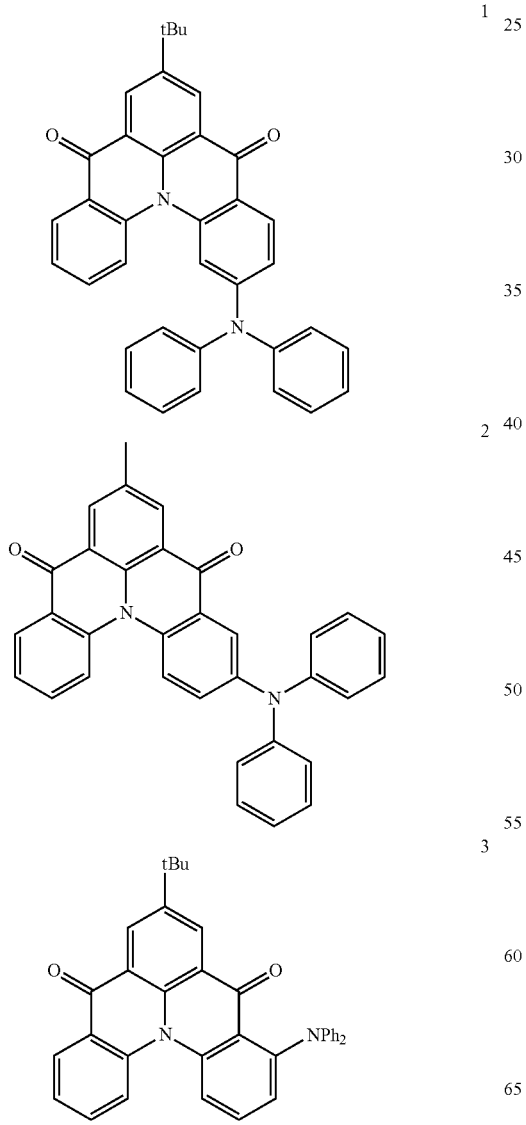
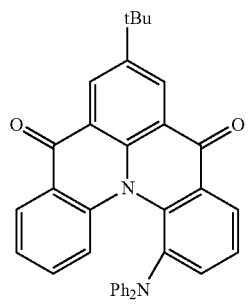
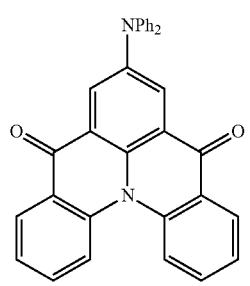
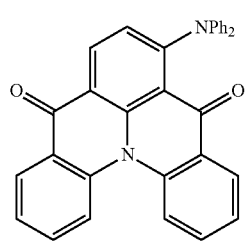
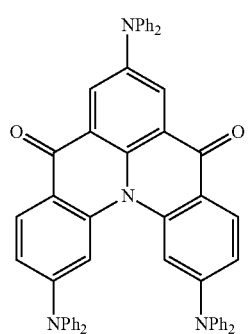
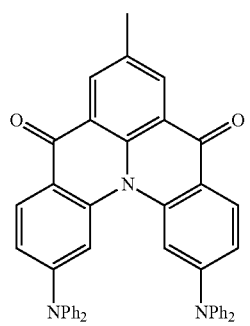

-continued
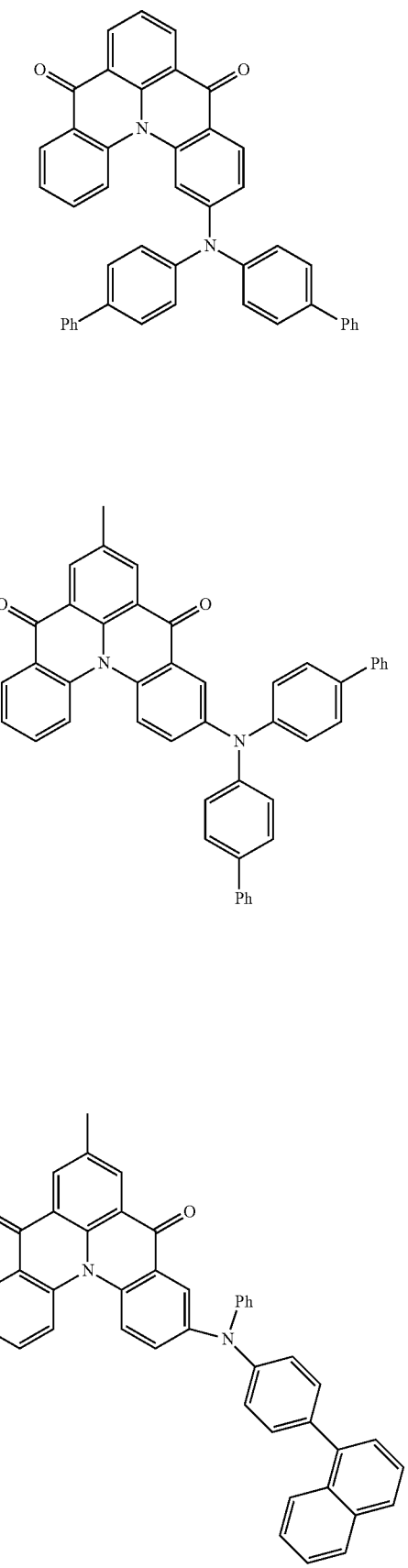
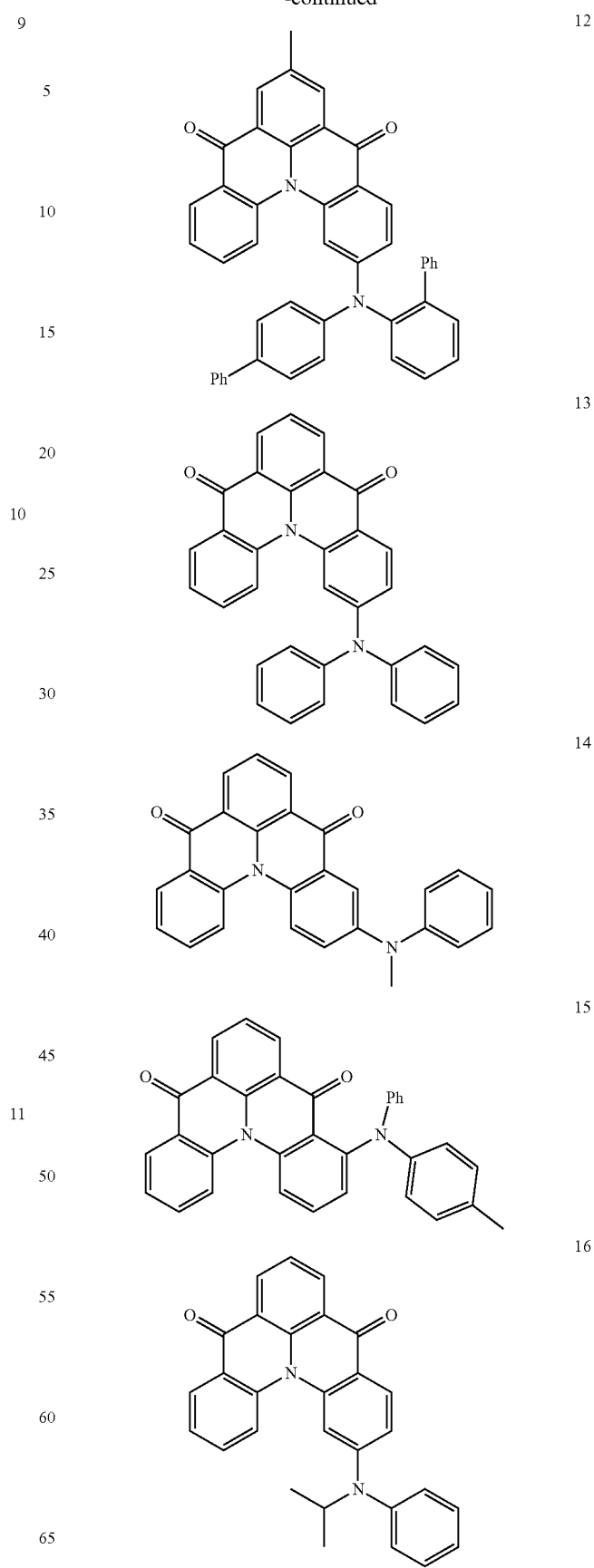

17
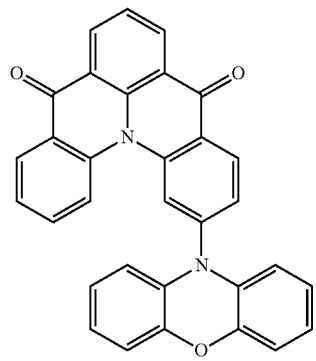
18
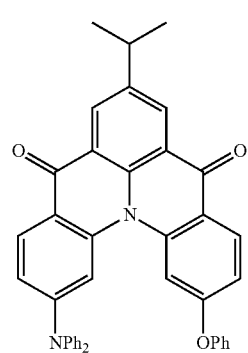
19
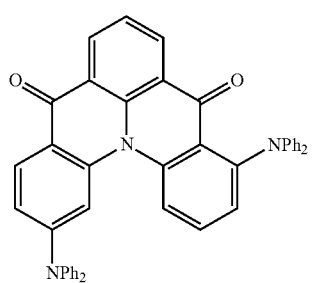
20
21
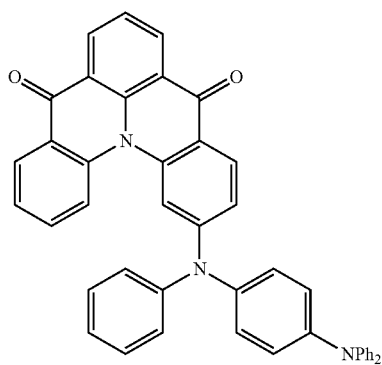
22
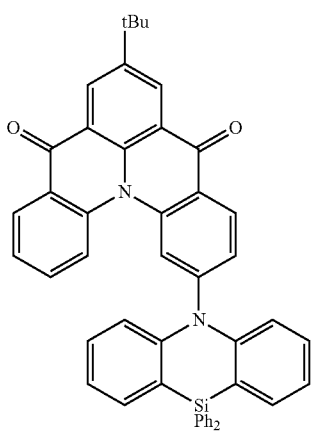
23
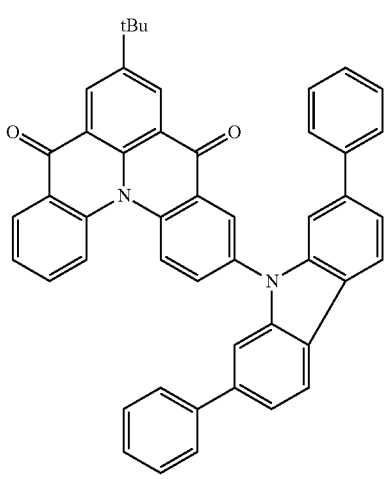

24
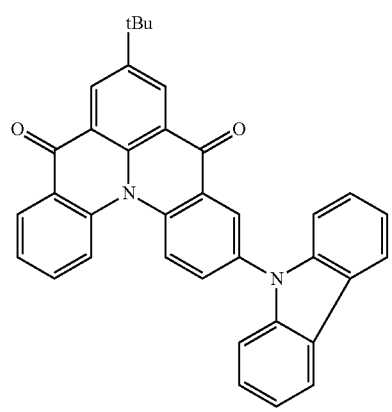
25
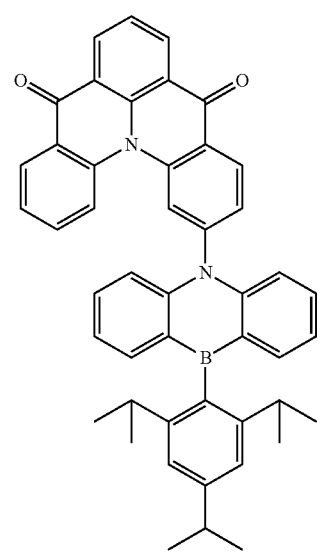
26
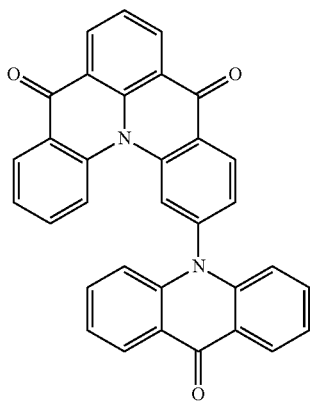
27
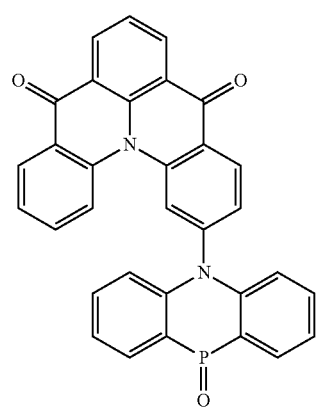
28
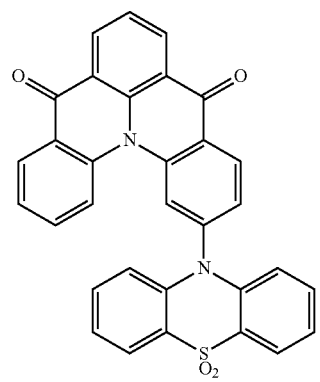
29
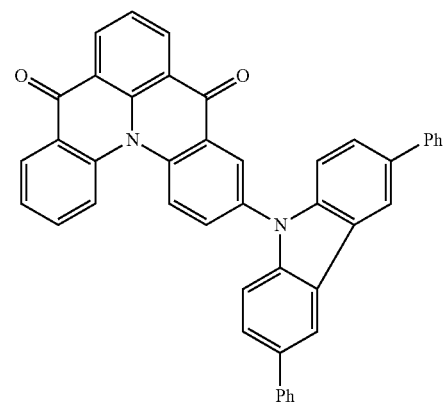
30
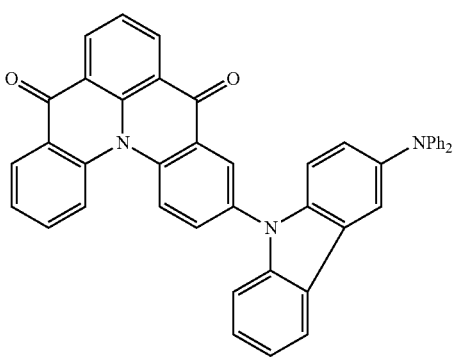

31
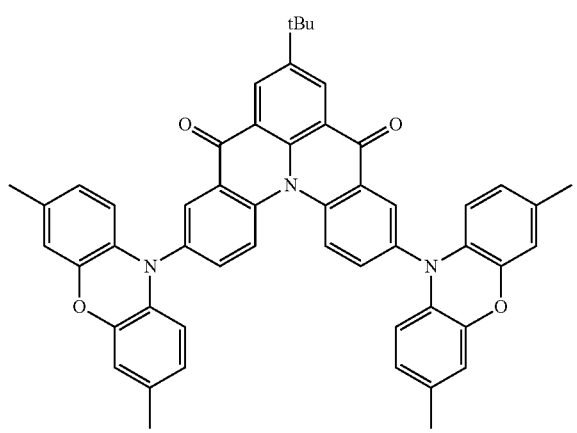
32
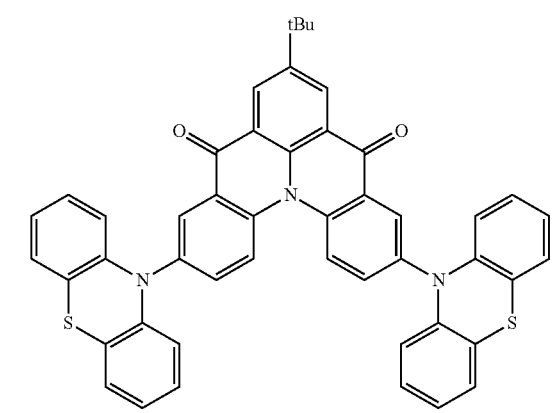
33
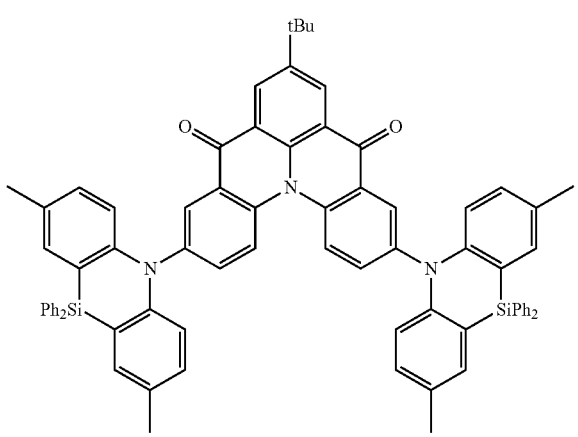
34
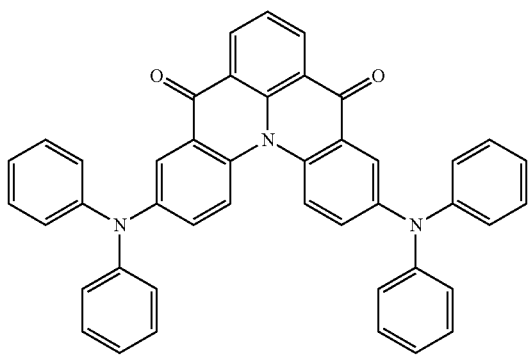
35
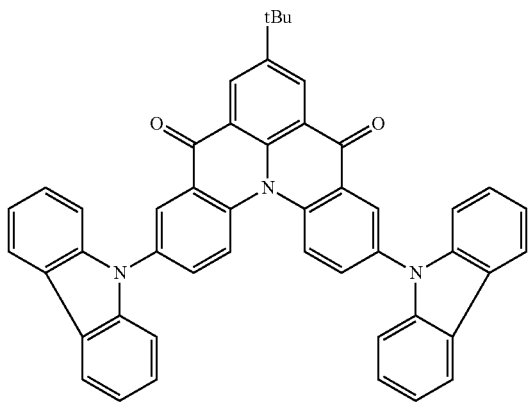
36
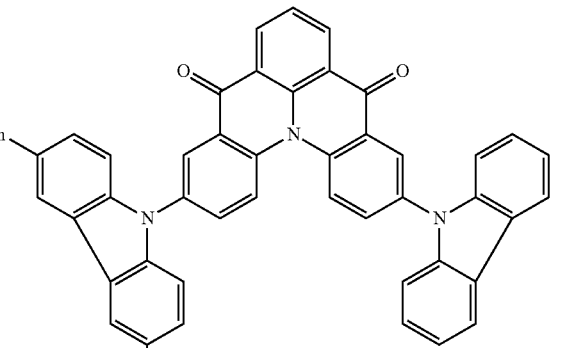
37
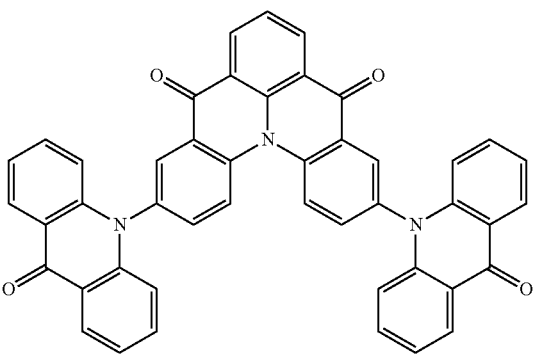

38
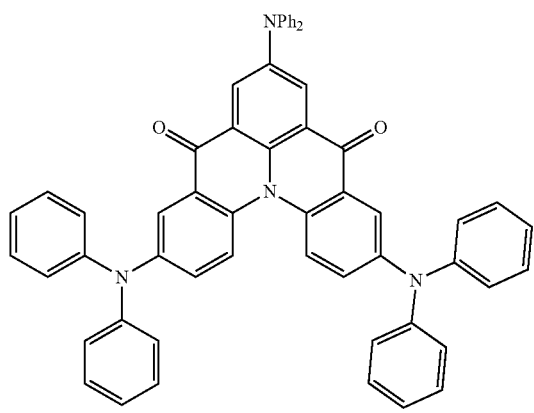
39
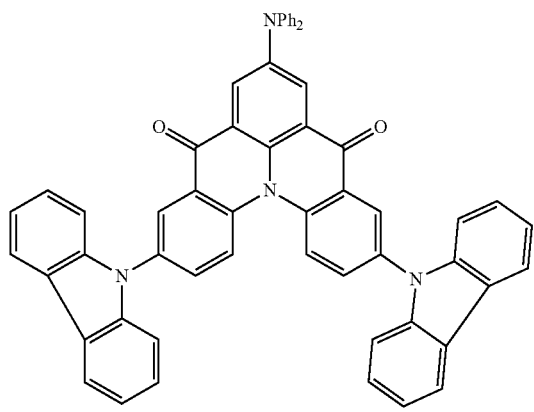
40
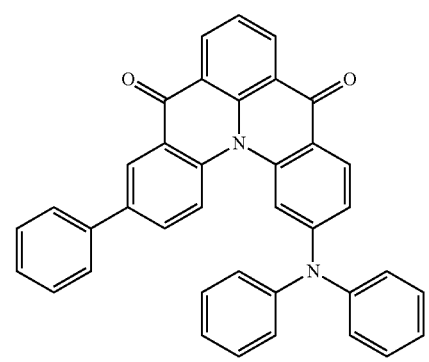
41
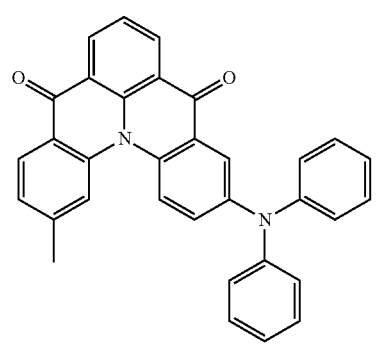
42
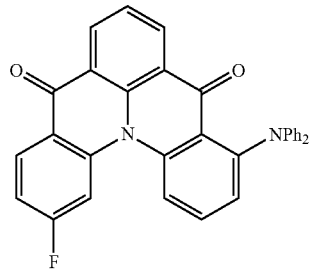
43
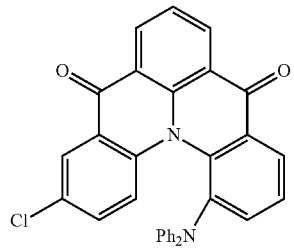
44
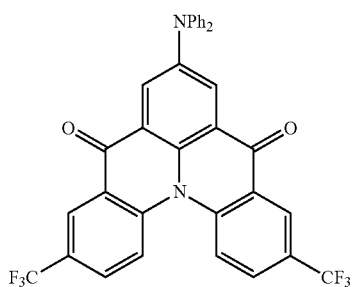
45
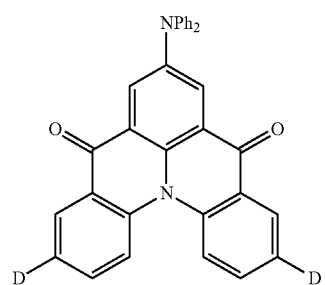
46
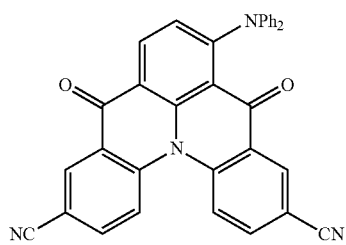

47
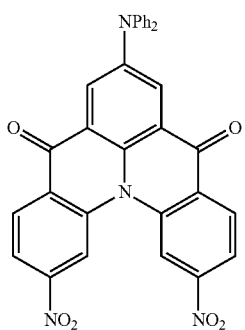
48
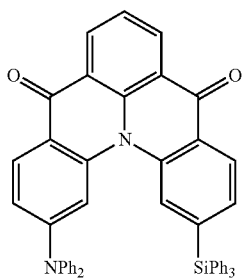
49
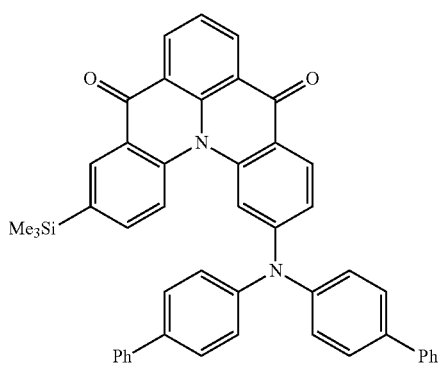
50
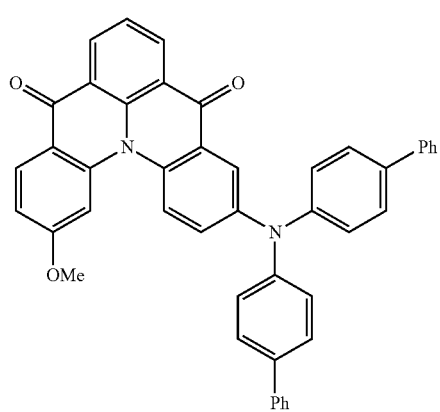
51
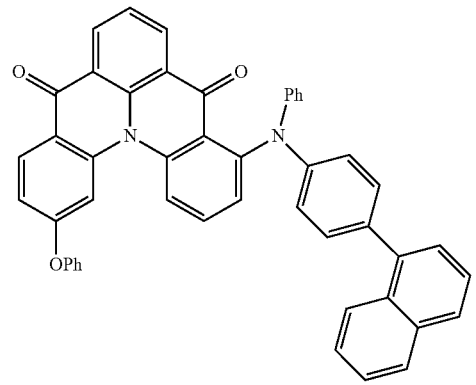
52
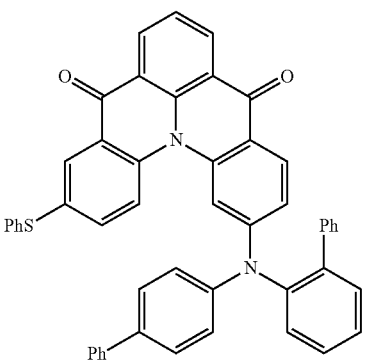
53
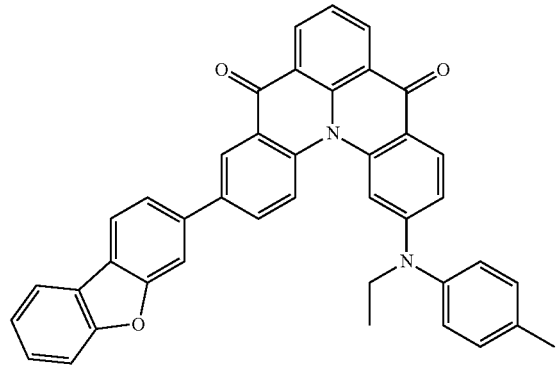
54
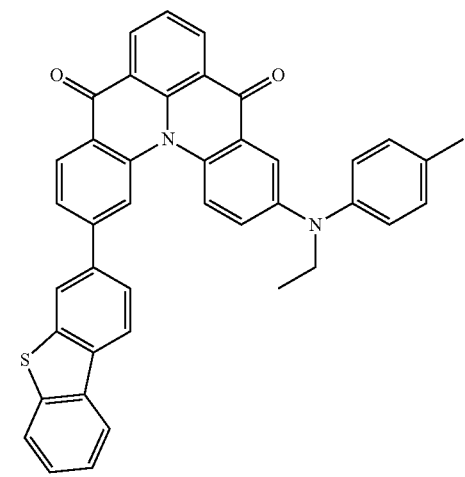

55
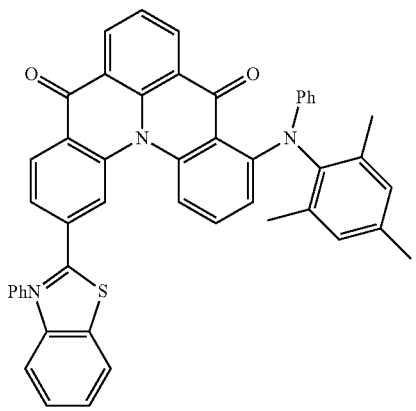
56
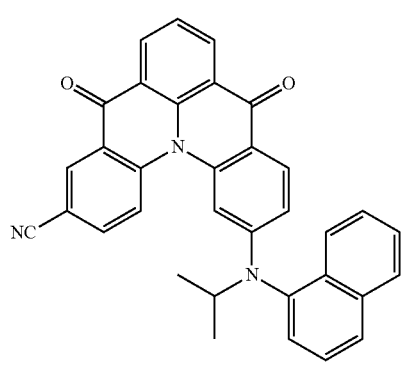
57
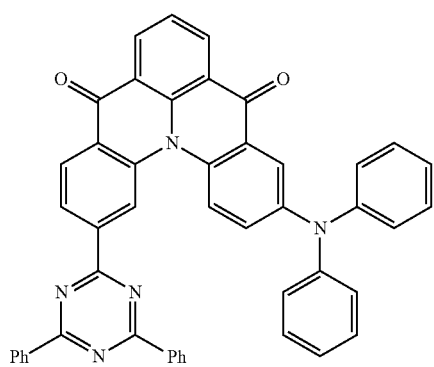
58
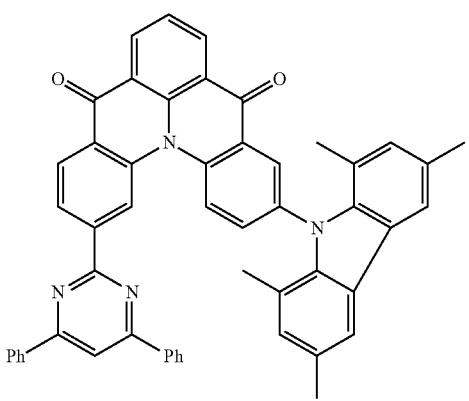
59
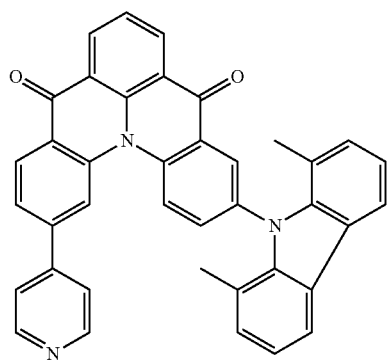
60
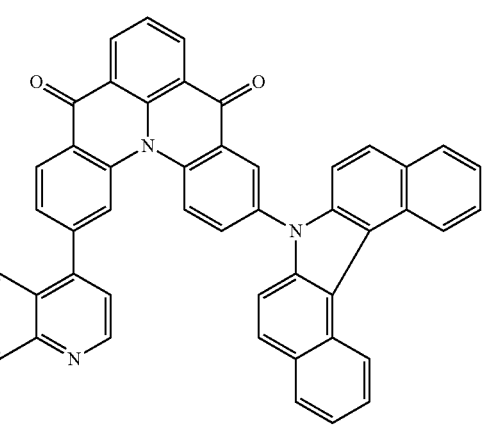
61
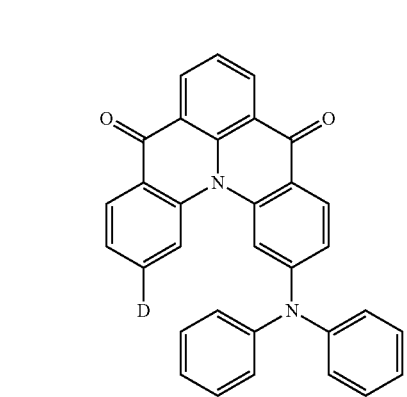
62
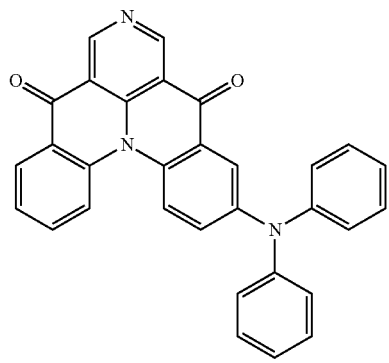

63
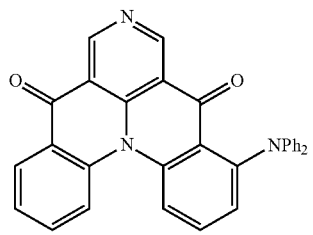
64
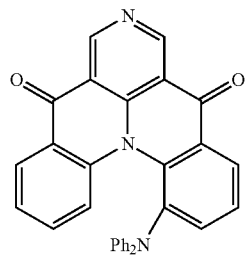
65
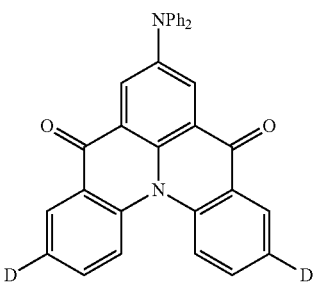
66
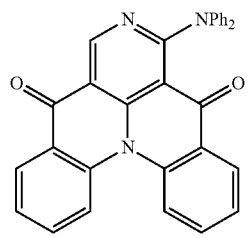
67
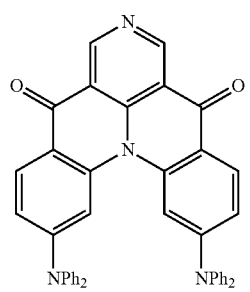
68
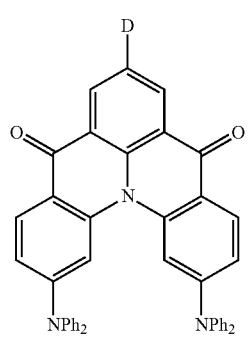
69
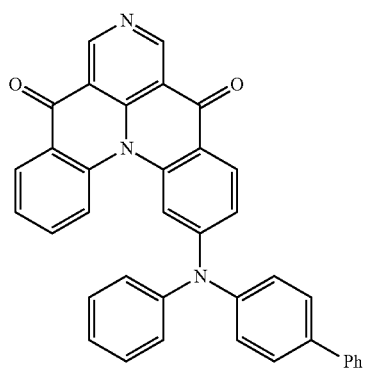
70
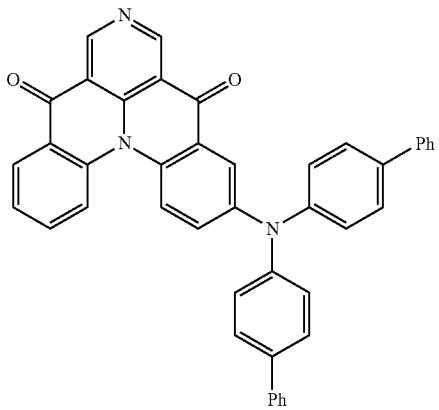
71
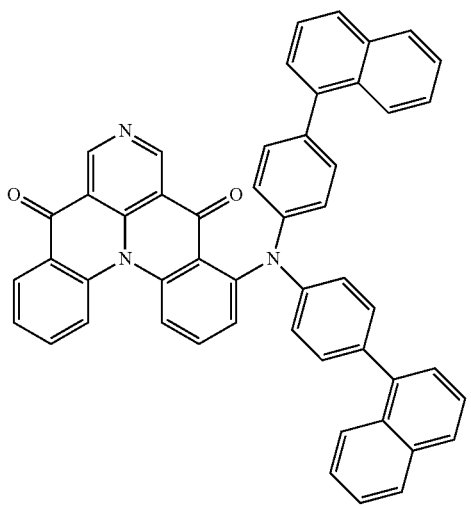
72
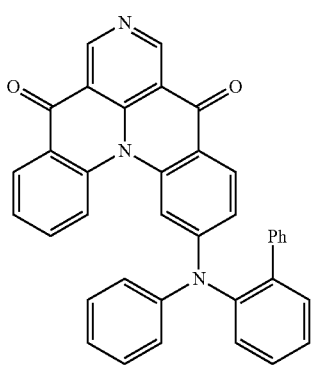

73 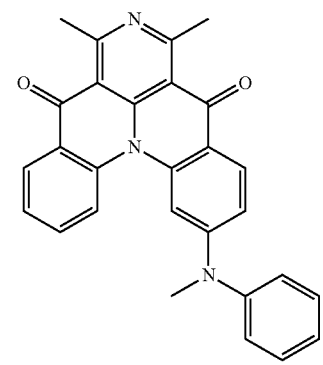
74 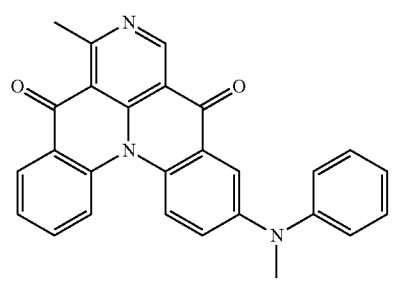
75 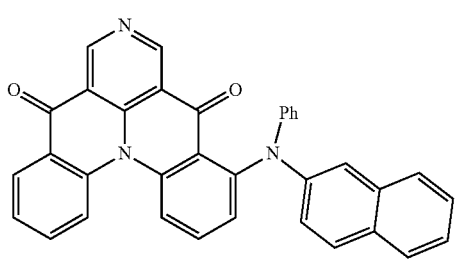
76 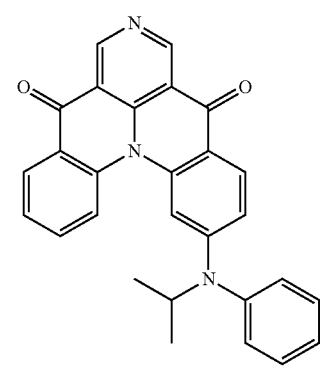
77 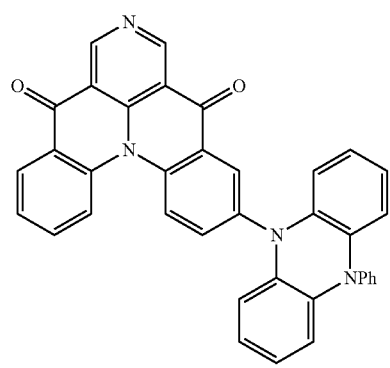
78 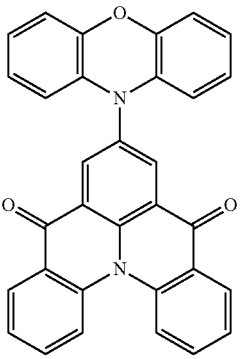
79 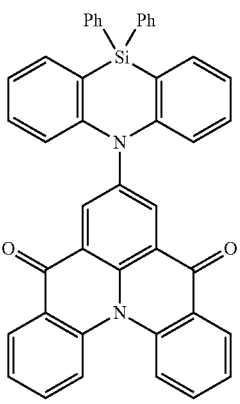
80 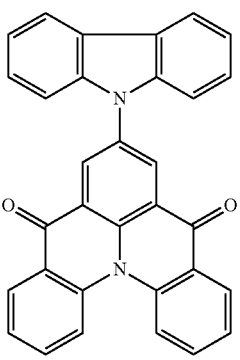
81 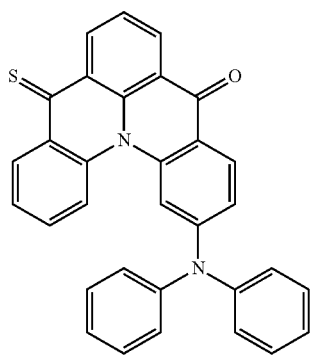

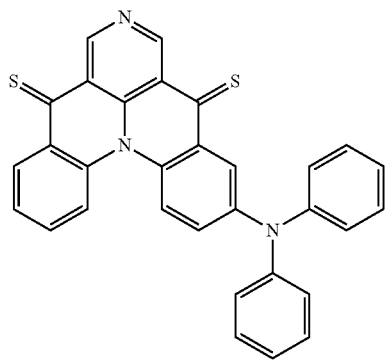 82
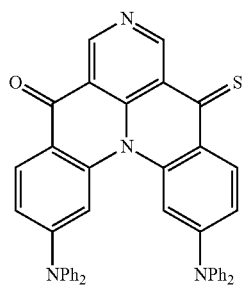 87
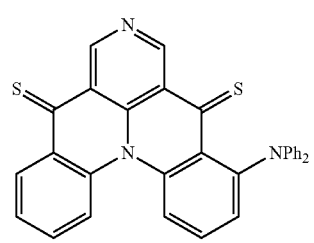 83
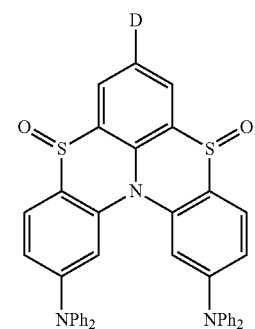 88
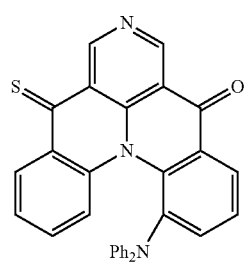 84
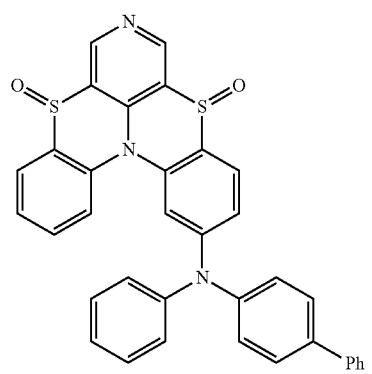 89
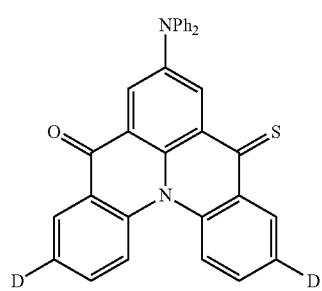 85
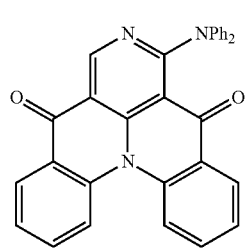 86
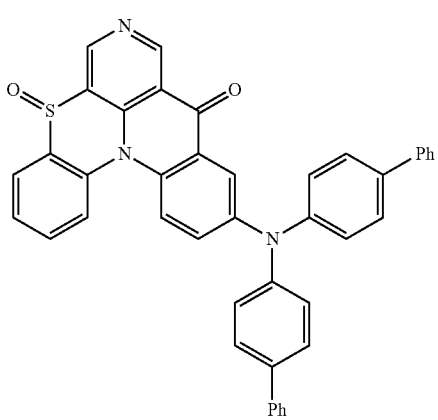 90

91
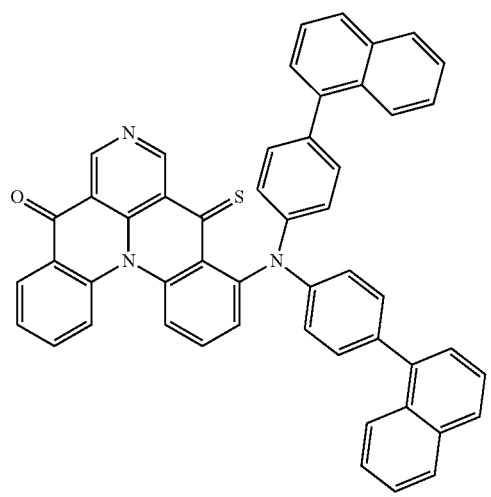
92
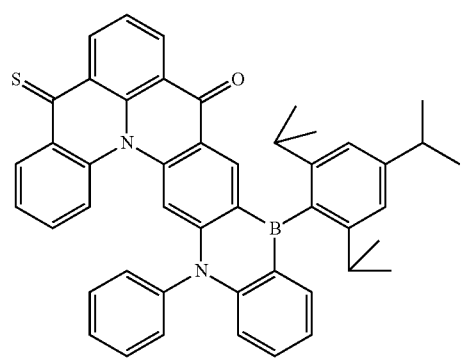
93
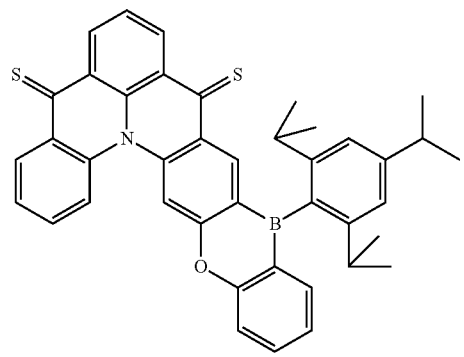
94
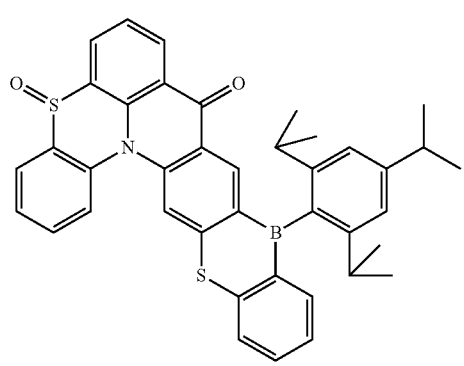
95
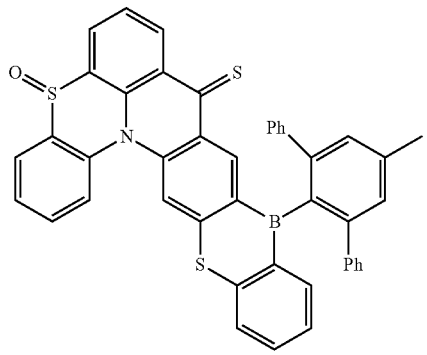
96
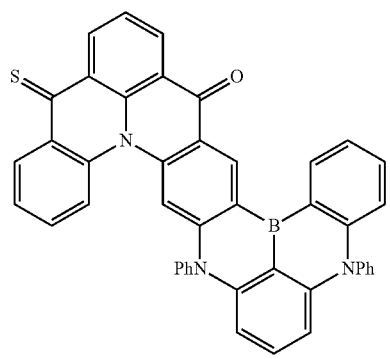
97
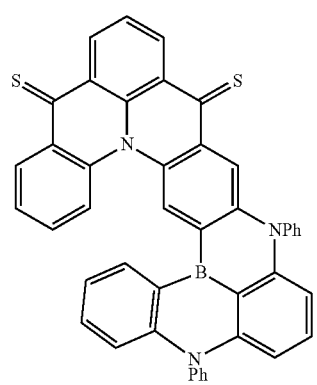
98
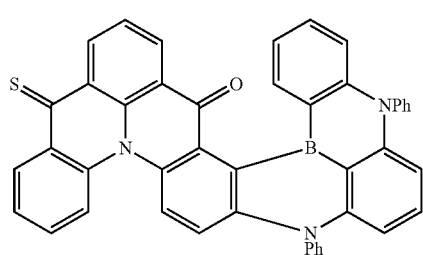

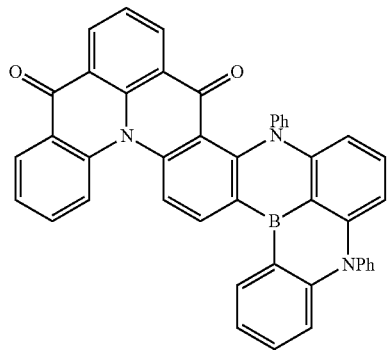
99
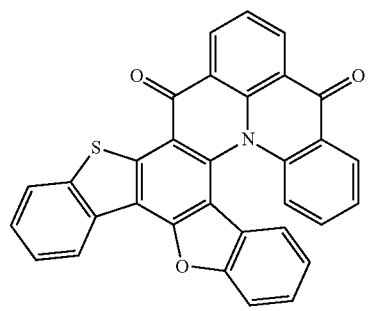
100
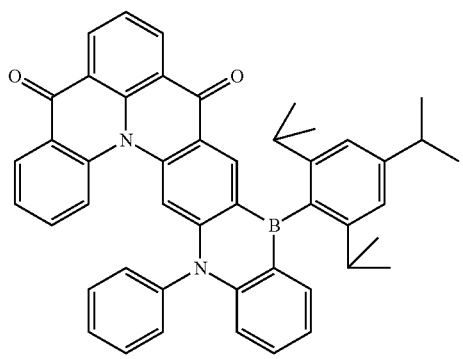
101
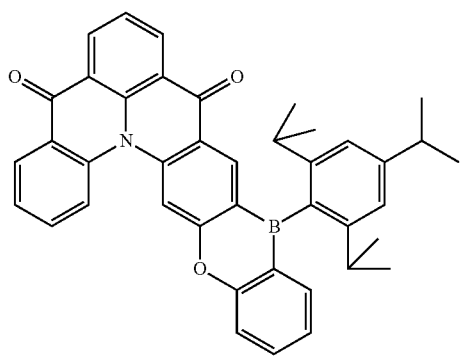
102
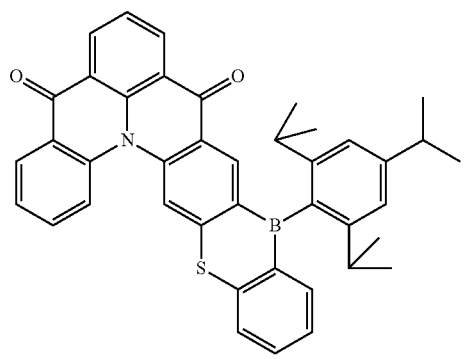
103
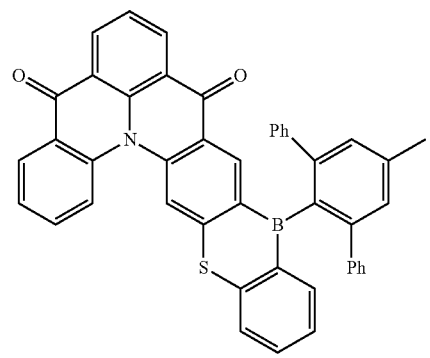
104
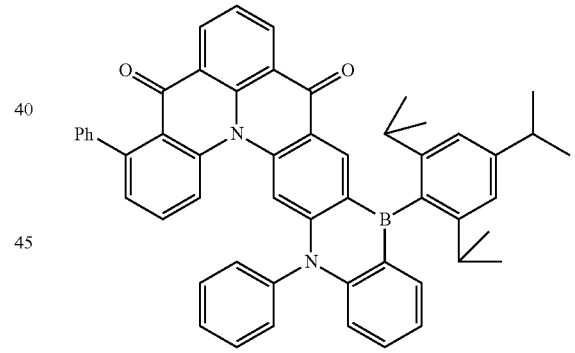
105
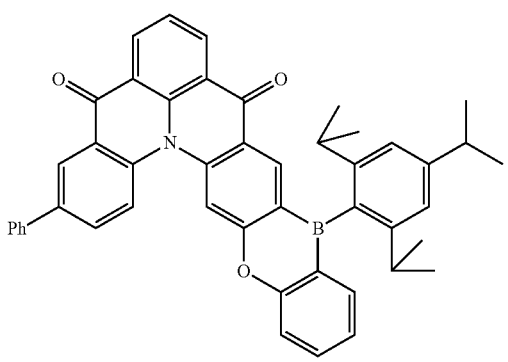
106

107
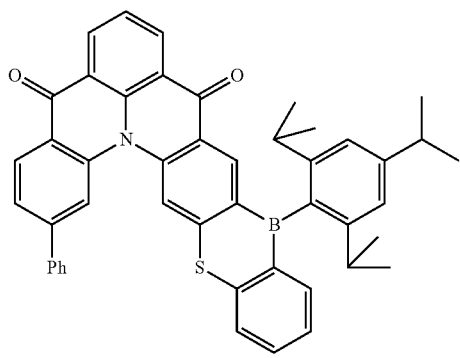
108
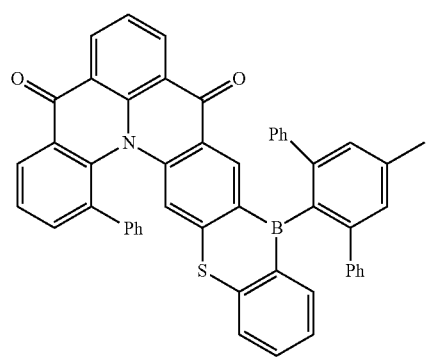
109
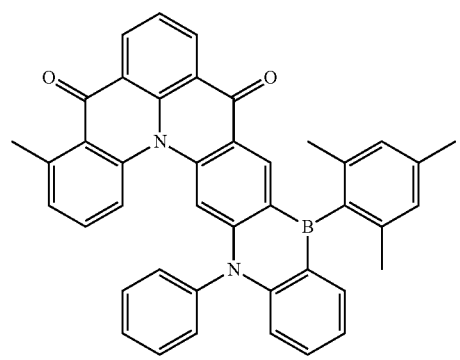
110
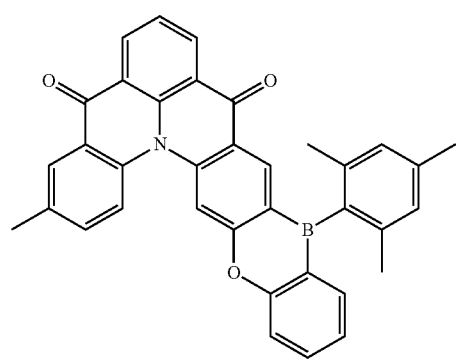
111
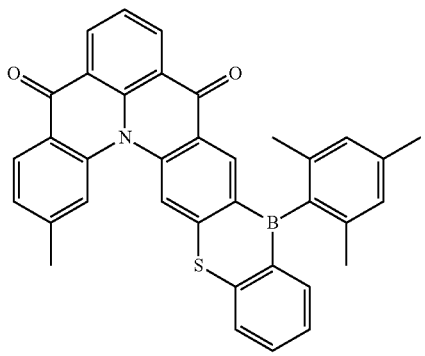
112
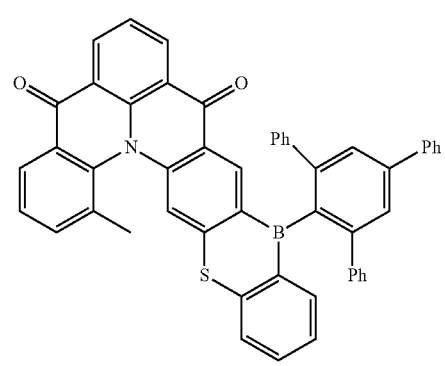
113
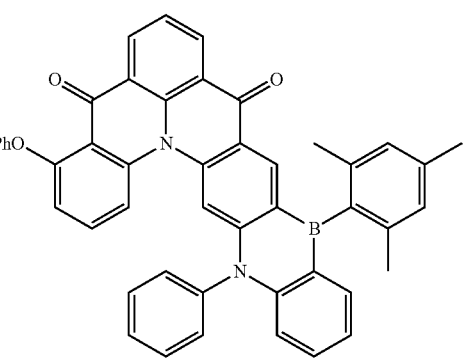
114
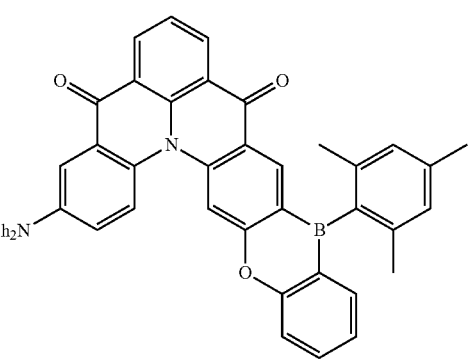

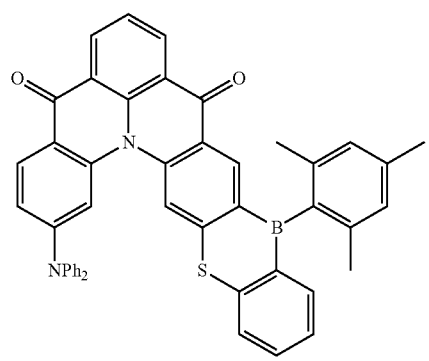
115
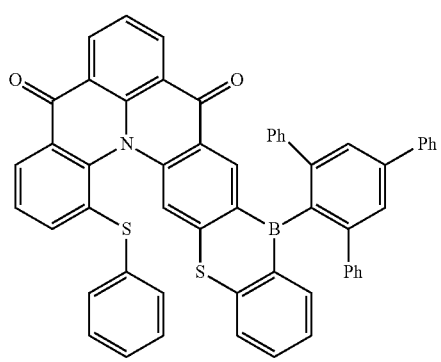
116
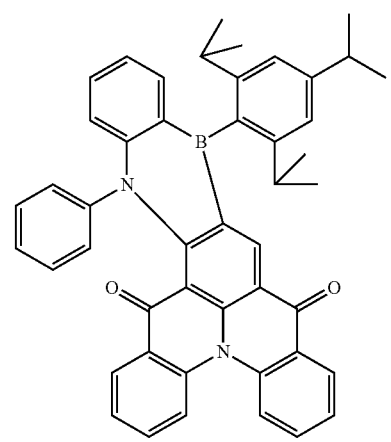
117
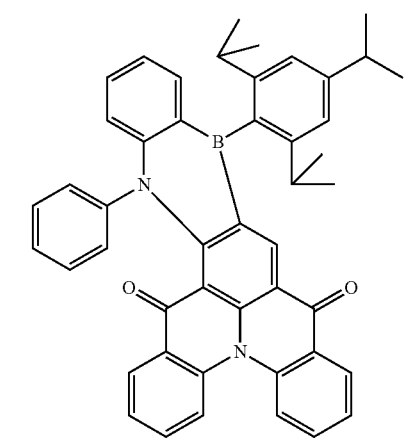
118
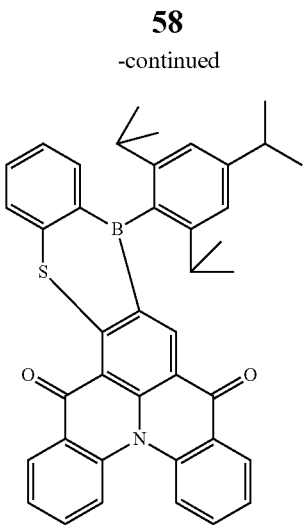
119
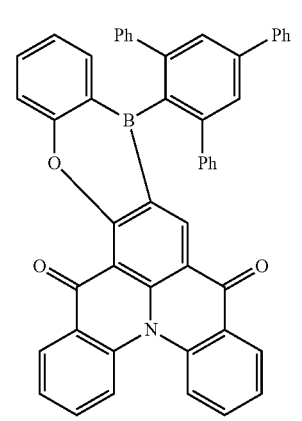
120
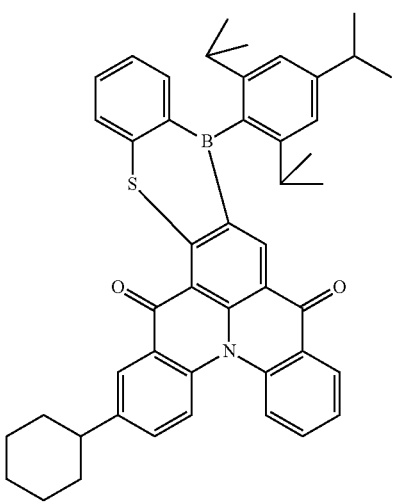
121

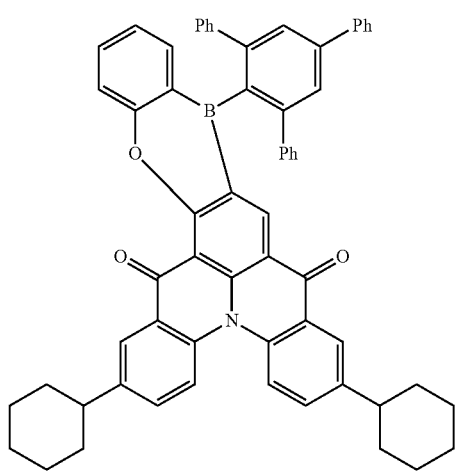
122
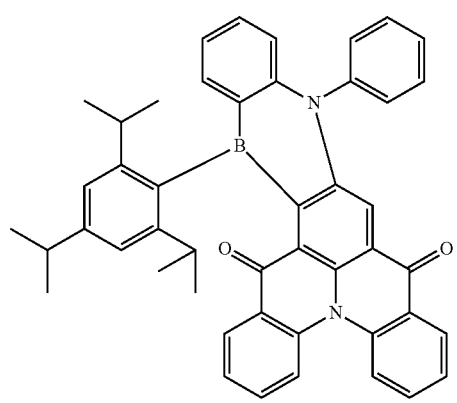
123
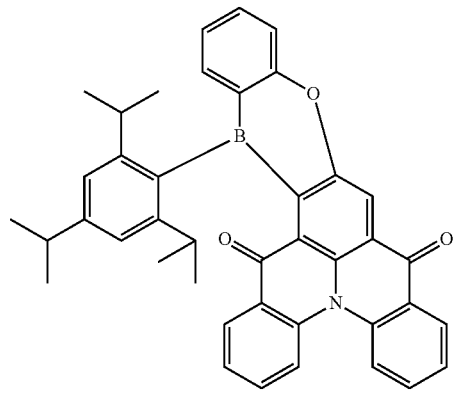
124
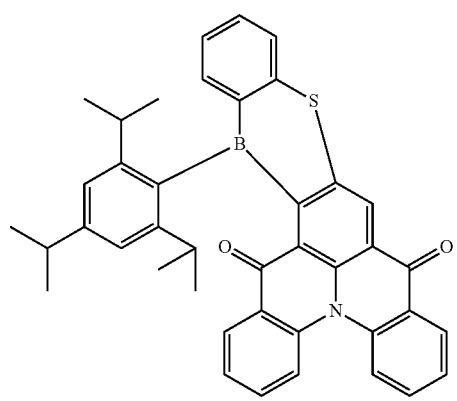
125
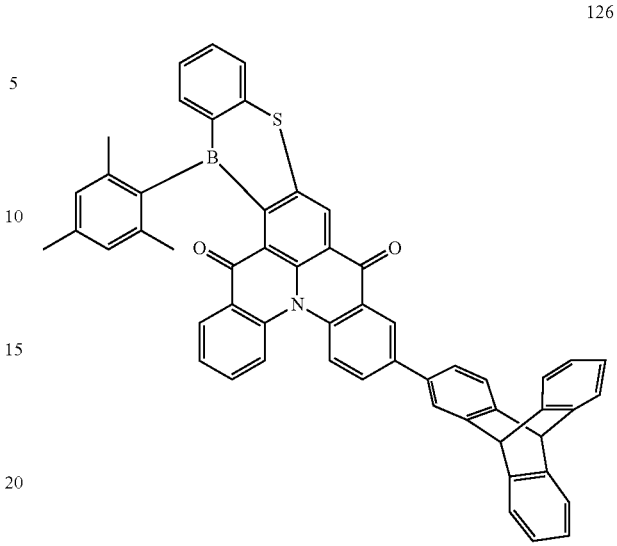
126
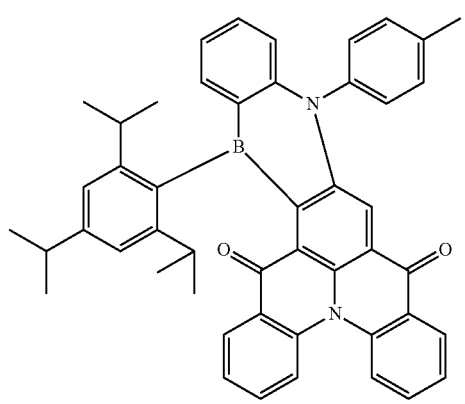
127
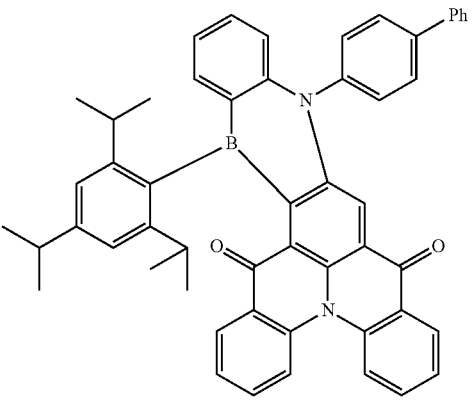
128

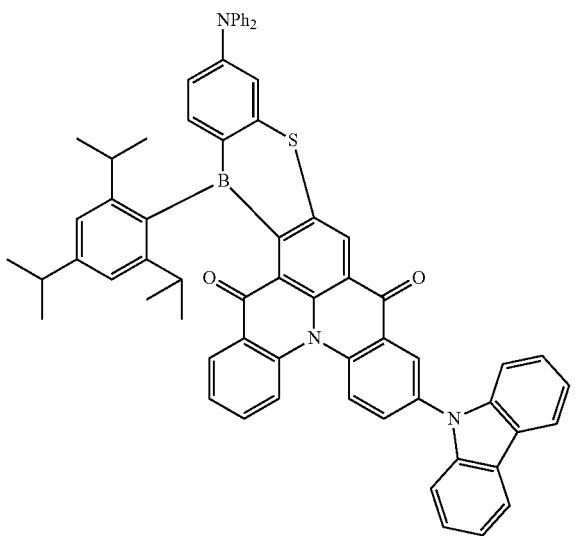
129
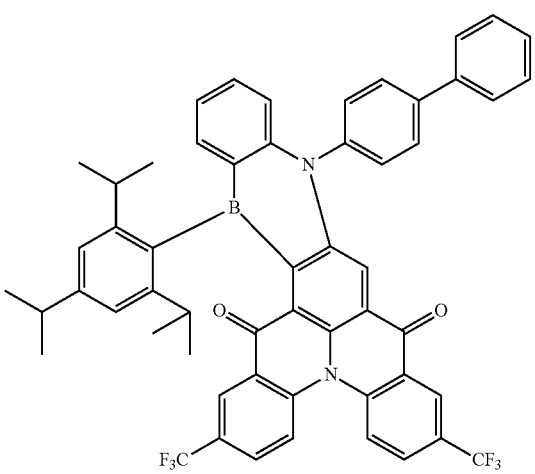
132
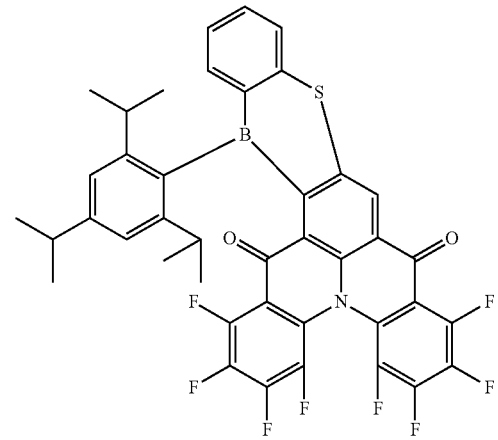
133
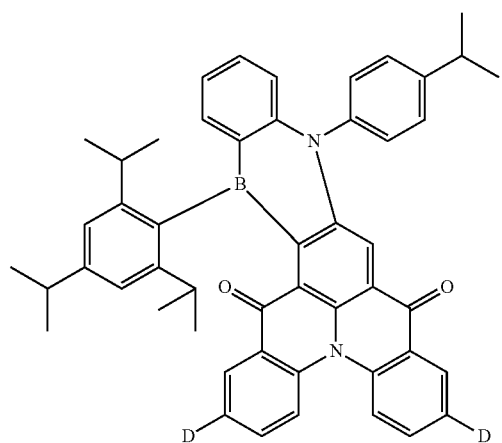
130
131
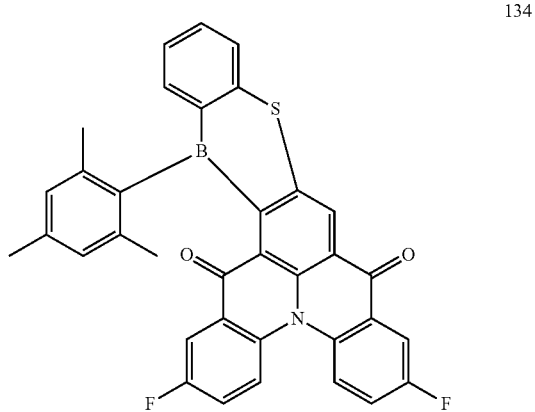
134

-continued
135
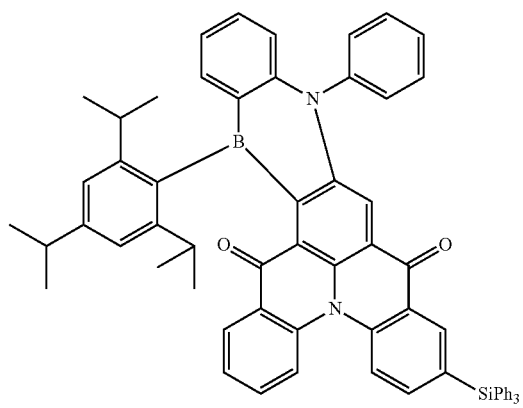
136
138
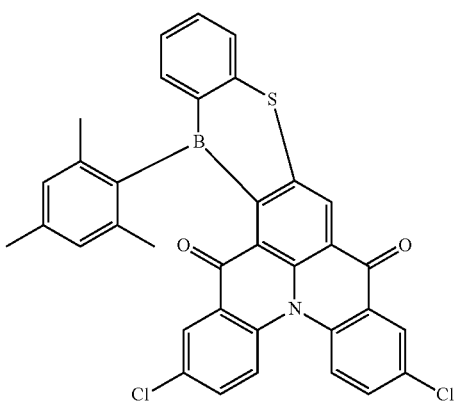
139
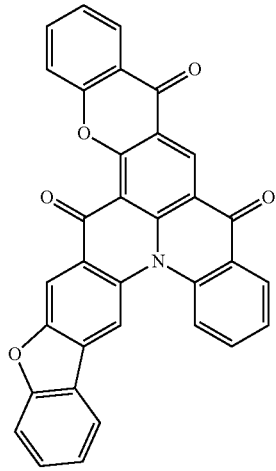
140
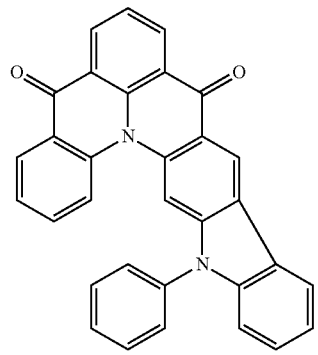
137
141
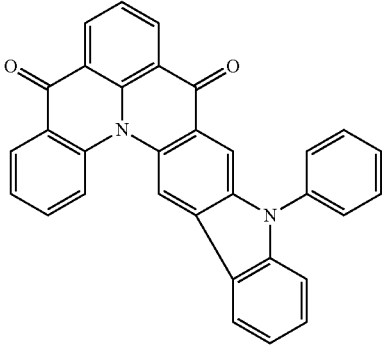

142
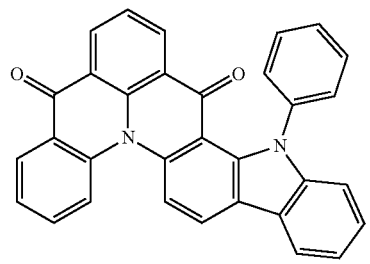
143
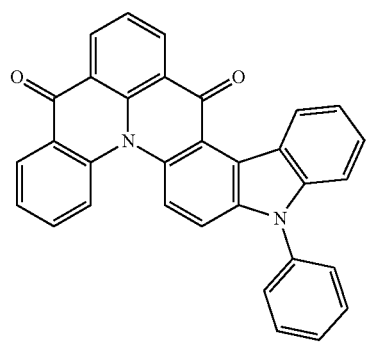
144
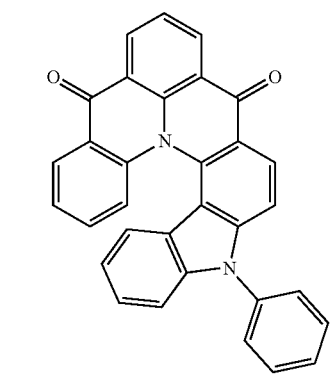
145
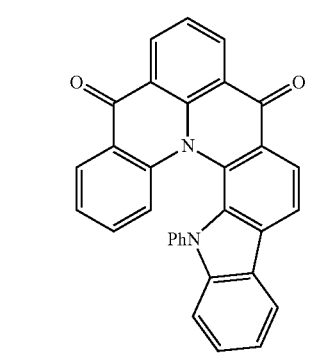
146
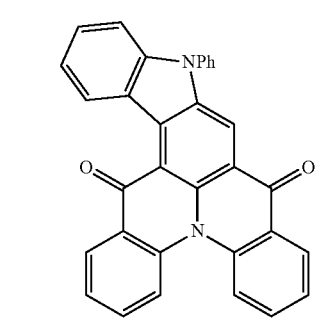
147
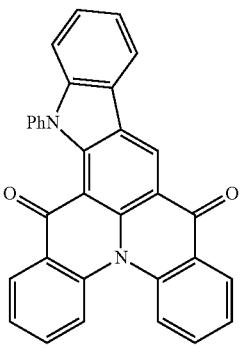
148
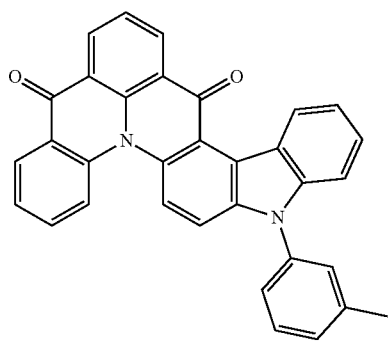
149
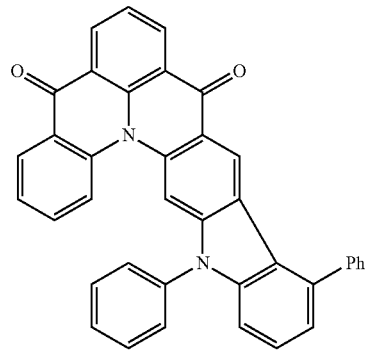
150
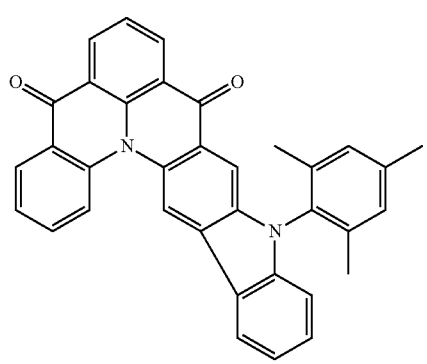

151
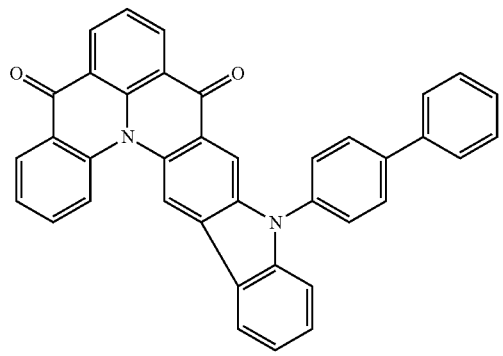
152
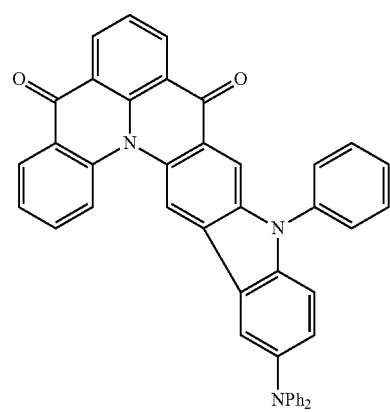
153
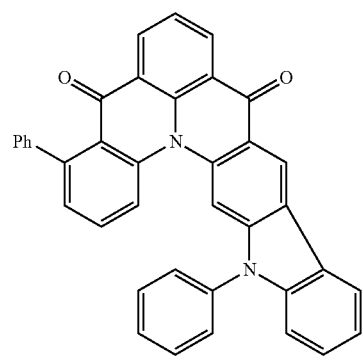
154
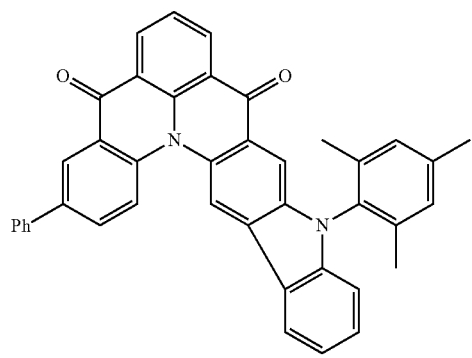
155
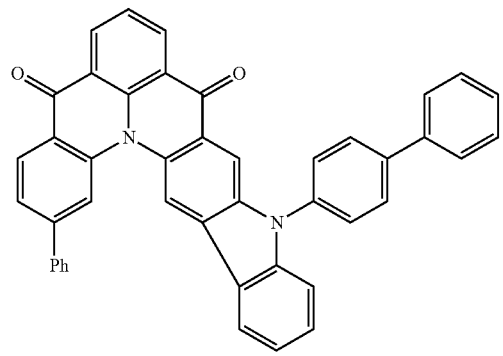
156
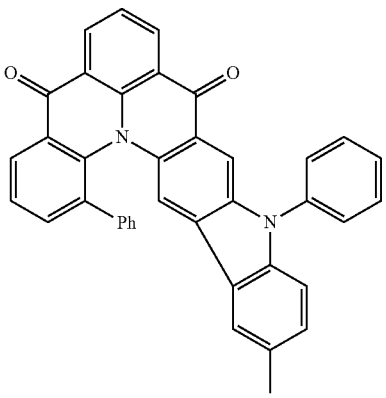
157
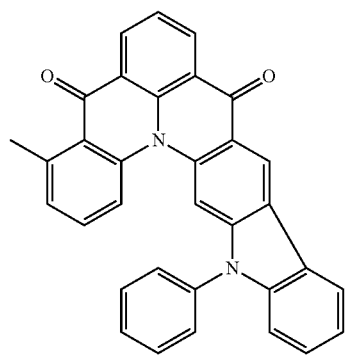
158
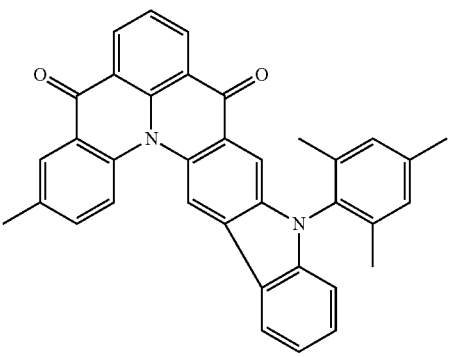

69 -continued
159
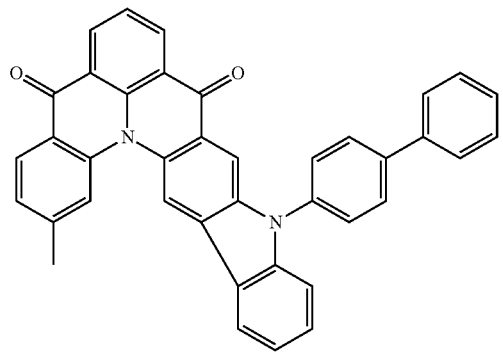
160
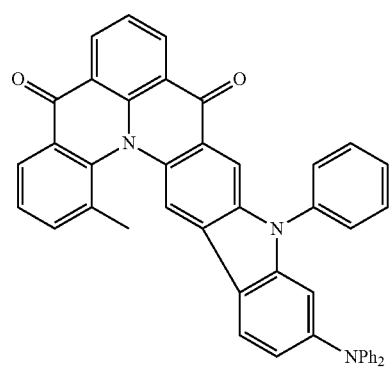
161
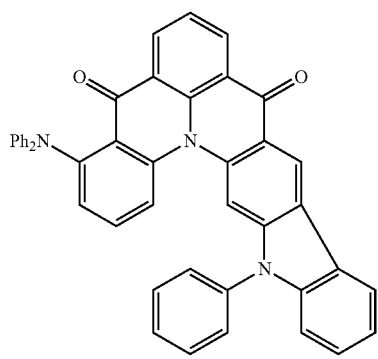
162
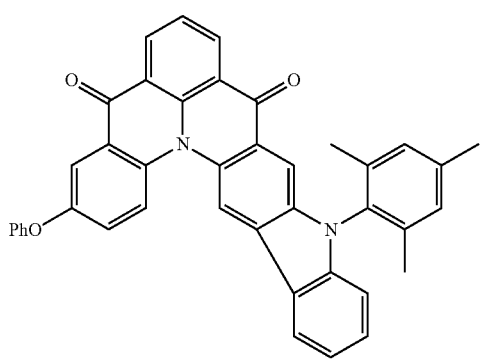
70 -continued
163
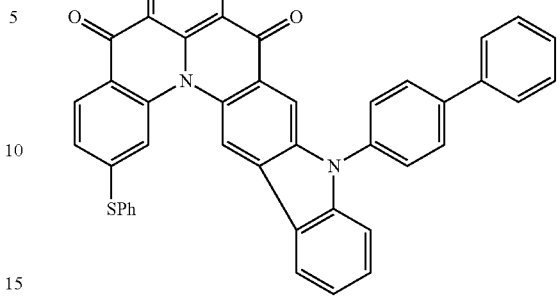
164
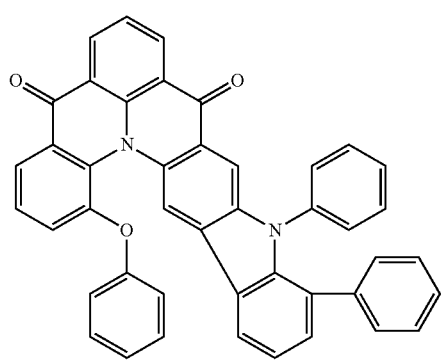
165
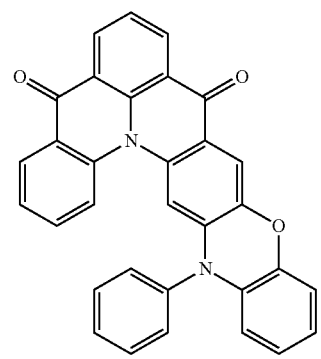
166
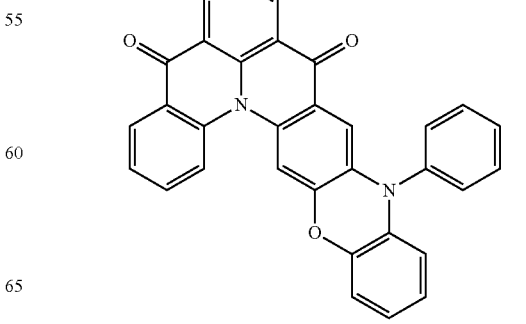

167 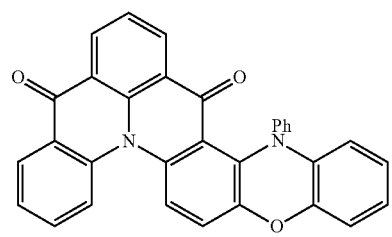
168 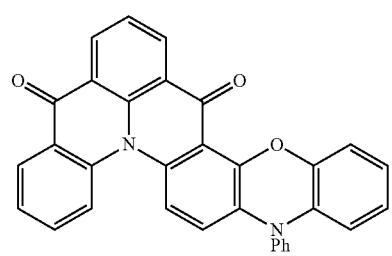
169 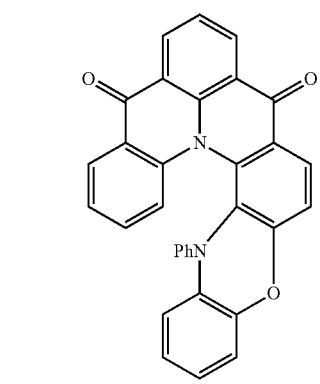
170 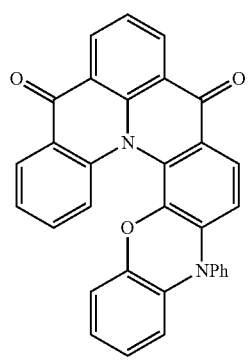
171 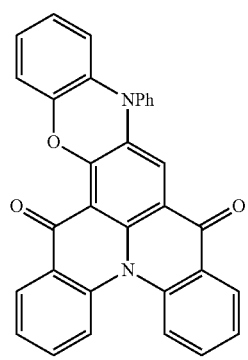
172 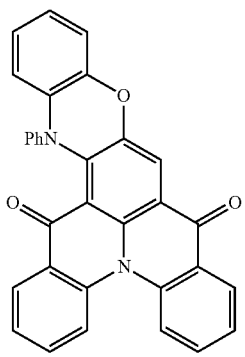
173 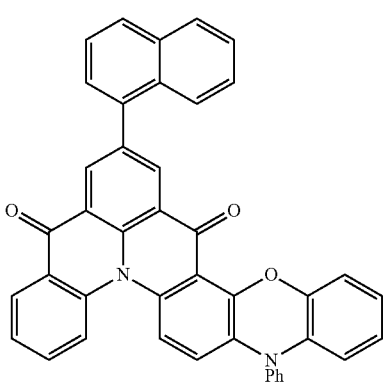
174 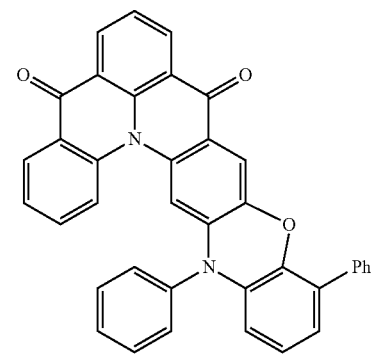
175 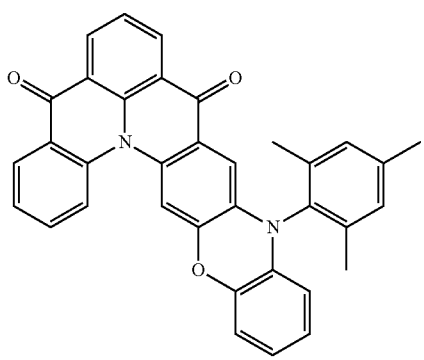

176
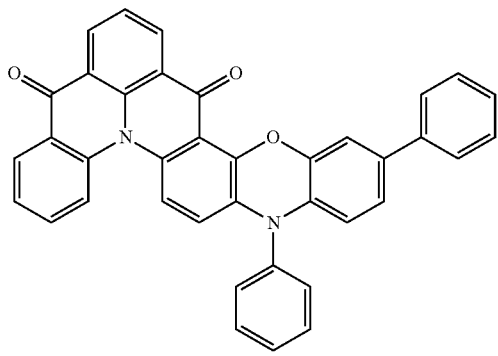
180
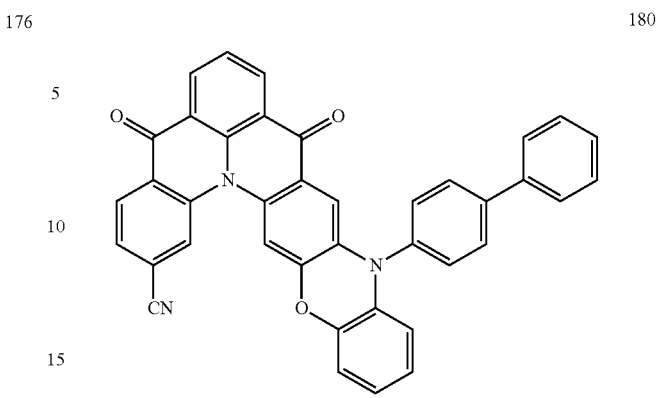
177
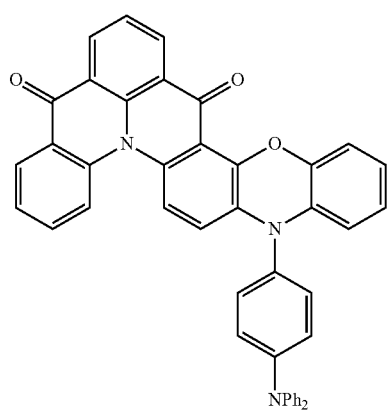
181
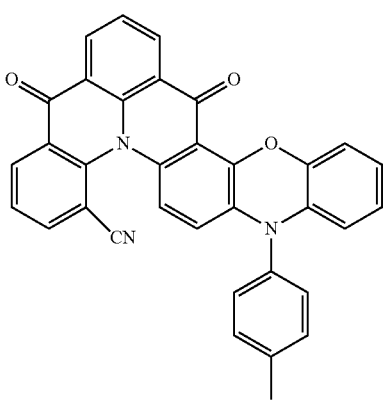
178
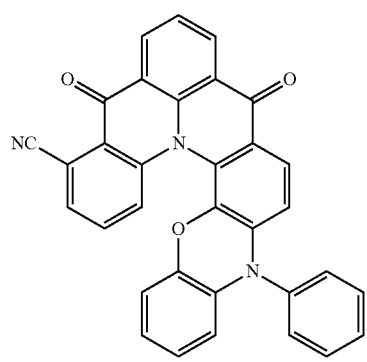
182
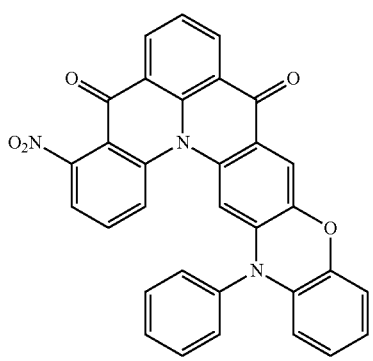
179
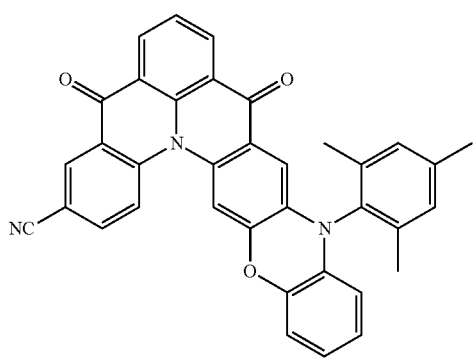
183
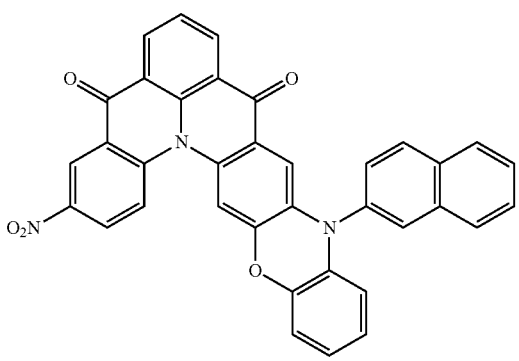

184
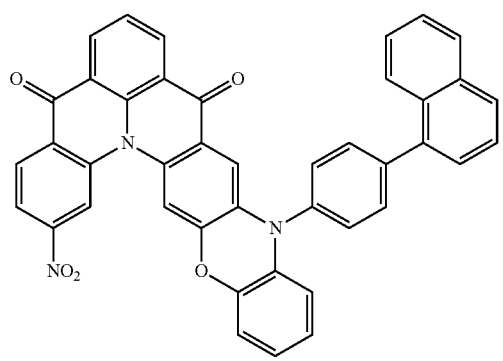
188
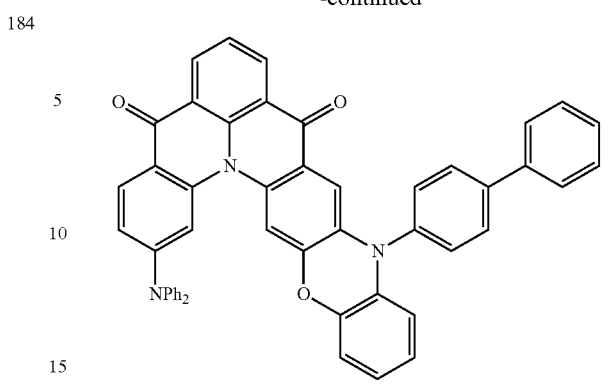
185
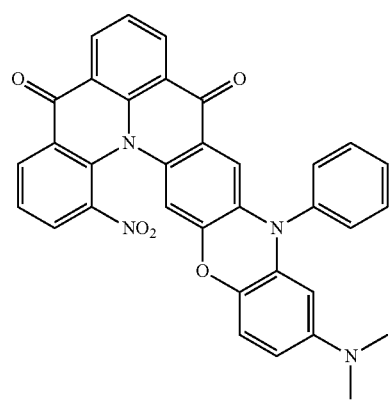
189
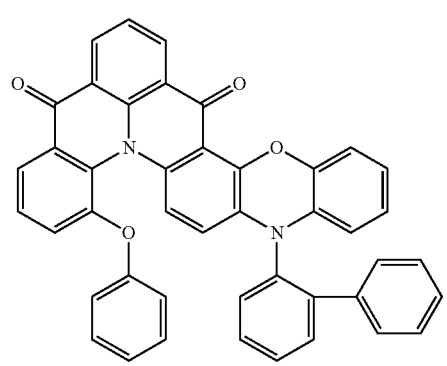
186
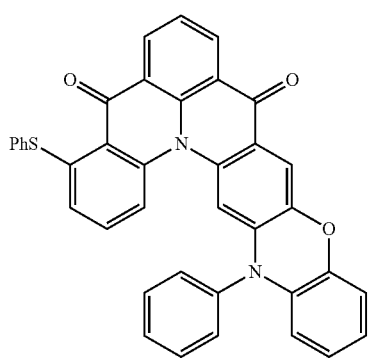
190
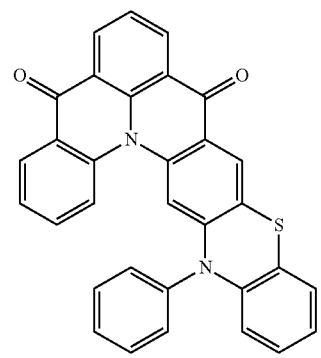
187
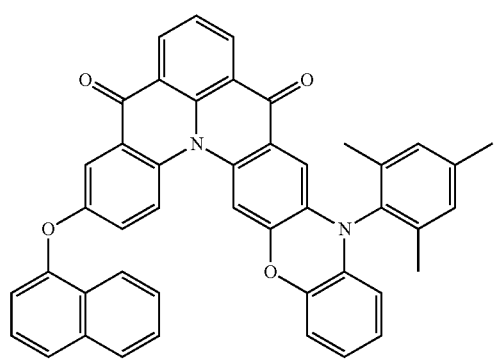
191
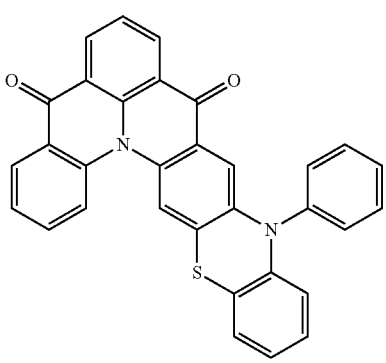

-continued
192
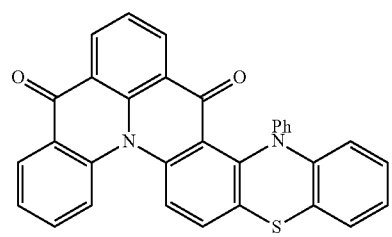
193
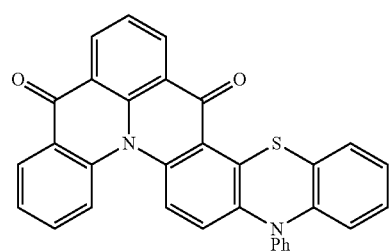
194
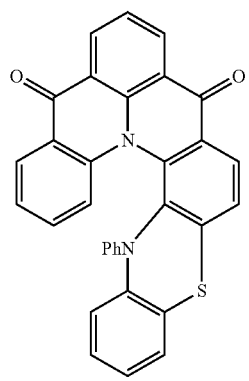
195
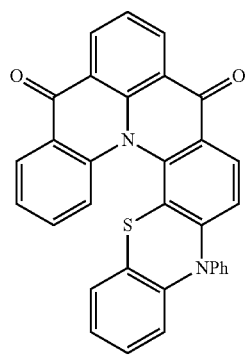
196
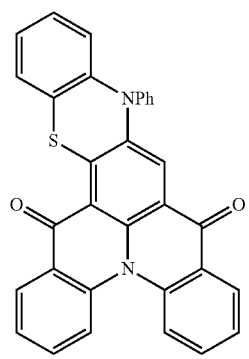
-continued
197
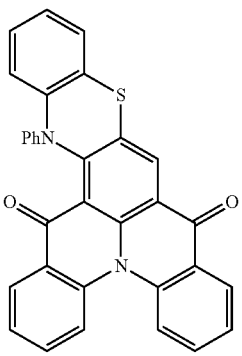
198
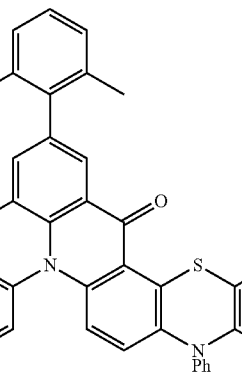
199
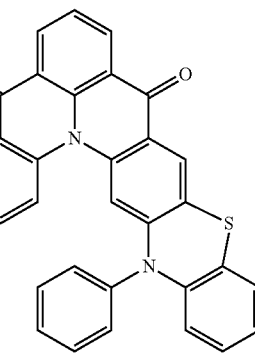
200
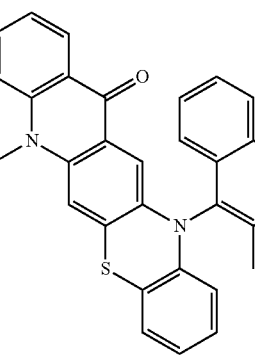

201 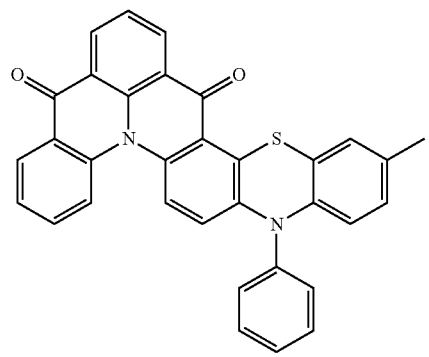
202 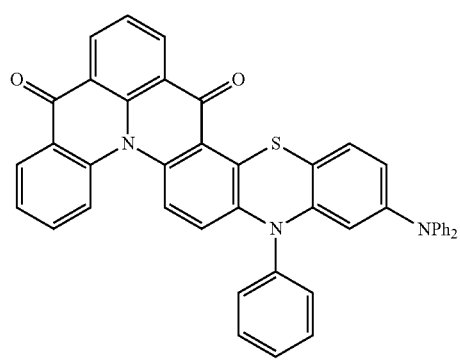
203 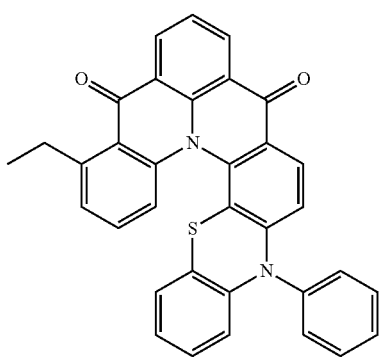
204 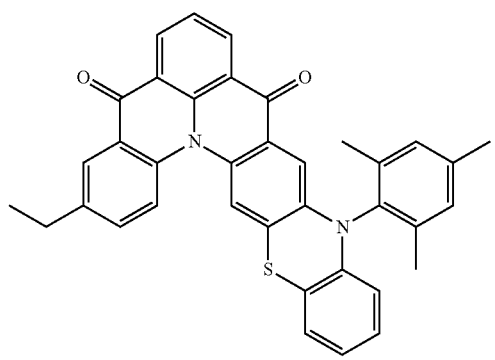
205 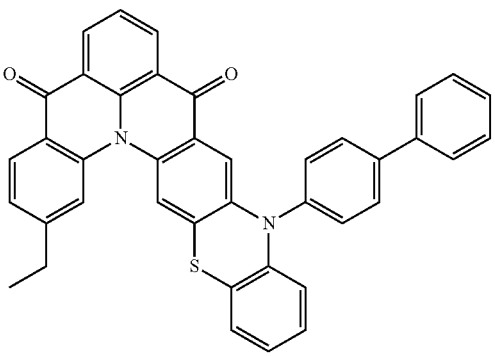
206 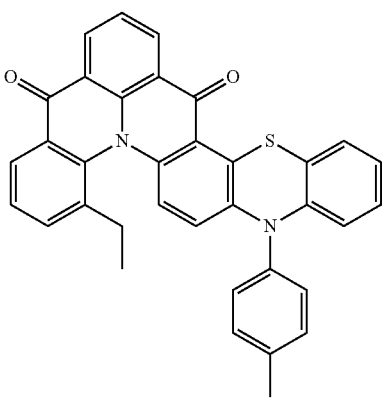
207 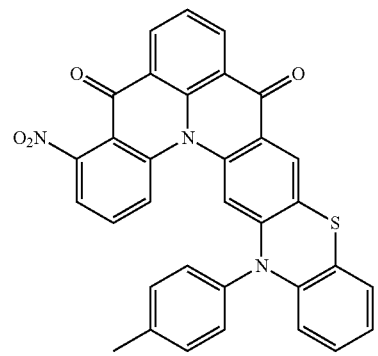
208 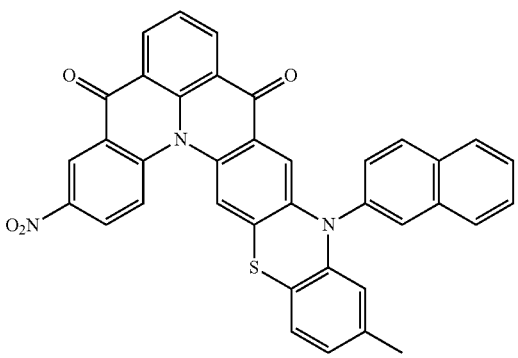

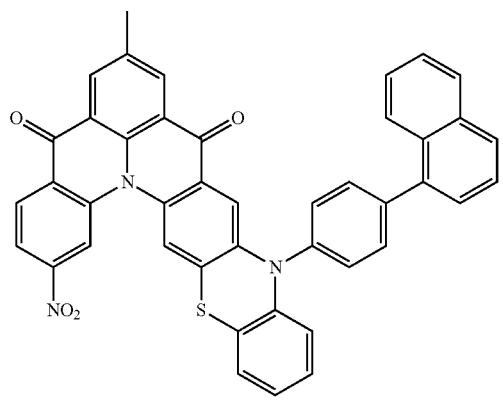
209
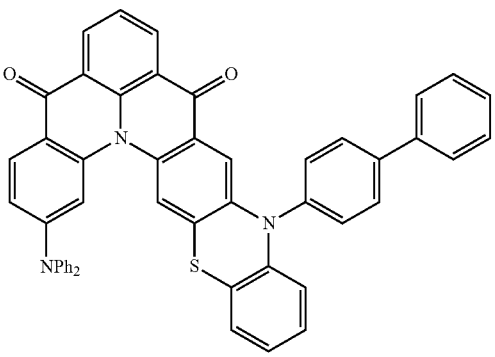
213
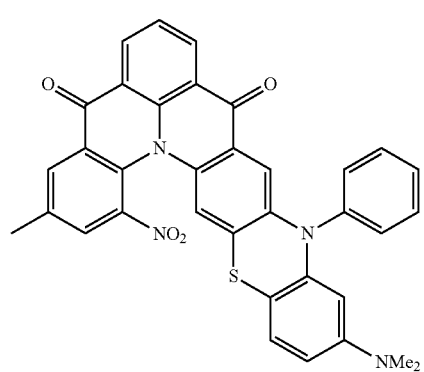
210
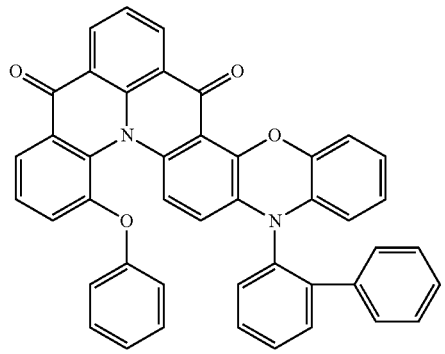
214
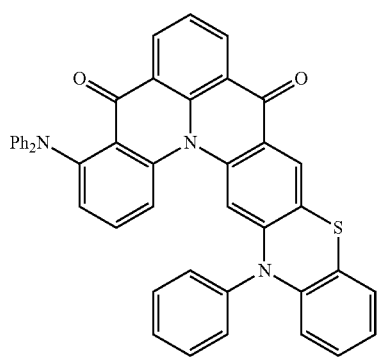
211
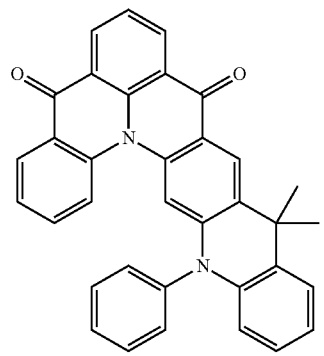
215
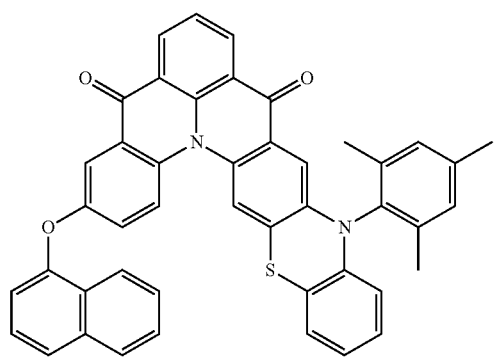
212
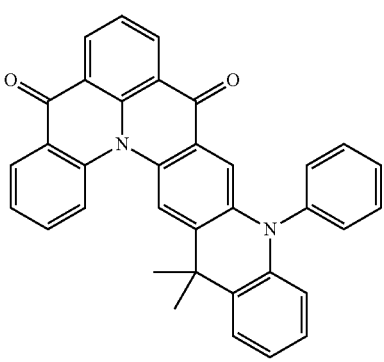
216

217
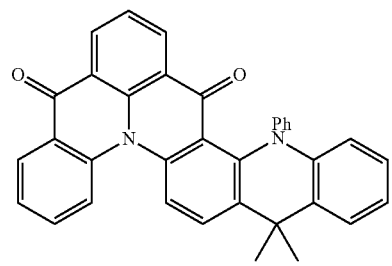
218
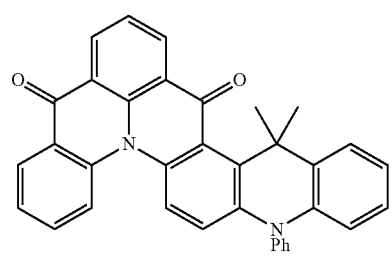
219
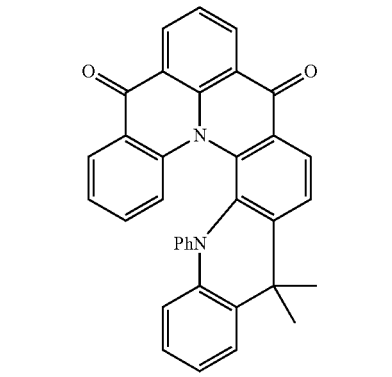
220
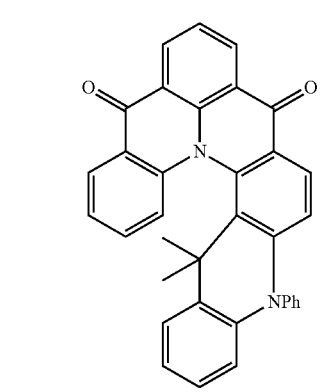
221
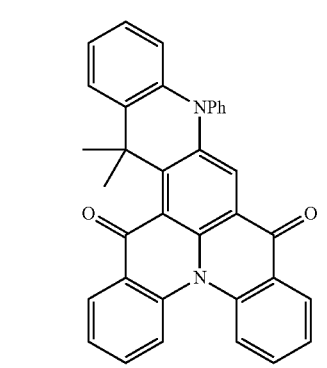
222
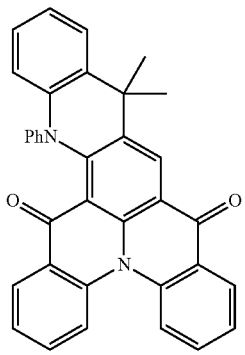
223
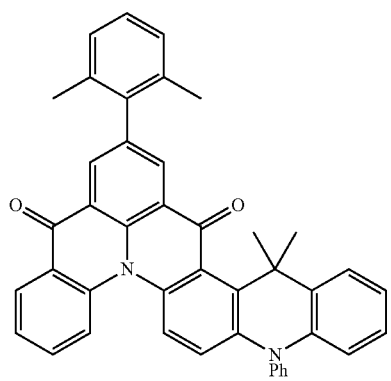
224
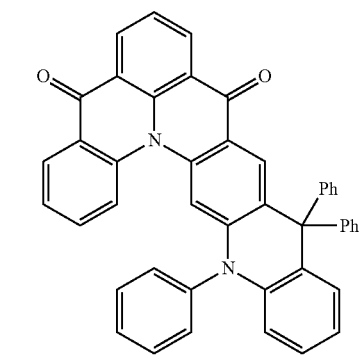
225
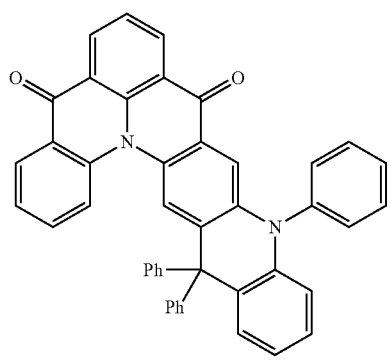

| | |
|---|---|
| 226 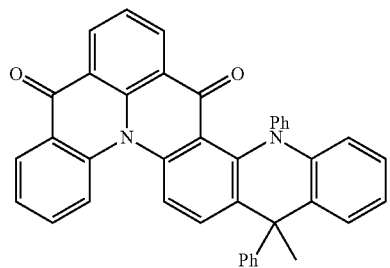 | 231 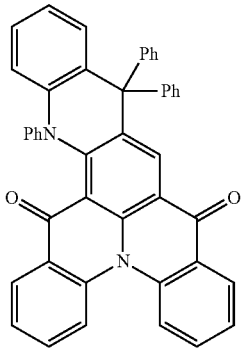 |
| 227 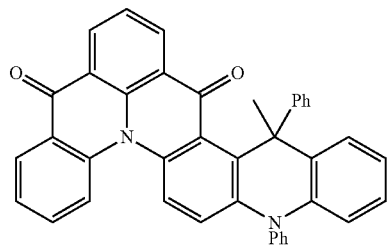 | 232 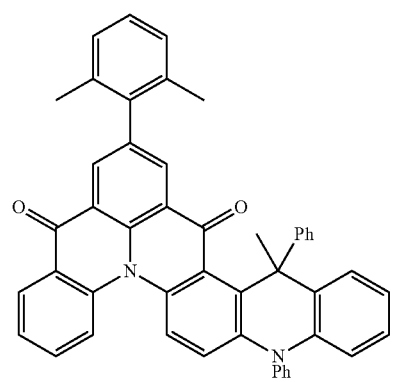 |
| 228 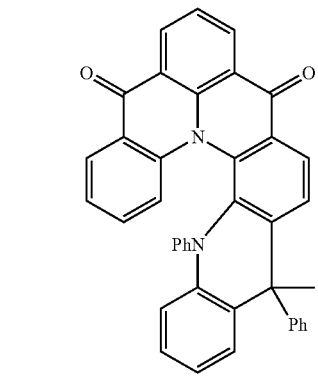 | 233 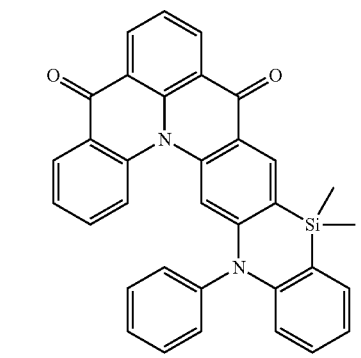 |
| 229 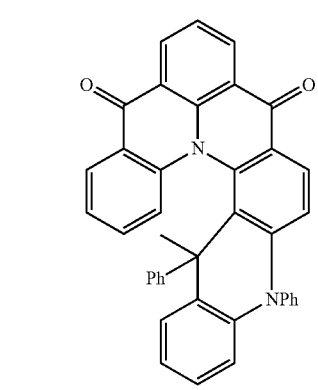 | 234 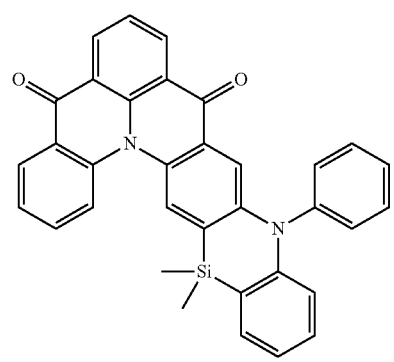 |
| 230 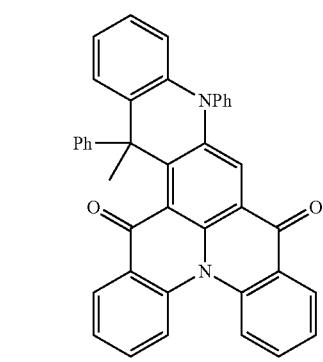 | |

235
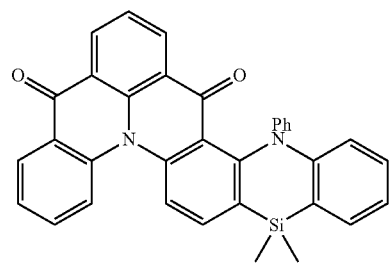
236
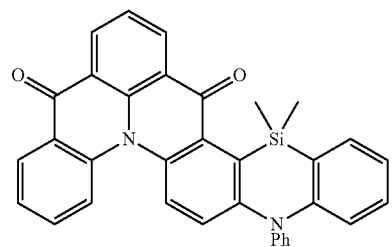
237
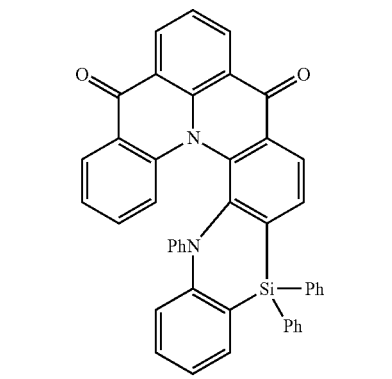
238
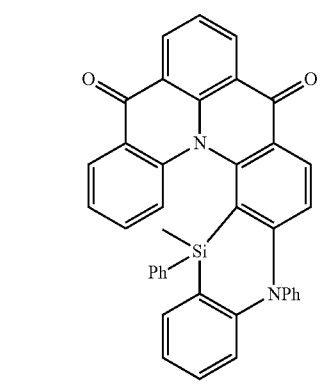
239
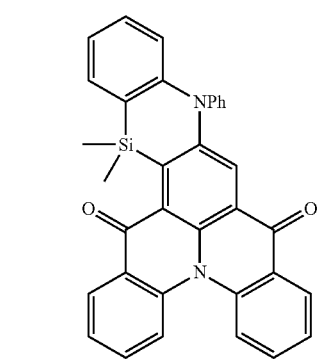
240
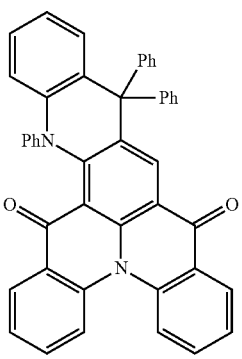
241
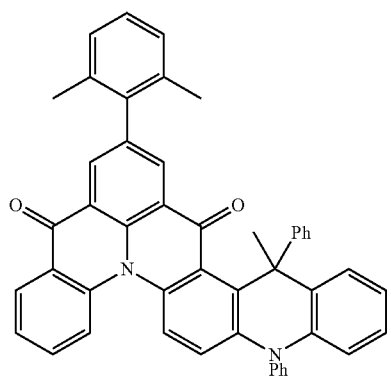
242
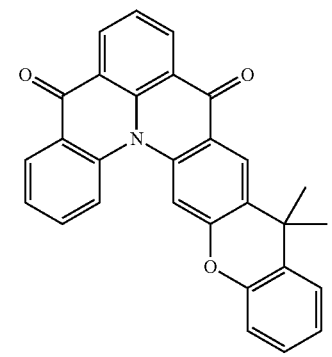
243
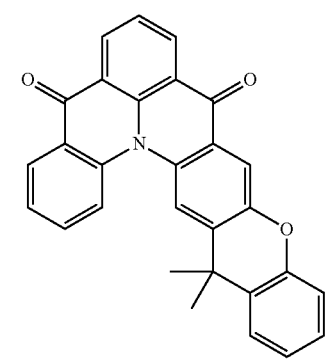

| | |
|---|---|
| 244 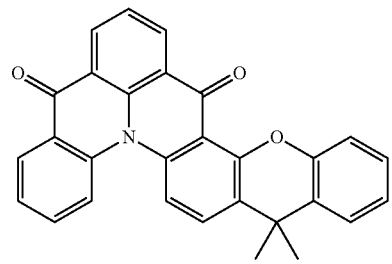 | 249 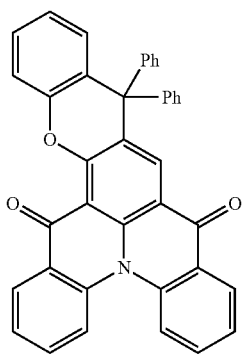 |
| 245 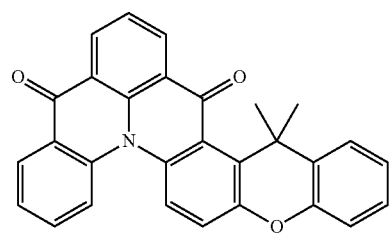 | 250 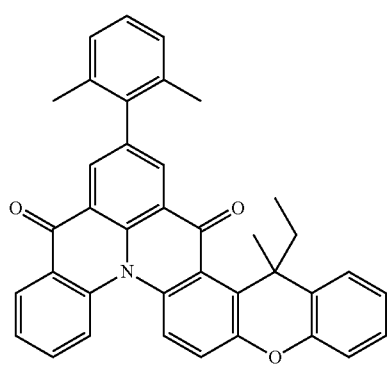 |
| 246 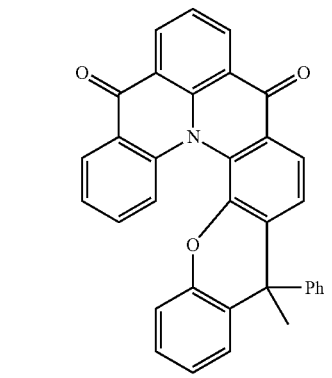 | 251 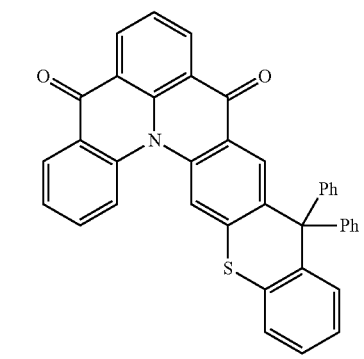 |
| 247 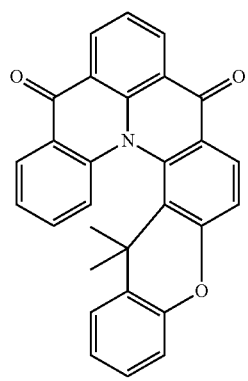 | 252 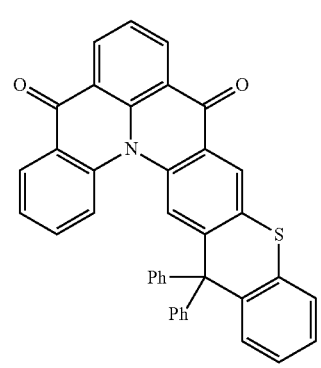 |
| 248 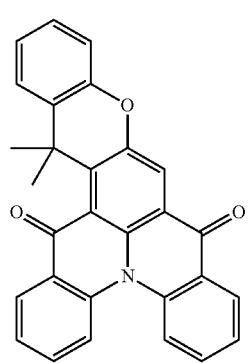 | |

253
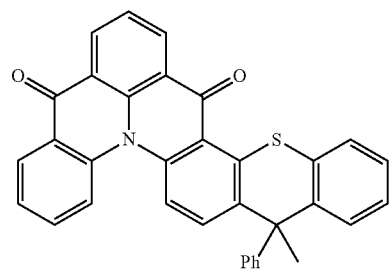
254
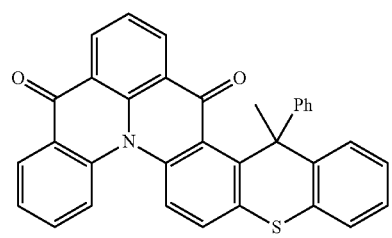
255
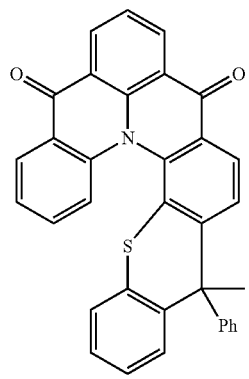
256
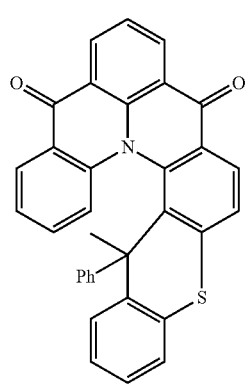
257
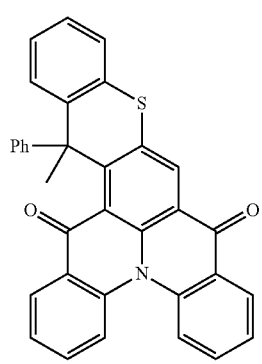
258
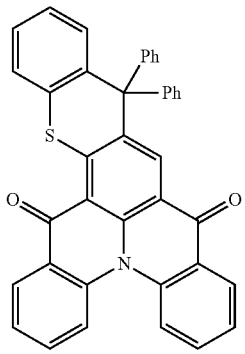
259
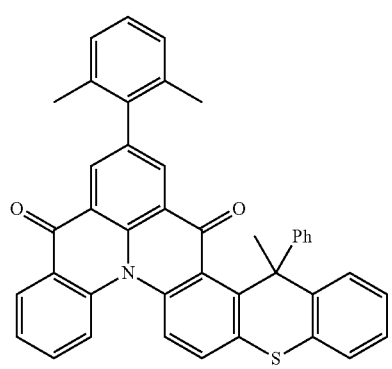
260
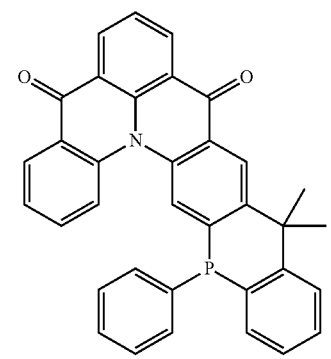
261
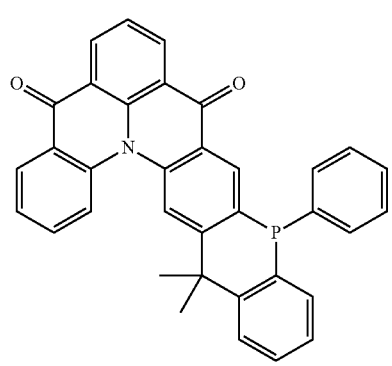

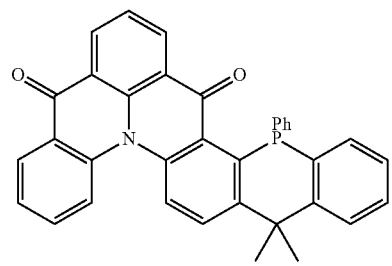
262
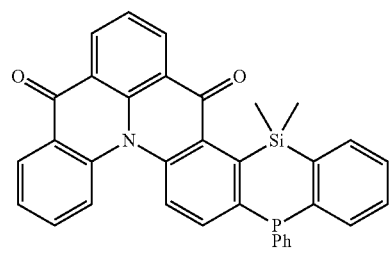
263
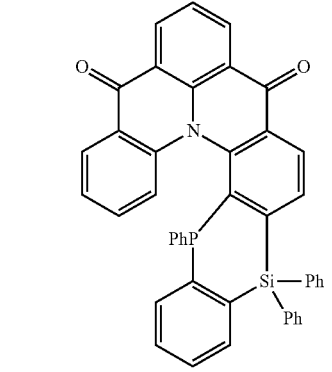
264
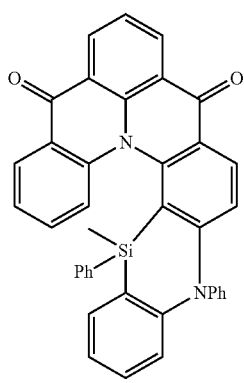
265
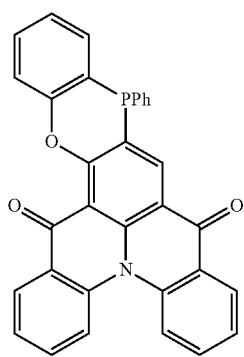
266
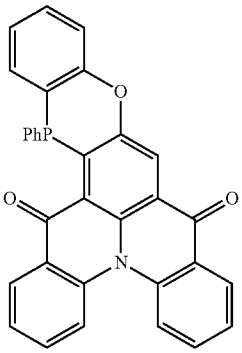
267
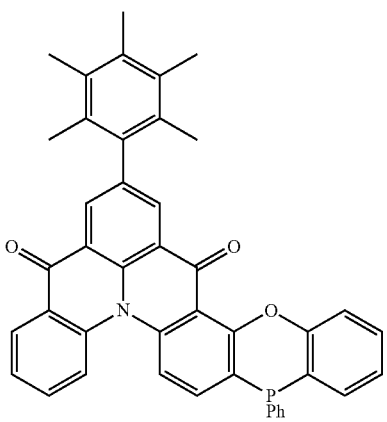
268
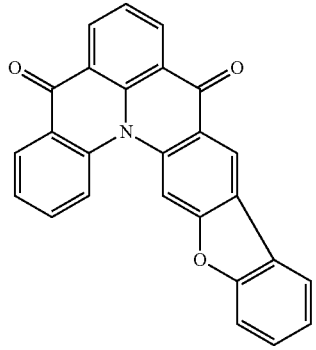
269
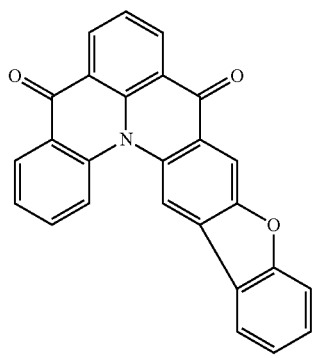
270

271 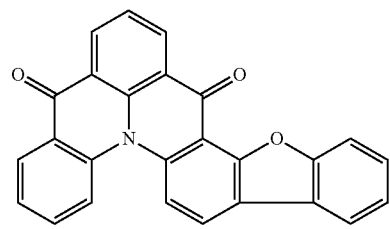
272 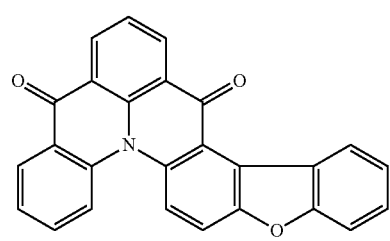
273 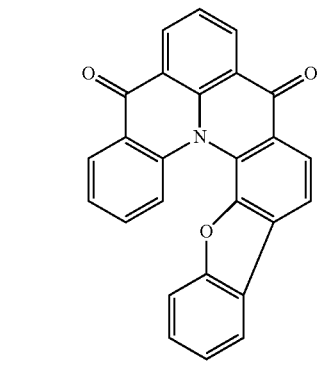
274 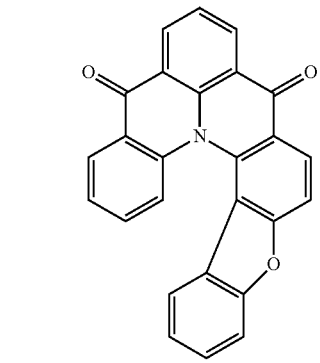
275 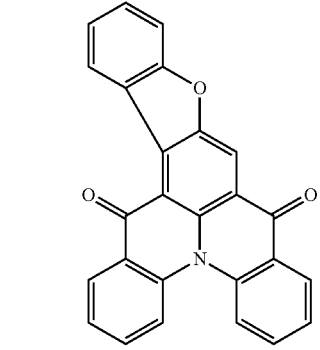
276 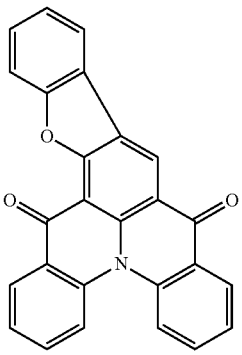
277 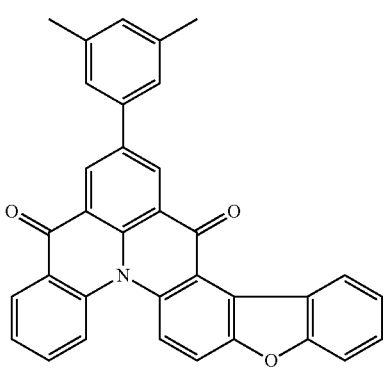
278 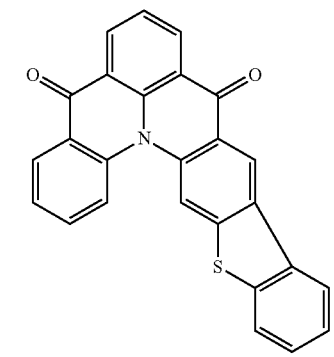
279 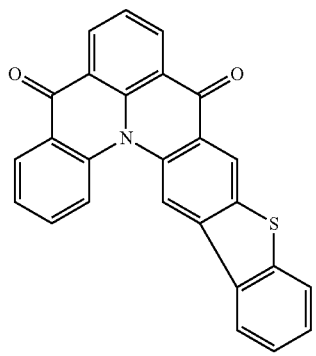

280 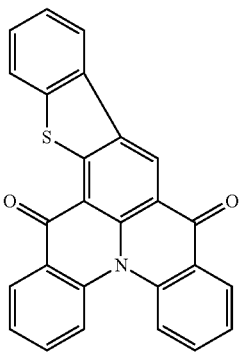
281 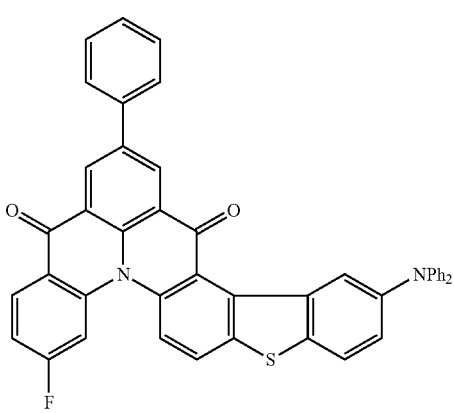
282 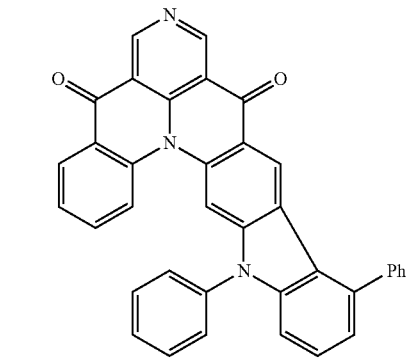
283 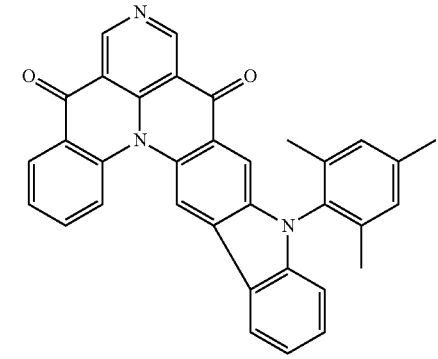
284
285 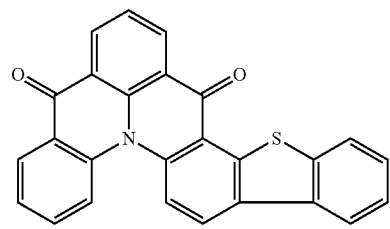
286 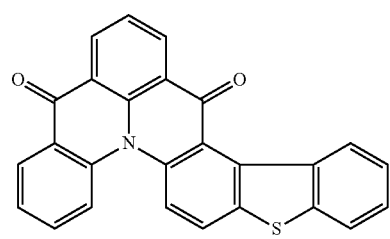
287 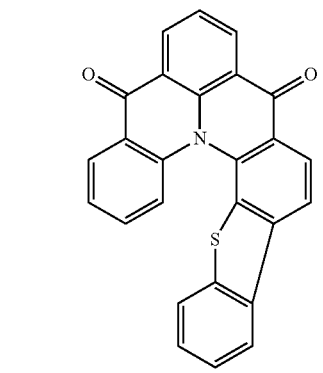
288 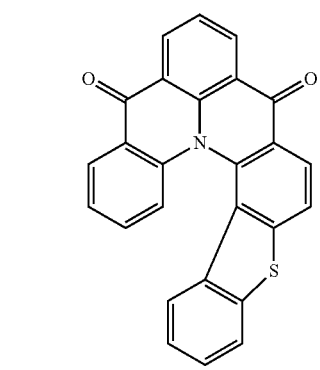

289
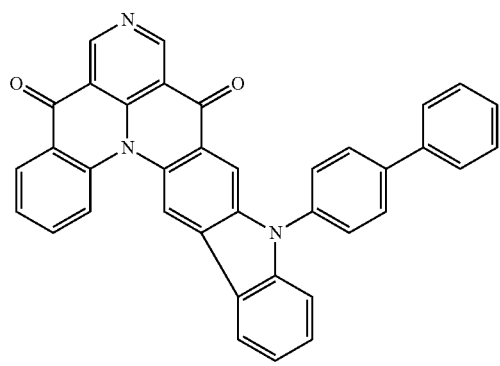
290
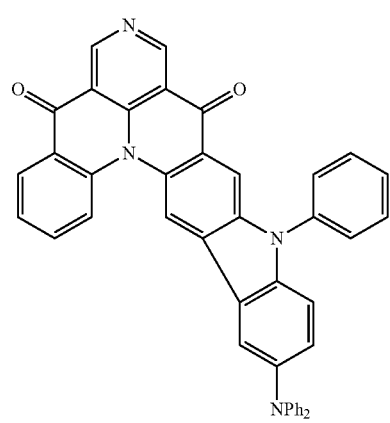
291
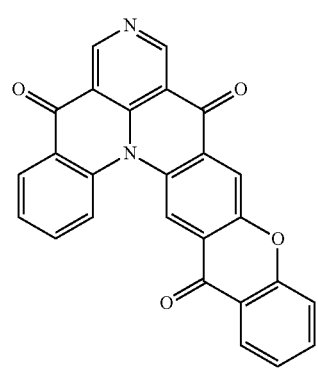
292
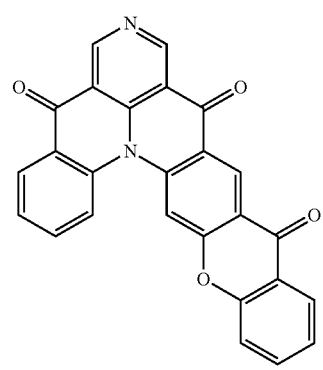
293
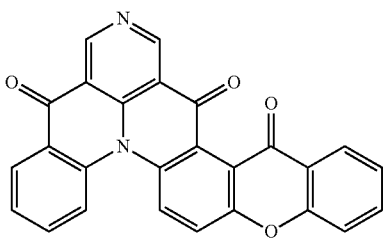
294
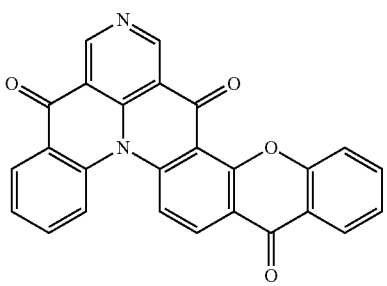
295
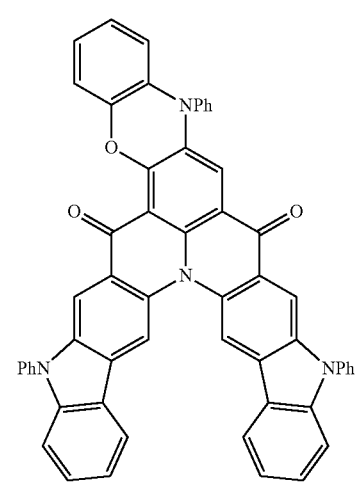
296

297
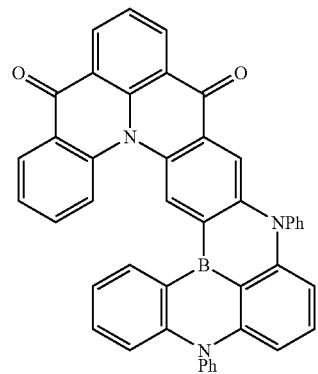
298
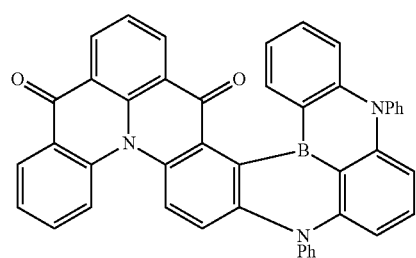
299
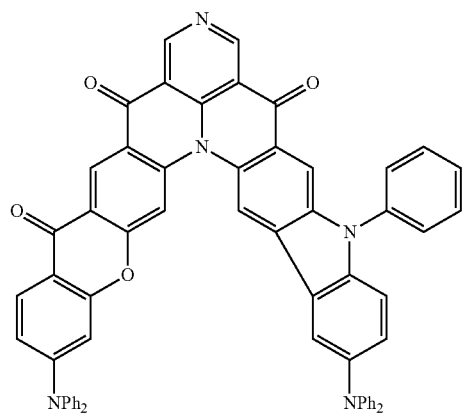
300
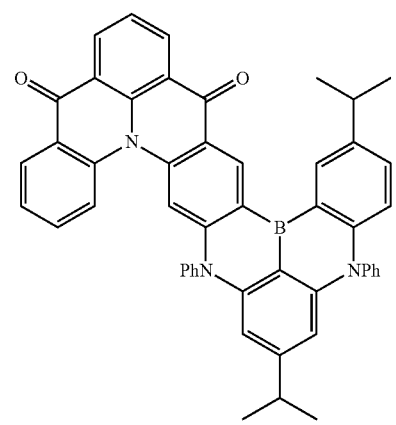
301
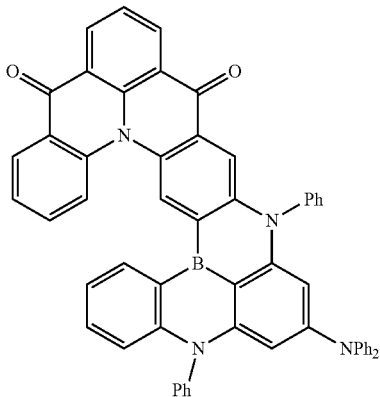
302
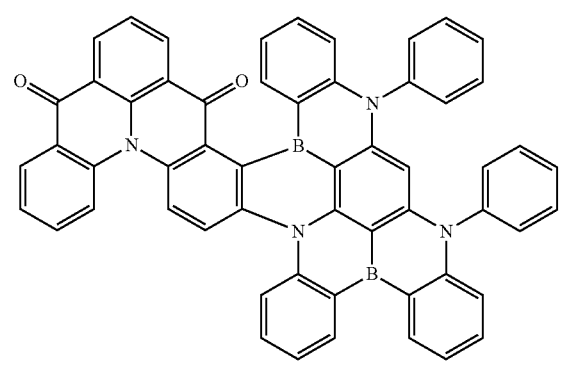
303
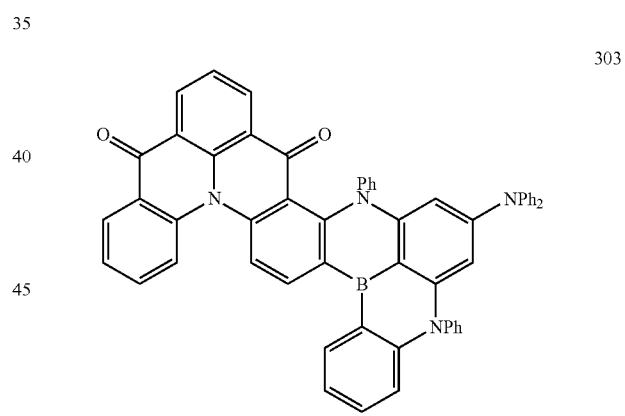
304
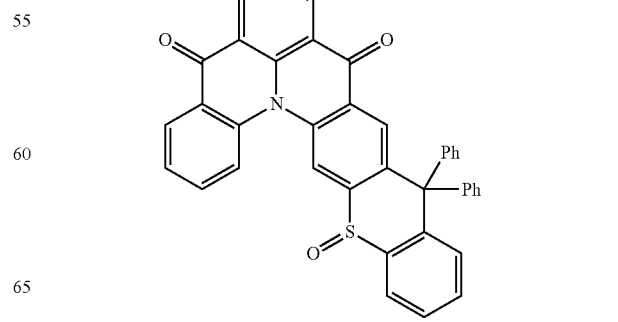

305
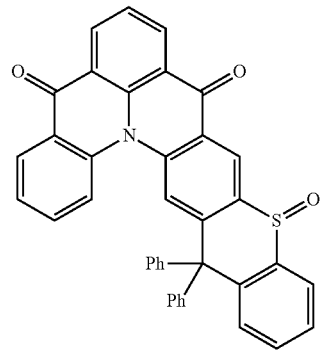
306
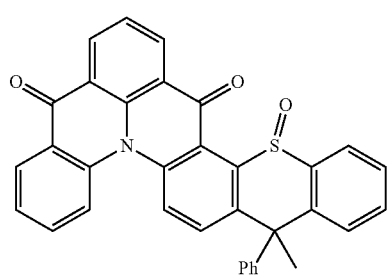
307
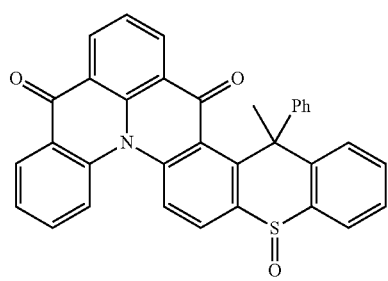
308
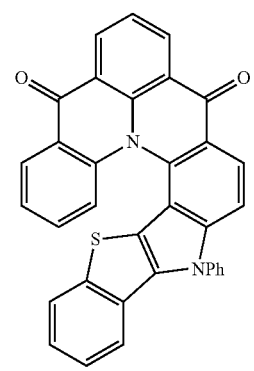
309
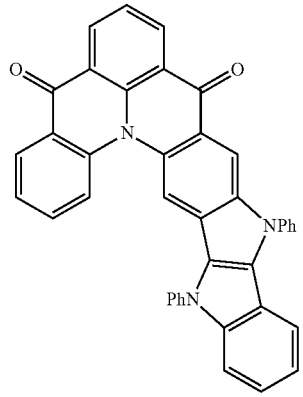
310
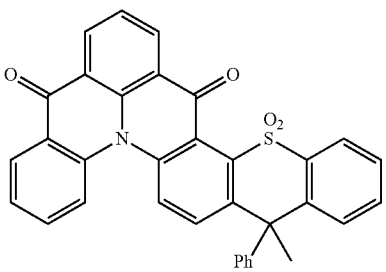
311
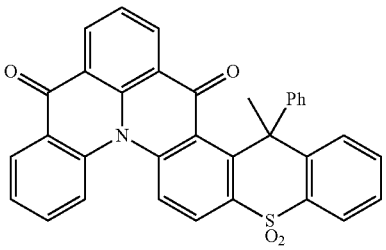
312
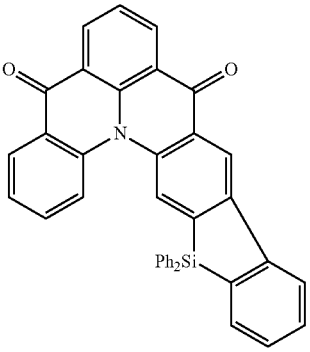
313
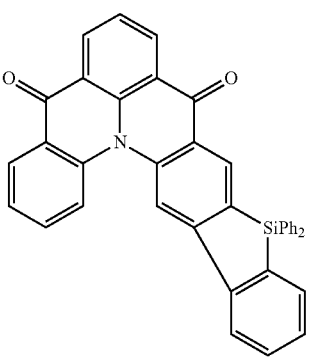

314
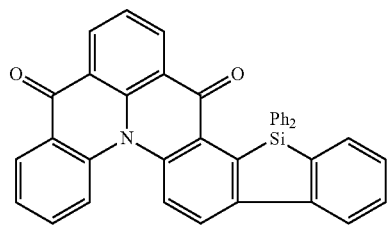
315
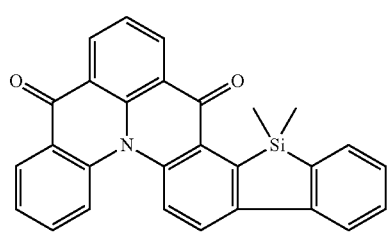
316
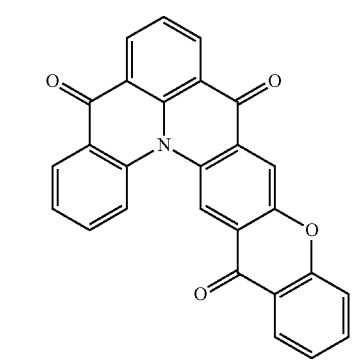
317
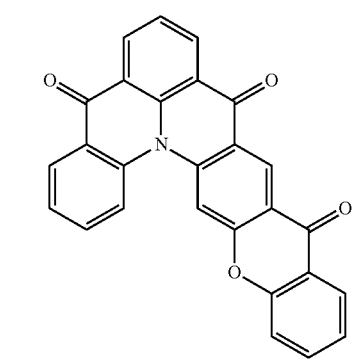
318
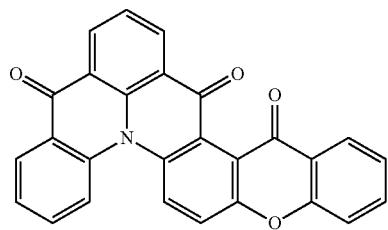
319
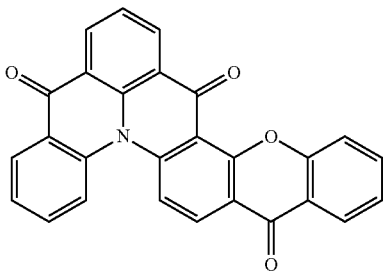
320
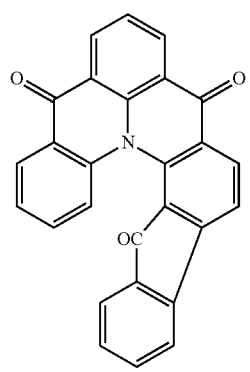
321
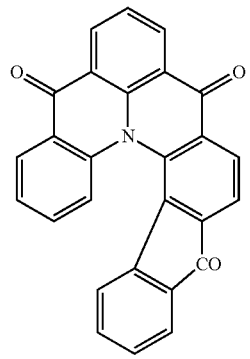
322
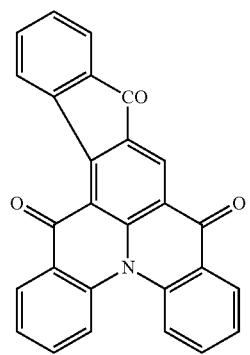

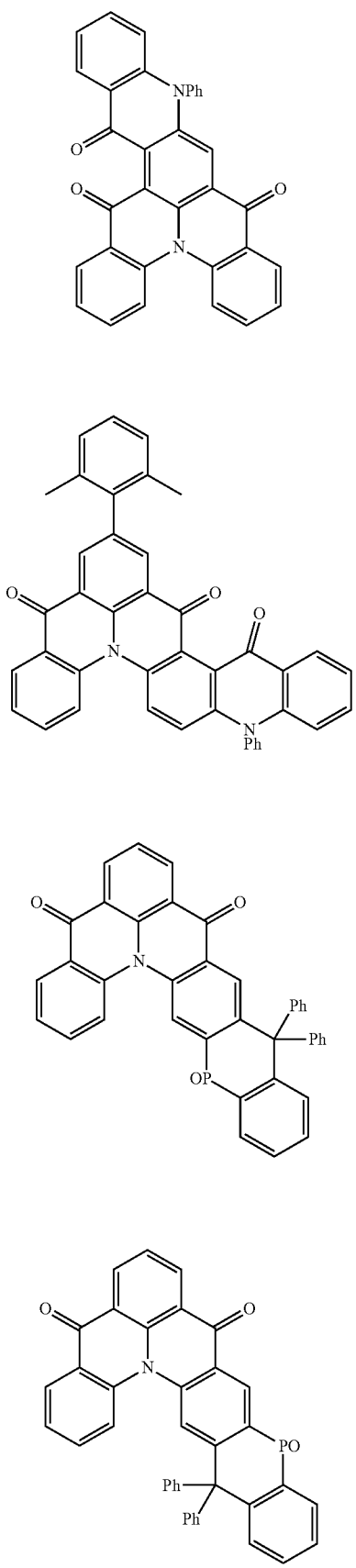
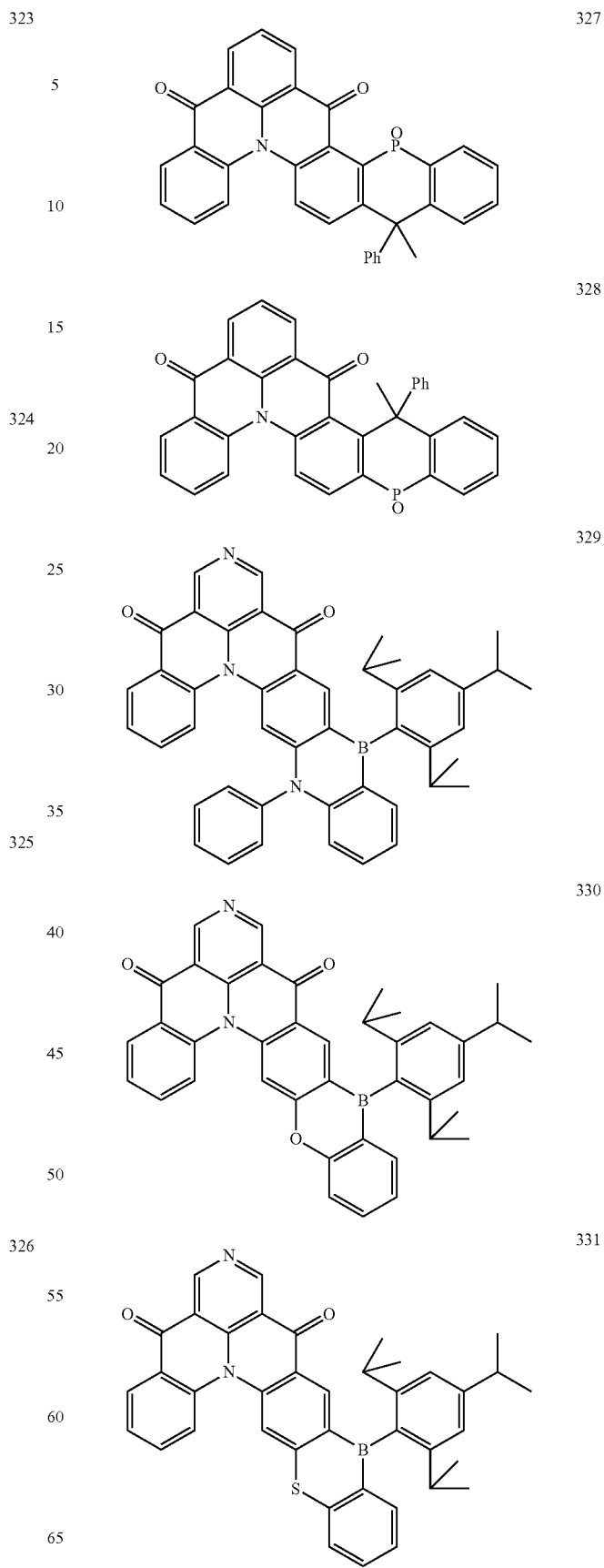

332
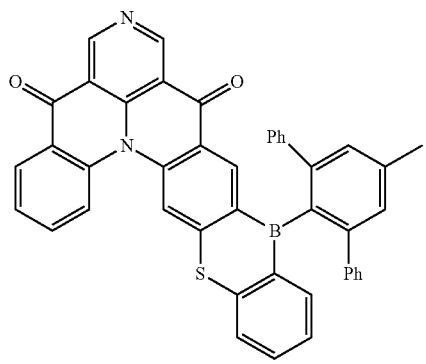
333
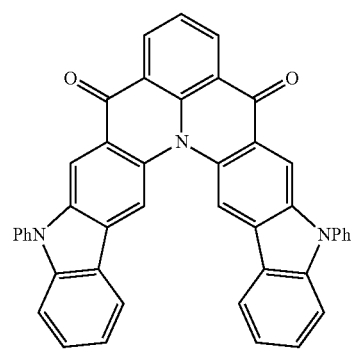
334
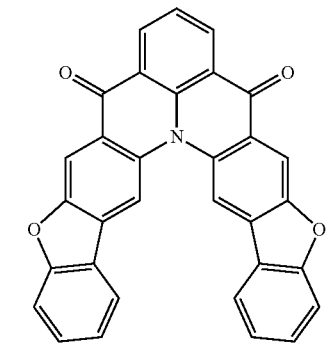
335
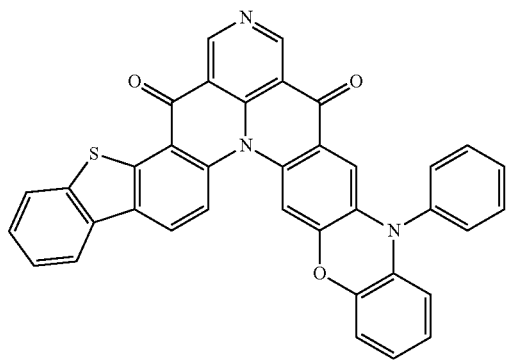
336
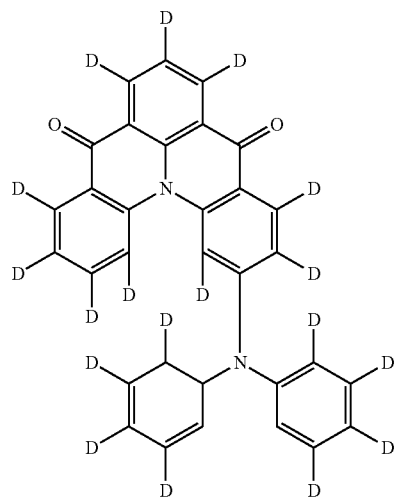
337
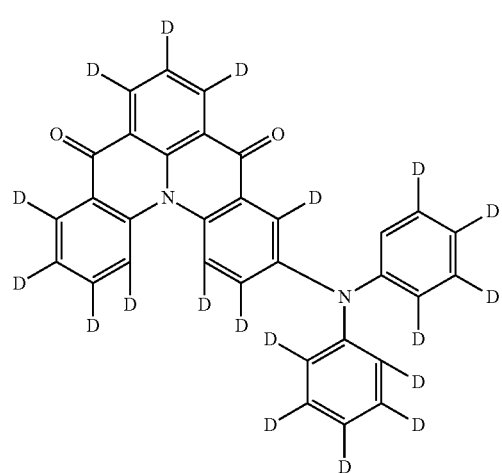
338
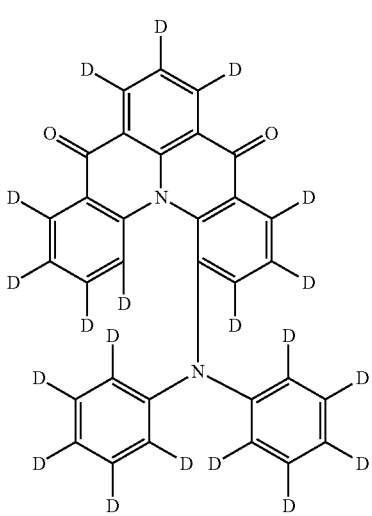

339

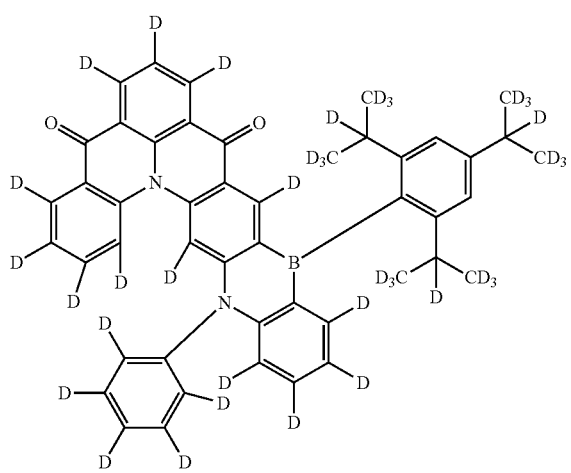

340

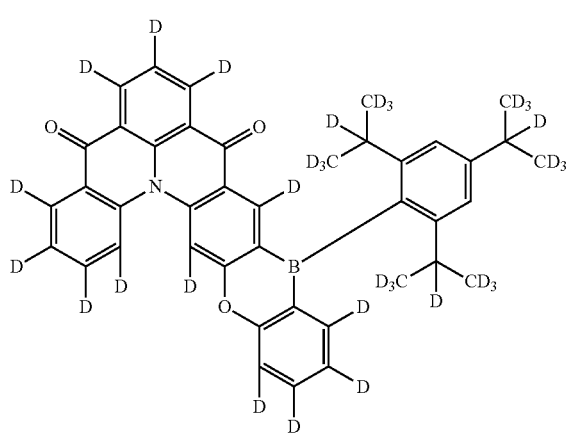

341

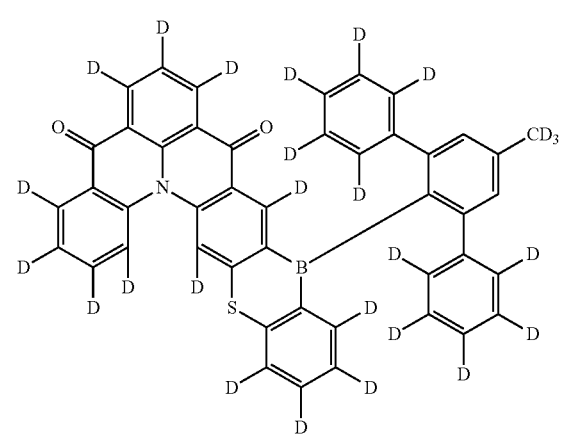

342

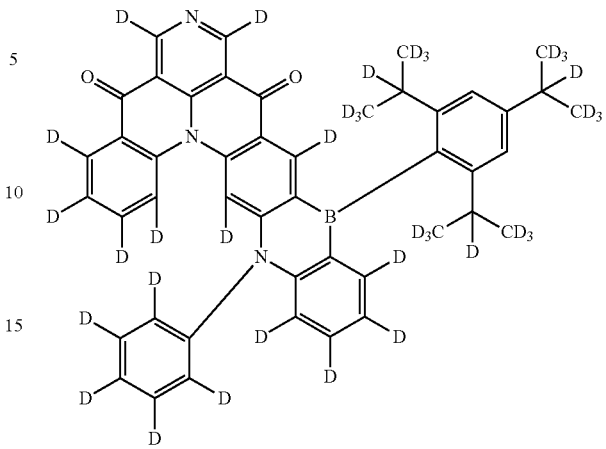

343

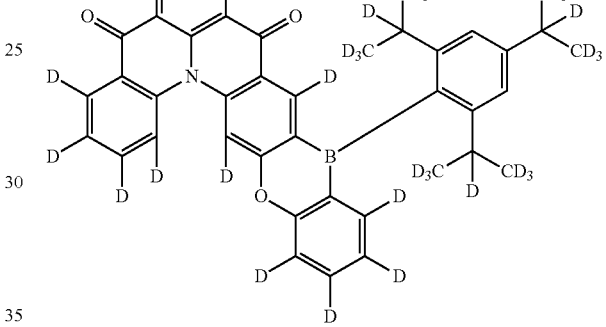

344

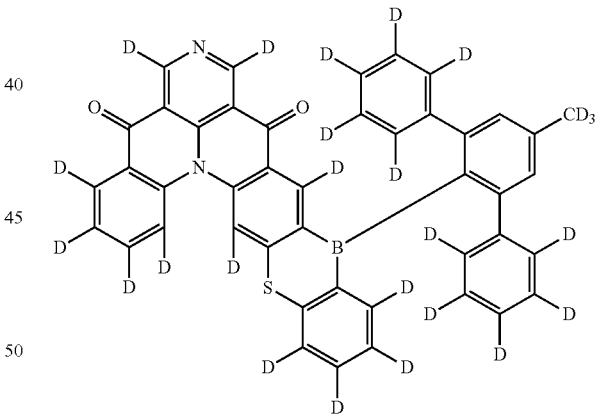

The polycyclic compound of an embodiment may emit blue light. The polycyclic compound of an embodiment may be included in the above-described third organic electroluminescence device ED-3 (FIG. 2). In another embodiment, the polycyclic compound of an embodiment may be included in all of the first to third organic electroluminescence devices ED-1, ED-2, and ED-3.

The polycyclic compound of an embodiment may be a material for emitting thermally activated delayed fluorescence. The polycyclic compound of an embodiment represented by Formula 1 may be a thermally activated delayed fluorescence dopant for the emission of blue light.

In the organic electroluminescent device ED of an embodiment, the emission layer EML may emit delayed fluorescence. For example, the emission layer EML may emit thermally activated delayed fluorescence (TADF).

In an embodiment, the emission layer EML may include a host and a dopant and may include the polycyclic compound of an embodiment as the dopant. For example, in the organic electroluminescence device ED of an embodiment, the emission layer EML may include a host for emitting delayed fluorescence and a dopant for emitting delayed fluorescence and may include the polycyclic compound of an embodiment as the dopant for emitting delayed fluorescence. The emission layer EML may include at least one of the polycyclic compounds represented in Compound Group 1 as a thermally activated delayed fluorescence dopant.

In an embodiment, the emission layer EML may be a delayed fluorescence emission layer, and the emission layer EML may include a host material and the above-described polycyclic compound of an embodiment. For example, in an embodiment, the polycyclic compound may be used as a TADF dopant. Further examples of host materials will be discussed below.

In the organic electroluminescence device ED of an embodiment, the emission layer EML may include anthracene derivatives, pyrene derivatives, fluoranthene derivatives, chrysene derivatives, dihydrobenzanthracene derivatives, or triphenylene derivatives. The emission layer EML may include anthracene derivatives or pyrene derivatives.

In the organic electroluminescence devices ED of embodiments, shown in FIG. 3 to FIG. 6, the emission layer EML may include a compound represented by Formula E-1 below. The compound represented by Formula E-1 below may be used as a fluorescence host material.

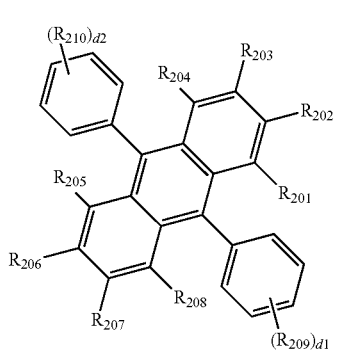

[Formula E-1]

In Formula E-1, $R_{201}$ to $R_{210}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. $R_{201}$ to $R_{210}$ may be combined with an adjacent group to form a saturated hydrocarbon ring or an unsaturated hydrocarbon ring. In Formula E-1, d1 and d2 may each independently be an integer from 0 to 5. If d1 is an integer of 2 or more, multiple $R_{209}$ groups may be the same or different from each other. If d2 is an integer of 2 or more, multiple $R_{210}$ groups may be the same or different from each other.

Formula E-1 may be represented by any one among Formula E1 to Formula E18 below.

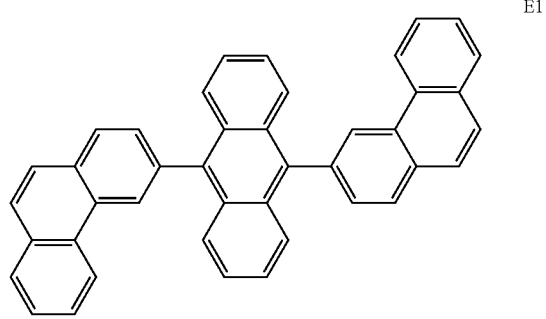

E1

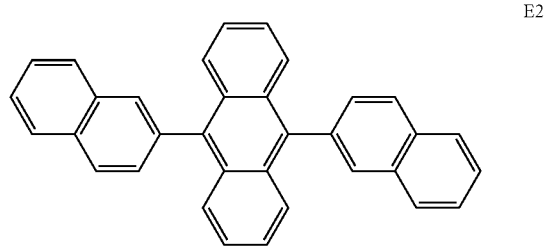

E2

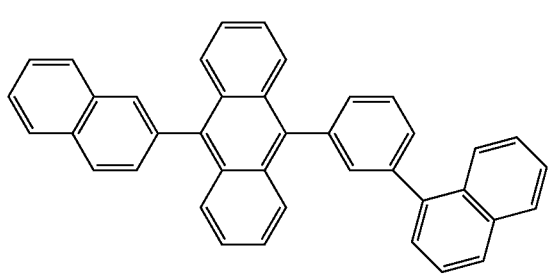

E3

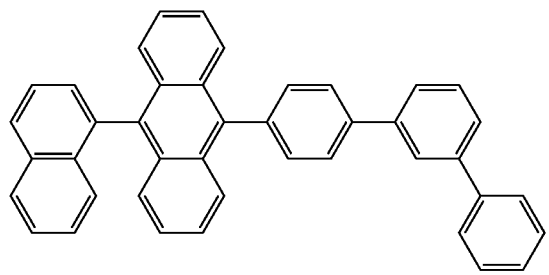

E4

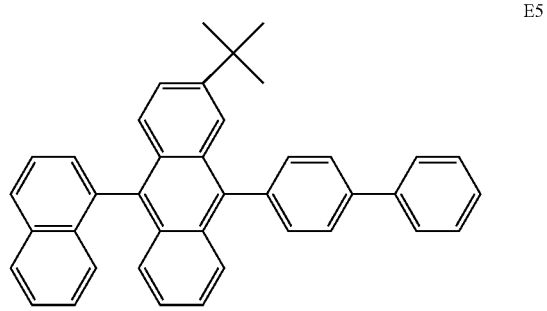

E5

E6
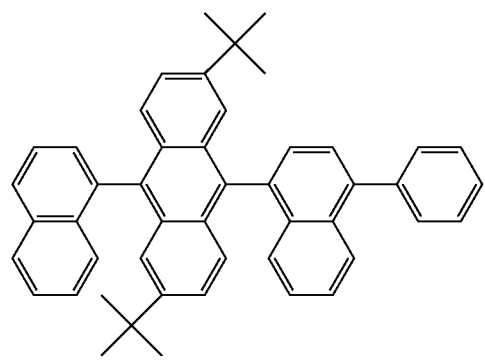
E7
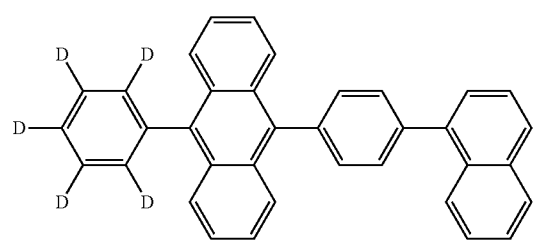
E8
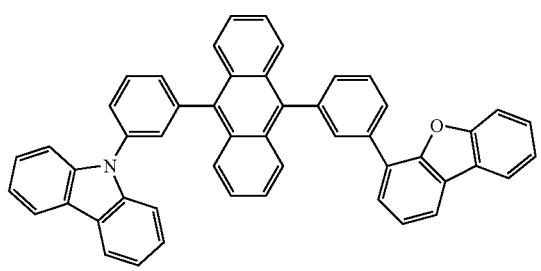
E9
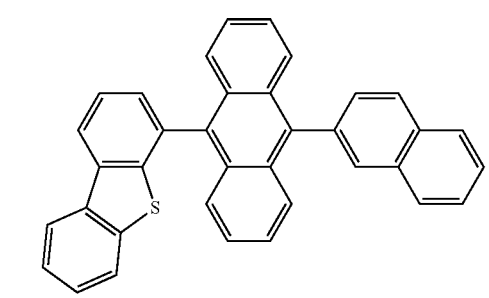
E10
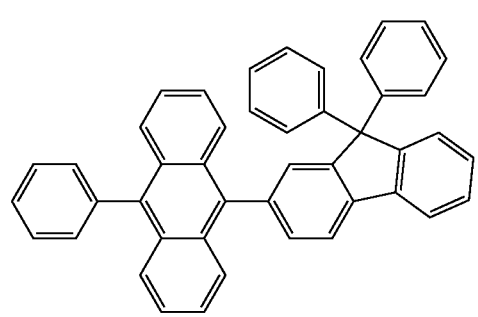
E11
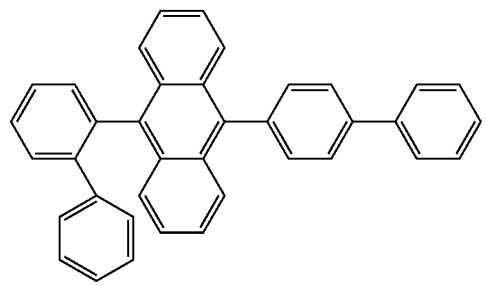
E12
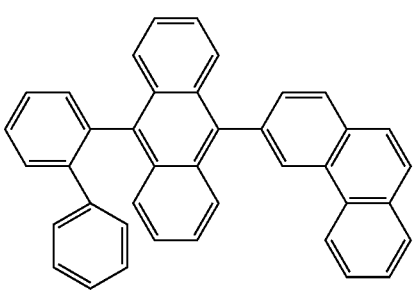
E13
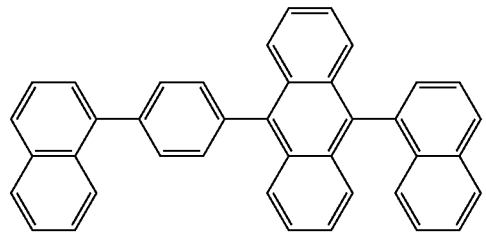
E14
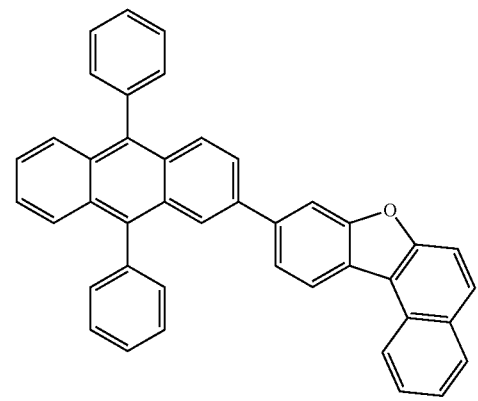

E15

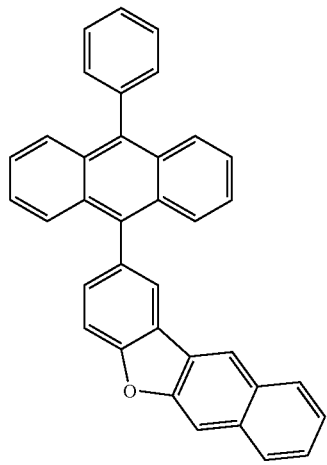

E16

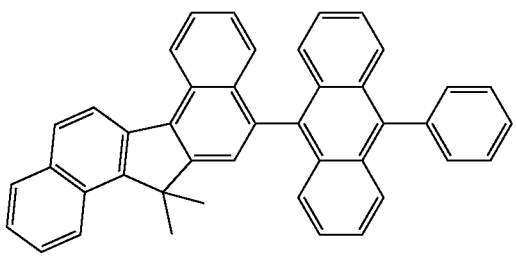

E17

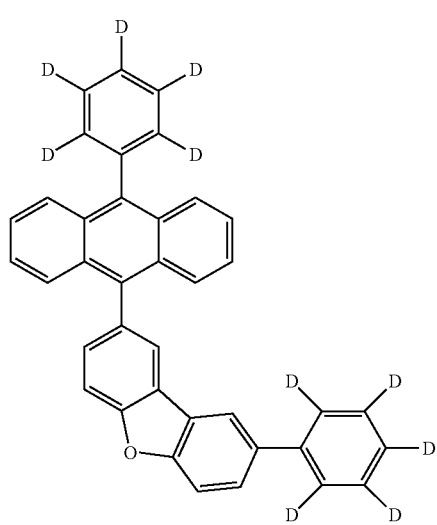

E18

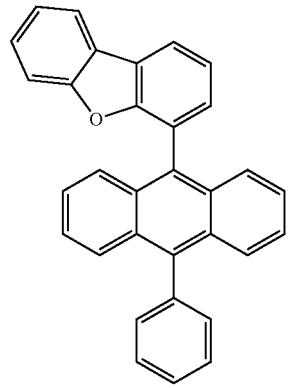

The emission layer EML may further include a common material in the art as a host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl) dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, an embodiment of the inventive concept is not limited thereto. For example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenyamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as the host material.

However, an embodiment of the inventive concept is not limited thereto, and known host materials for emitting delayed fluorescence may be included in addition to the suggested host materials.

In an embodiment, the emission layer EML may further include a dopant material. For example, the emission layer EML may further include as a dopant material, styryl derivatives (for example, 1,4-bis[2-(3-N-ethylcarbazoryl) vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

In the organic electroluminescence device ED of an embodiment, as shown in FIG. 3 to FIG. 6, the electron transport region ETR is provided on the emission layer EML. The electron transport region ETR may include at least one of an electron blocking layer HBL, an electron transport layer ETL or an electron injection layer EIL. However, an embodiment of the inventive concept is not limited thereto.

The electron transport region ETR may have a single layer formed using a single material, a single layer formed using multiple different materials, or a multilayer structure having multiple layers formed using multiple different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having multiple different materials, or a structure stacked from the emission layer EML of electron transport layer ETL/electron injection layer EIL, or hole blocking layer HBL/electron transport layer ETL/electron injection layer EIL, without limitation. A thickness of the electron transport region ETR may be, for example, in a range of about 1,000 Å to about 1,500 Å.

The electron transport region ETR may be formed using various methods such as a vacuum deposition method, a spin coating method, a cast method, a *Langmuir*-Blodgett (LB) method, an inkjet printing method, a laser printing method, and a laser induced thermal imaging (LITI) method.

The electron transport region ETR may include an anthracene-based compound. However, an embodiment of the inventive concept is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and mixtures thereof, without limitation.

For example, the electron transport region ETR may include a compound represented by Formula ET-1 below.

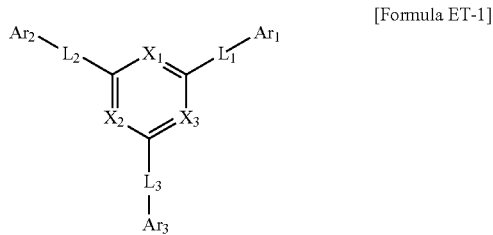

[Formula ET-1]

In Formula ET-1, at least one among $X_1$ to $X_3$ may be N, and the remainder may be $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms.

A thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without substantial increase of a driving voltage.

The electron transport region ETR may include a metal halide such as LiF, NaCl, CsF, RbCl, RbI, CuI and KI, a lanthanide metal such as Yb, or a co-depositing material of the metal halide and the lanthanide metal. For example, the electron transport region ETR may include KI:Yb, RbI:Yb, etc., as the co-depositing material. The electron transport region ETR may use a metal oxide such as $Li_2O$ and BaO, or 8-hydroxy-lithium quinolate (Liq). However, an embodiment of the inventive concept is not limited thereto. The electron injection layer EIL also may be formed using a mixture material of an electron transport material and an insulating organo-metal salt. The organo-metal salt may be a material having an energy band gap of about 4 eV or more. The organo-metal salt may include, for example, metal acetates, metal benzoates, metal acetoacetates, metal acetylacetonates, or metal stearates. A thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 is provided on the electron transport region ETR. The second electrode EL2 may be provided as a common electrode. The second electrode EL2 may be a cathode or an anode, but an embodiment of the inventive concept is not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, compounds including thereof, or mixtures thereof (for example, AgMg, AgYb, or MgAg). The second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

On the second electrode EL2 in the organic electroluminescence device ED of an embodiment, a capping layer CPL may be further disposed. The capping layer CPL may include a multilayer or a single layer.

In an embodiment, the capping layer CPL may be an organic layer or an inorganic layer. For example, if the capping layer CPL includes an inorganic material, the inorganic material may include an alkali metal compound such as LiF, an alkaline earth metal compound such as MgF$_2$, SiON, SiNx, SiOy, etc.

For example, if the capping layer CPL includes an organic material, the organic material may include α-NPD, NPB, TPD, m-MTDATA, Alq$_3$, CuPc, N4,N4,N4',N4'-tetra(biphenyl-4-yl) biphenyl-4,4'-diamine (TPD15), 4,4',4''-tris(carbazol sol-9-yl) triphenylamine (TCTA), etc., or includes an epoxy resin, or acrylate such as methacrylate. Compounds P1 to P5 below may be included, but an embodiment of the inventive concept is not limited thereto.

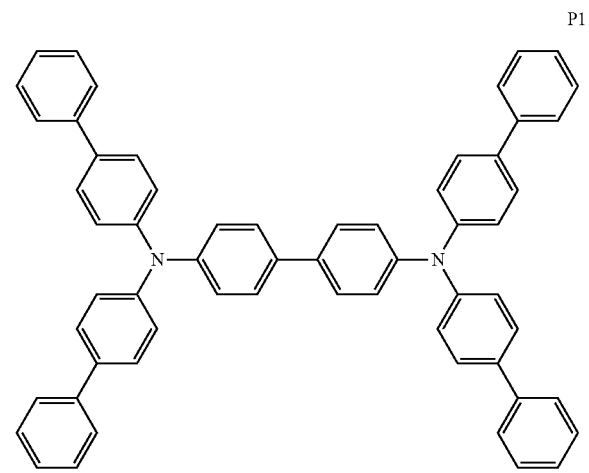

P1

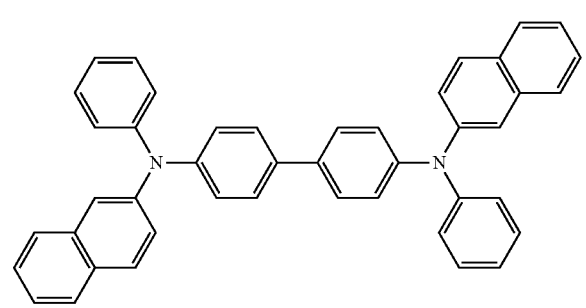

P2

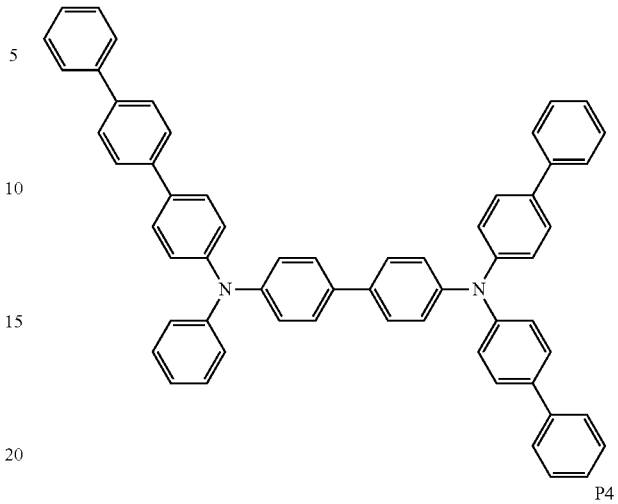

P3

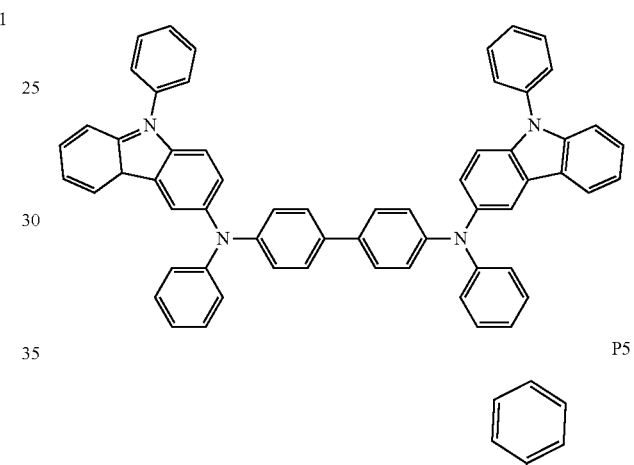

P4

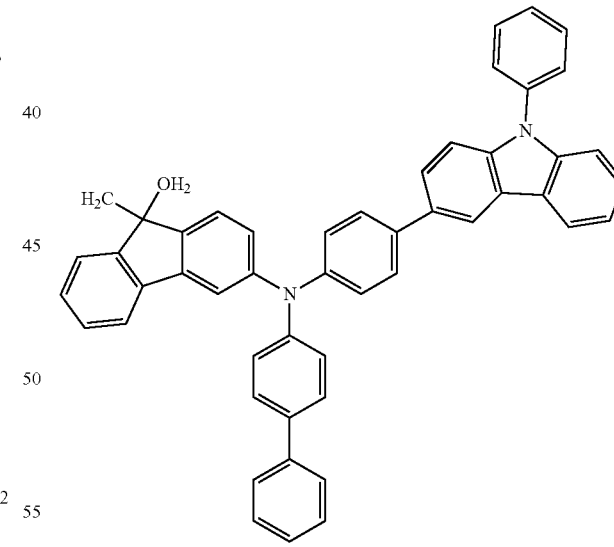

P5

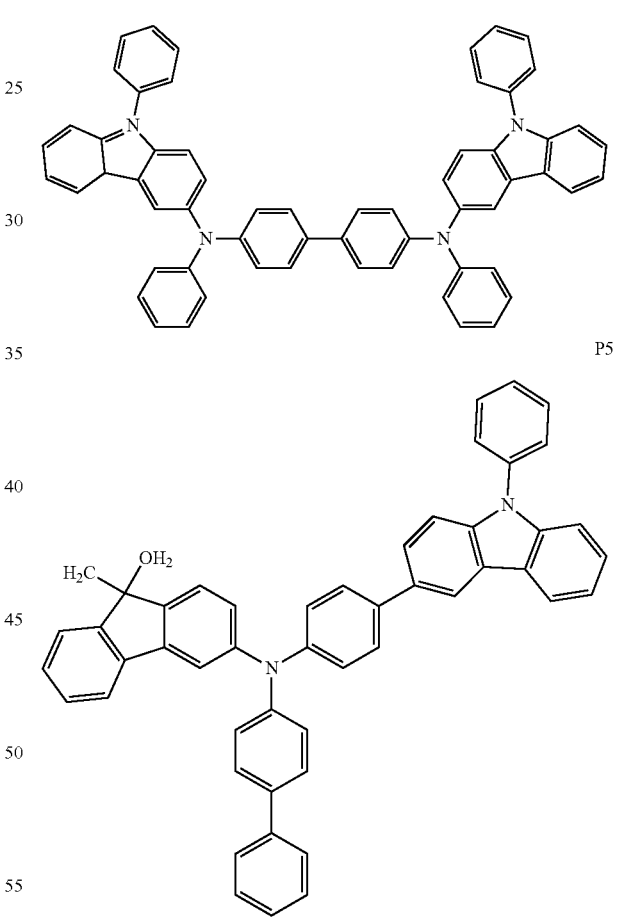

The refractive index of the capping layer CPL may be equal to or greater than about 1.6. The refractive index of the capping layer CPL with respect to light in a wavelength range of about 550 nm to about 660 nm may be equal to or greater than about 1.6.

Figure 7:
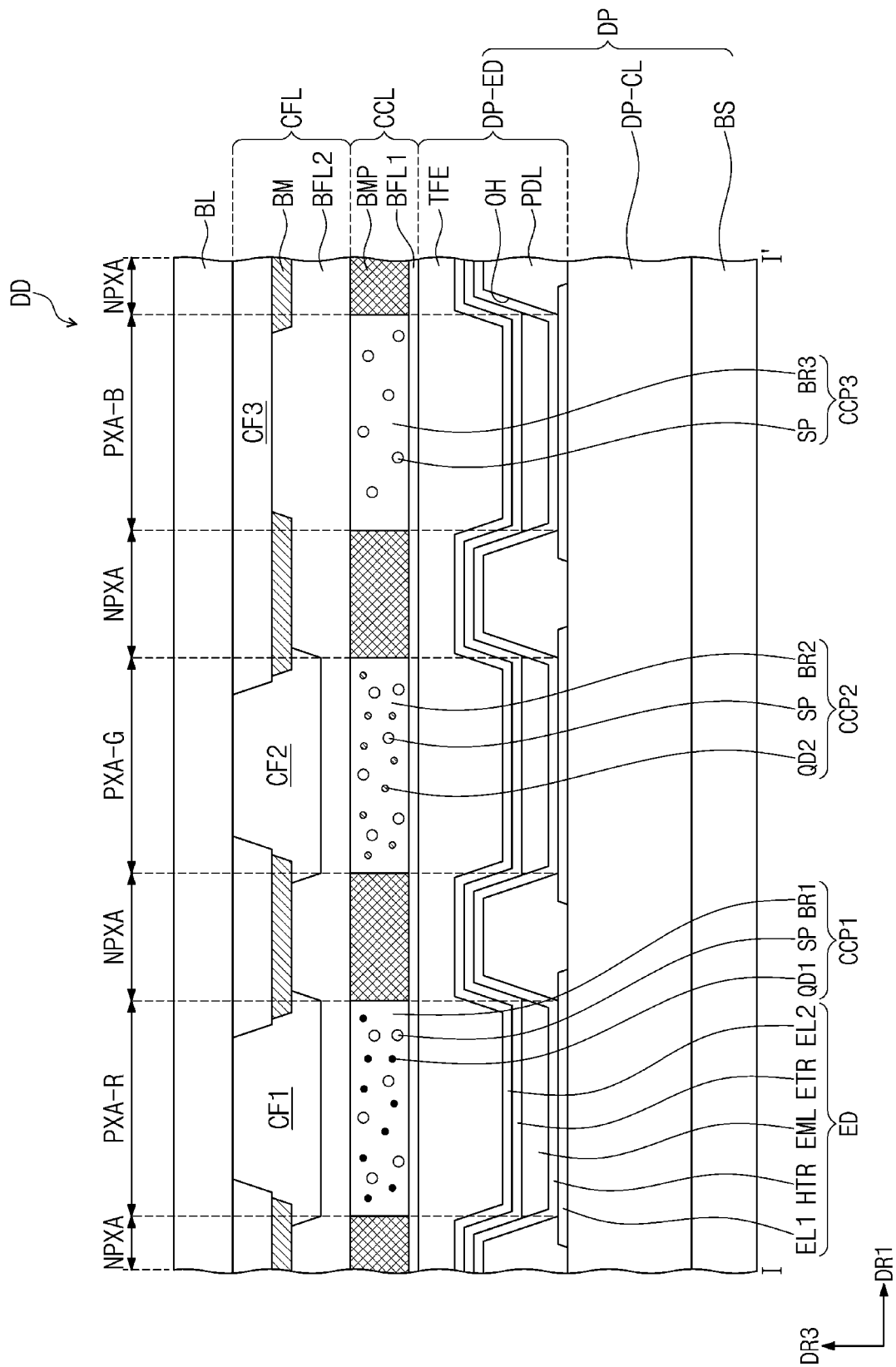
FIG. 7 is a schematic cross-sectional view showing a display apparatus according to an embodiment.
Figure 8:
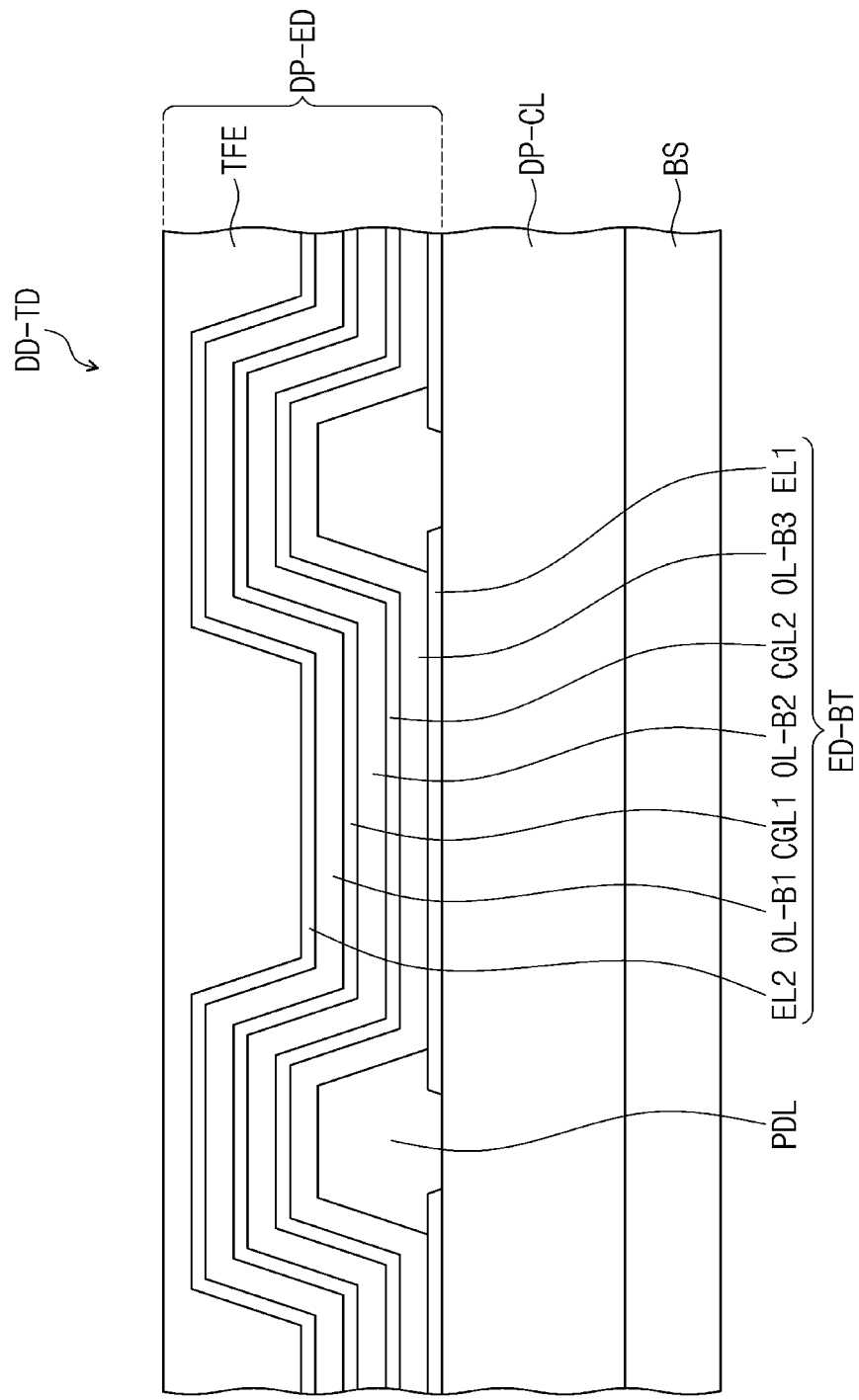
FIG. 8 is a schematic cross-sectional view showing a display apparatus according to an embodiment.

FIG. 7 and FIG. 8 are schematic cross-sectional views of display apparatuses according to embodiments. In the explanation on the display apparatuses of embodiments, referring to FIG. 7 and FIG. 8, the overlapping parts with the explanation on FIG. 1 to FIG. 6 will not be explained again, and the different features will be explained.

Referring to FIG. 7, the display apparatus DD according to an embodiment may include a display panel DP including a display device layer DP-ED, a light controlling layer CCL disposed on the display panel DP and a color filter layer CFL.

In an embodiment shown in FIG. 7, the display panel DP includes a base layer BS, a circuit layer DP-CL provided on the base layer BS and a display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In embodiments, same structure of the organic electroluminescence devices of FIG. 4 to FIG. 6 may be applied to the structure of the organic electroluminescence device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of emission areas PXA-R, PXA-G, and PXA-B may emit light in the same wavelength region. In the display apparatus DD of an embodiment, the emission layer EML may emit blue light. In contrast to the drawings, in an embodiment, the emission layer EML may be provided as a common layer for all emission areas PXA-R, PXA-G and PXA-B.

The light controlling layer CCL may be disposed on the display panel DP. The light controlling layer CCL may include a light converter. The light converter may be a quantum dot or a phosphor. The light converter may transform the wavelength of light provided. For example, the light controlling layer CCL may be a layer including a quantum dot or a layer including a phosphor.

The light controlling layer CCL may include multiple light controlling parts CCP1, CCP2, and CCP3. The light controlling parts CCP1, CCP2, and CCP3 may be separated from one another.

Referring to FIG. 7, partition pattern BMP may be disposed between the separated light controlling parts CCP1, CCP2, and CCP3, but an embodiment of the inventive concept is not limited thereto. In FIG. 7, the partition pattern BMP is shown not to be overlapped with the light controlling parts CCP1, CCP2 and CCP3, but at least a portion of the edge of the light controlling parts CCP1, CCP2 and CCP3 may be overlapped with the partition pattern BMP.

The light controlling layer CCL may include a first light controlling part CCP1 including a first quantum dot QD1 converting first color light provided from the organic electroluminescence device ED into second color light, a second light controlling part CCP2 including a second quantum dot QD2 converting first color light into third color light, and a third light controlling part CCP3 transmitting first color light.

In an embodiment, the first light controlling part CCP1 provides red light which is the second color light, and the second light controlling part CCP2 may provide green light which is the third color light. The third color controlling part CCP3 may transmit and provide blue light which is the first color light provided from the organic electroluminescence device ED. For example, the first quantum dot QD1 may be a red quantum dot, and the second quantum dot QD2 may be a green quantum dot.

The quantum dots QD1 and QD2 are materials having a crystal structure having a size of a few nanometers, are composed of about hundreds to thousands of atoms, and show quantum confinement effects increasing an energy band gap due to a small size. If light having a wavelength with higher energy than the band gap is incident to the quantum dots QD1 and QD2, the quantum dots QD1 and QD2 absorb to be an excited state and fall to a ground state while emitting light of a specific wavelength. The light of an emitted wavelength has a value corresponding to the band gap. If the size and composition of the quantum dots QD1 and QD2 are controlled, light-emitting properties by the quantum confinement may be controlled. The quantum dots QD1 and QD2 may be selected from compounds in II-VI groups, compounds in III-V groups, compounds in IV-VI groups, elements of IV group, compounds of IV group, compounds in I-III-VI groups, and combinations thereof. If the quantum dots QD1 and QD2 are binary compounds, ternary compounds, or quaternary compounds, each element may be present in uniform concentration in a particle, or in a state with partially different concentration distribution in the same particle. The quantum dots QD1 and QD2 may have a core/shell structure in which one quantum dot surrounds the other quantum dot. The interface of a core and a shell may have concentration gradient with the decreasing concentration of an element present in the shell toward the center.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one among $TiO_2$, $ZnO$, $Al_2O_3$, $SiO_2$, and hollow silica. The scatterer SP may include at least one among $TiO_2$, $ZnO$, $Al_2O_3$, $SiO_2$, and hollow silica, or may be a mixture of two or more materials selected among $TiO_2$, $ZnO$, $Al_2O_3$, $SiO_2$, and hollow silica.

Each of the first light controlling part CCP1, the second light controlling part CCP2, and the third light controlling part CCP3 may include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 are mediums in which the quantum dots QD1 and QD2 and the scatterer SP are dispersed, and may be composed of various resin compositions which may be generally referred to as a binder. For example, the base resins BR1, BR2, and BR3 may be acrylic resins, urethane-based resins, silicone-based resins, epoxy-based resins, etc. The base resins BR1, BR2, and BR3 may be transparent resins. In an embodiment, the first base resin BR1, the second base resin BR2 and the third base resin BR3 may be the same or different from each other.

The light controlling layer CCL may include a barrier layer BFL1. The barrier layer BFL1 may play the role of blocking the penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. The barrier layer BFL2 may be provided between the light controlling parts CCP1, CCP2, and CCP3 and a color filter layer CFL.

Barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a metal thin film securing light transmittance. The barrier layers BFL1 and BFL2 may further include an organic layer. The barrier layers BFL1 and BFL2 may be composed of a single layer or of multiple layers.

In the display apparatus DD of an embodiment, the color filter layer CFL may be disposed on the light controlling layer CCL. For example, the color filter layer CFL may be disposed directly on the light controlling layer CCL. In an embodiment, the barrier layer BFL2 may be omitted.

The color filter layer CFL may include a light blocking part BM and filters CF1, CF2, and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. An embodiment of the inventive concept is not limited thereto, and the third filter CF3 may not include the pigment or dye. The third filter CF3 may include a polymer photosensitive resin and not include a pigment or dye. The third filter CF3 may be transparent. The third filter CF3 may be formed using a transparent photosensitive resin.

In an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent light leakage phenomenon and define the boundaries among adjacent filters CF1, CF2, and CF3. In an embodiment, the light blocking part BM may be formed as a blue filter.

Each of the first to third filters CF1, CF2, and CF3 may be disposed corresponding to each of a red emission area PXA-R, green emission area PXA-G, and blue emission area PXA-B.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, an embodiment of the inventive concept is not limited thereto, and the base substrate BL may be an inorganic layer, an organic layer, or a composite material layer. In contrast to the drawing, the base substrate BL of an embodiment may be omitted.

FIG. 8 is a schematic cross-sectional view showing a portion of the display apparatus according to an embodiment. In FIG. 8, the schematic cross-sectional view of a portion corresponding to the display panel DP in FIG. 7 is shown. In a display apparatus DD-TD of an embodiment, the organic electroluminescence device ED-BT may include multiple light-emitting structures OL-B1, OL-B2, and OL-B3. The organic electroluminescence device ED-BT may include oppositely disposed first electrode EL1 and second electrode EL2, and the multiple light-emitting structures OL-B1, OL-B2, and OL-B3 stacked in order in a thickness direction and provided between the first electrode EL1 and the second electrode EL2. Each of the light-emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the organic electroluminescence device ED-BT included in the display apparatus DD-TD of an embodiment may be an organic electroluminescence device of a tandem structure including multiple emission layers.

In an embodiment shown in FIG. 8, light emitted from the light-emitting structures OL-B1, OL-B2, and OL-B3 may be all blue light. However, an embodiment of the inventive concept is not limited thereto, and the wavelength regions of light emitted from the light-emitting structures OL-B1, OL-B2, and OL-B3 may be different from each other. For example, the organic electroluminescence device ED-BT including the multiple light-emitting structures OL-B1, OL-B2, and OL-B3 emitting light in different wavelength regions may emit white light.

Between neighboring light-emitting structures OL-B1, OL-B2, and OL-B3, charge generating layers CGL1 and CGL2 may be disposed. The charge generating layers CGL1 and CGL2 may include a p-type charge generating layer and/or an n-type charge generating layer.

Hereinafter, the compound according to an embodiment and the organic electroluminescence device of an embodiment of the inventive concept will be explained referring to embodiments and comparative embodiments. The following embodiments are only illustrations to assist the understanding of the inventive concept, and the scope of the inventive concept is not limited thereto.

EXAMPLES

1. Synthesis of Polycyclic Compound of an Embodiment

First, the synthesis method of the polycyclic compound according to the embodiments will be explained to illustrate the synthesis methods of Compounds 2, 11, 31, 33, 102, 103, 140, and 269. The synthesis methods of the polycyclic compounds explained hereinafter are embodiments, and the synthesis method of the compound according to an embodiment of the inventive concept is not limited to the following embodiments.

(1) Synthesis of Compound 2

Compound 2 according to an embodiment may be synthesized by Reaction 1 below.

[Reaction 1]

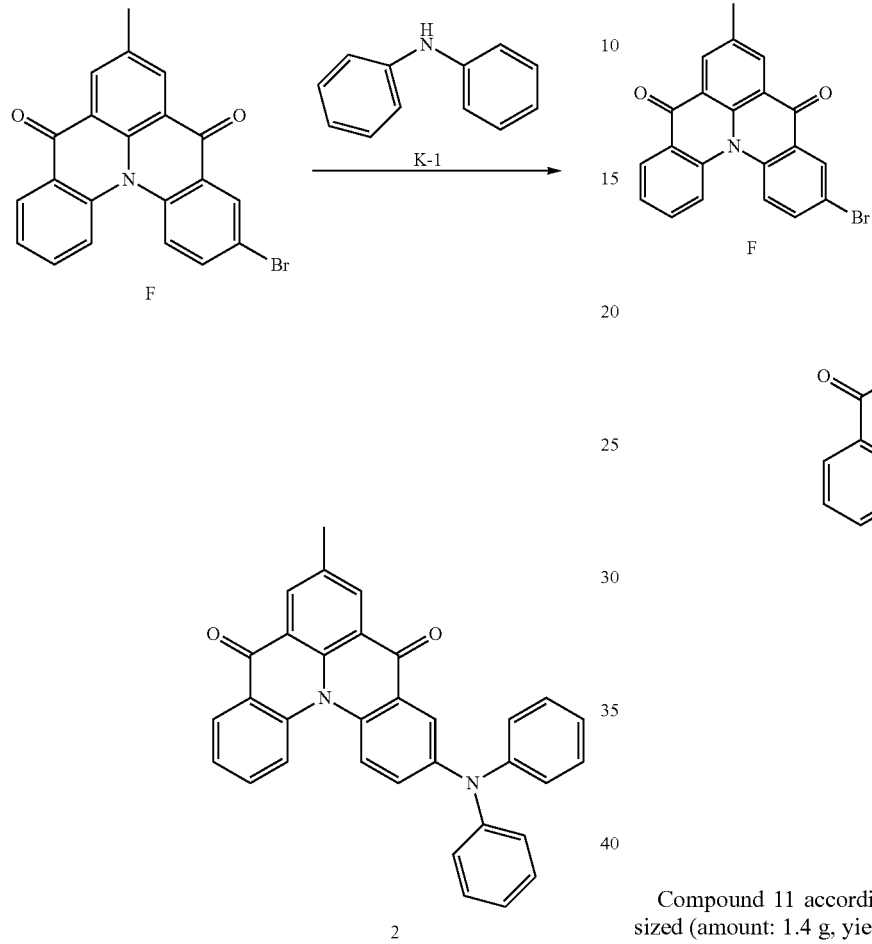

Reactant F was synthesized referring to a patent document (CN 109456326 A). Hereinafter, reagents were purchased and used without additional purification, unless otherwise described. To a 1,000 mL, three-neck flask, under an argon atmosphere, Reaction F (3.9 g), Reactant K-1 (2.0 g), Pd(dba)$_2$ (0.05 g), SPhos (0.04 g), and NaOtBu (1.3 g) were dissolved in toluene (200 mL), followed by heating and refluxing for about 3 hours. After cooling to room temperature, water was added, the resultant product was extracted with CH$_2$Cl$_2$, organic layers were collected and dried with MgSO$_4$, and solvents were removed by distillation under a reduced pressure. The product thus obtained was separated by silica gel column chromatography to obtain Compound 2 (amount: 1.1 g, yield 24%). As a result of analyzing Compound 2 by FAB-MS, a mass number was 478.

(2) Synthesis of Compound 11

Compound 11 according to an embodiment may be synthesized by Reaction 2 below.

[Reaction 2]

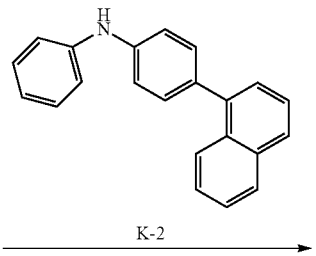

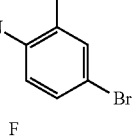

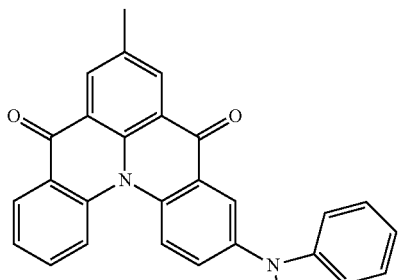

Compound 11 according to an embodiment was synthesized (amount: 1.4 g, yield 23%) by the same method as the synthesis method of Compound 2 except for using Reactant K-2 instead of Reactant K-1.

(3) Synthesis of Compound 31

Compound 31 according to an embodiment may be synthesized by Reaction 3 below.

[Reaction 3]

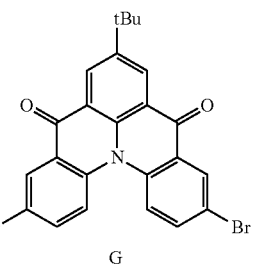

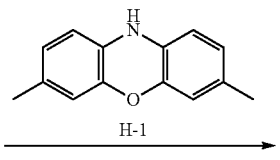

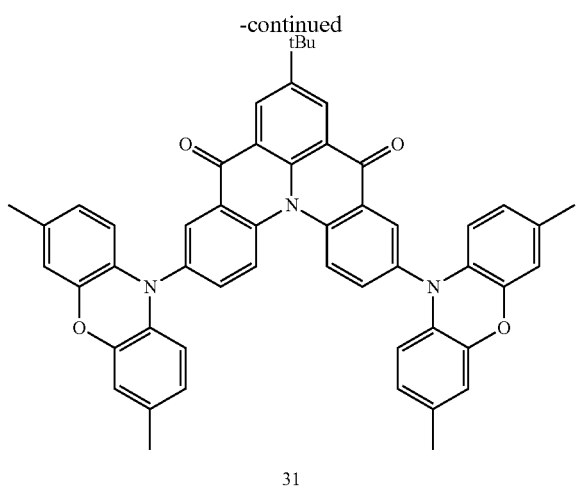

31

Reactant G was synthesized referring to a document (Adv. Optical Mater. 2019, 1801536). To a 1,000 mL, three-neck flask, under an argon atmosphere, Reactant G (5.1 g), Reactant H-1 (4.9 g), Pd(dba)$_2$ (0.11 g), SPhos (0.08 g), and NaOtBu (2.6 g) were dissolved in toluene (500 mL), followed by heating and refluxing for about 3 hours. After cooling to room temperature, water was added, the resultant product was extracted with CH$_2$Cl$_2$, organic layers were collected and dried with MgSO$_4$, and solvents were removed by distillation under a reduced pressure. The product thus obtained was separated by silica gel column chromatography to obtain Compound 31 (amount: 2.1 g, yield 27%). As a result of analyzing Compound 31 by FAB-MS, a mass number was 771.

(4) Synthesis of Compound 33

Compound 33 according to an embodiment may be synthesized by Reaction 4 below.

[Reaction 4]

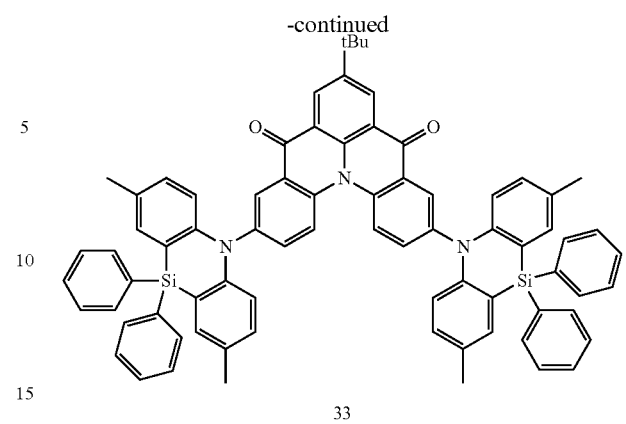

33

Compound 33 was synthesized (amount: 1.4 g, yield 23%) by the same method as the synthesis method of Compound 31 except for using Reactant H-2 instead of Reactant H-1. As a result of analyzing Compound 33 by FAB-MS, a mass number was 1103.

(5) Synthesis of Compound 102

Compound 102 according to an embodiment may be synthesized by Reaction 5 below.

[Reaction 5]

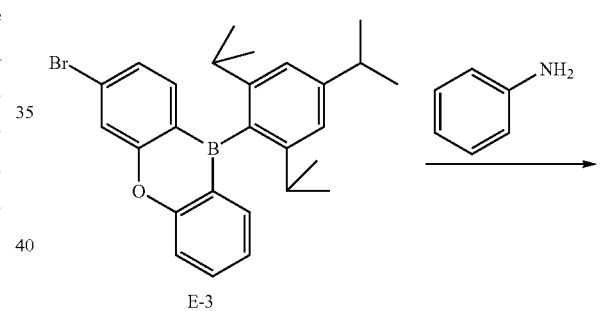

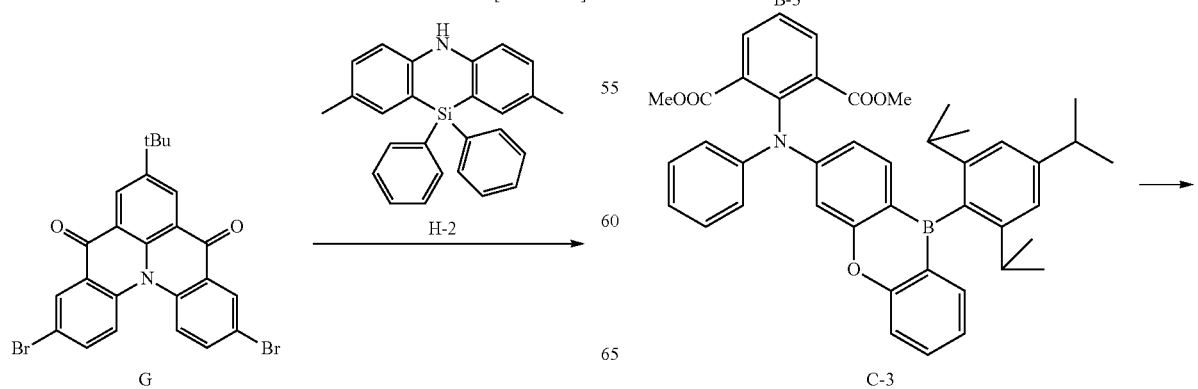

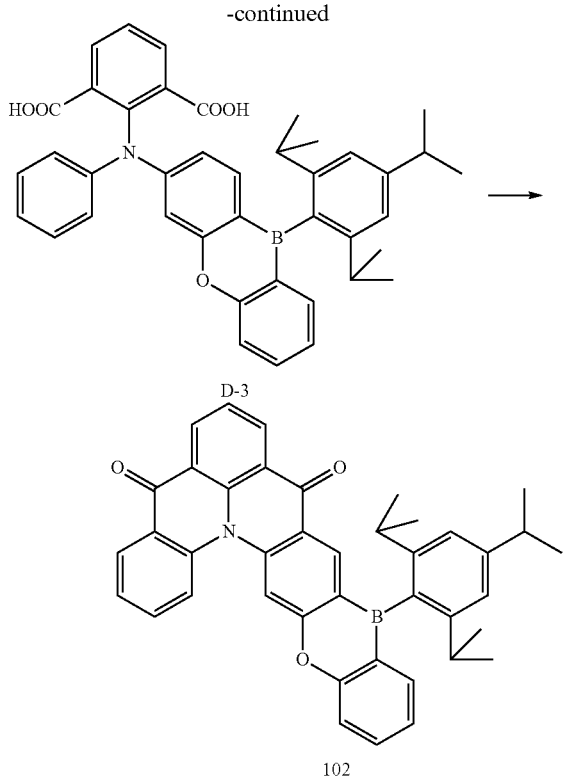

D-3

102

<Synthesis of Intermediate B-3>

Reactant E-3 which is an oxaborinine derivative was synthesized referring to a document (*Chem. Commun.* 2015, 51, 9443-9446). To a 1,000 mL, three-neck flask, under an argon atmosphere, Reactant E-3 (20.0 g), PhNH$_2$ (9.1 g), Pd(dba)$_2$ (0.11 g), SPhos (0.08 g), and NaOtBu (1.9 g) were dissolved in toluene (250 mL), followed by heating and refluxing for about 3 hours. After cooling to room temperature, water was added, the resultant produce was extracted with CH$_2$Cl$_2$, organic layers were collected and dried with MgSO$_4$, and solvents were removed by distillation under a reduced pressure. The product thus obtained was separated by silica gel column chromatography to obtain Intermediate B-3 (amount: 16.2 g, yield: 79%). As a result of analyzing Intermediate B-3 by FAB-MS, a mass number was 473.

<Synthesis of Intermediate C-3>

Under an argon atmosphere, to a 1,000 mL three-neck flask, dimethyl 2-iodoisophthalate A (9.6 g) and Intermediate B-3 (15.1 g) were dissolved in 1,2-dichlorobenzene (200 mL), and potassium carbonate (5.0 g) and copper powder (0.38 g) were added thereto, followed by heating and stirring at about 180° C. for about 48 hours. After cooling to room temperature, the reaction solution was filtered, and the resultant solvents were removed by distillation under a reduced pressure to obtain a crude product of Intermediate C-3. The crude product thus obtained was separated by silica gel column chromatography (eluent: hexane/dichloromethane=1/1) to obtain Intermediate C-3 (amount: 6.7 g, yield: 33%). As a result of analyzing Intermediate C-3 by FAB-MS, the mass number of a target material was 665.

<Synthesis of Intermediate D-3>

To a 1,000 mL, three-neck flask, Intermediate C-3 (6.6 g) and NaOH (2.0 g) were mixed in a solvent of ethanol/water (100 mL/50 mL) and heated and refluxed for about 10 hours. After cooling the reaction solution to room temperature, an aqueous solution of hydrochloric acid (1 mol/L) was added until the reaction solution was acidized, and precipitated Intermediate D-3 (amount: 4.4 g, yield 69%) was filtered and obtained. As a result of analyzing the target material by FAB-MS, the mass number of Intermediate D-3 was 498.

<Synthesis of Compound 102>

To a 500 mL, three-neck flask, Intermediate D-3 (2.5 g), dichloromethane (40 mL), N,N-dimethylformamide (6 µL), and oxalyl chloride (0.75 mL) were added, and heated and refluxed for about 30 minutes. Tin(IV) chloride (1.0 mL) was added, and additionally heated and refluxed for about 4 hours. The reaction solution thus obtained was added dropwise to an aqueous solution of NaOH (1 mol/L, 100 mL), and an organic layer was extracted with CH$_2$Cl$_2$. The dichloromethane solution thus obtained was dried with MgSO$_4$, and solvents were removed by distillation under a reduced pressure. The crude product thus obtained was separated by silica gel column chromatography (eluent: hexane/dichloromethane=¼) to obtain Compound 102 (amount: 1.5 g, yield 62%). As a result of analyzing the target material by FAB-MS, the mass number of Compound 102 was 601.

(6) Synthesis of Compound 103

Compound 103 according to an embodiment may be synthesized by Reaction 6 below.

[Reaction 6]

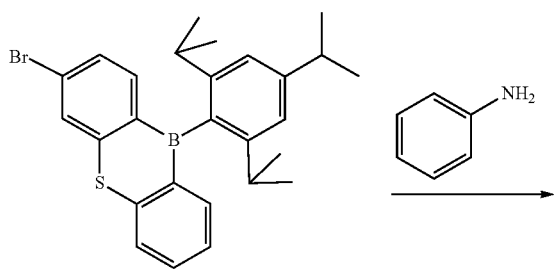

E-4

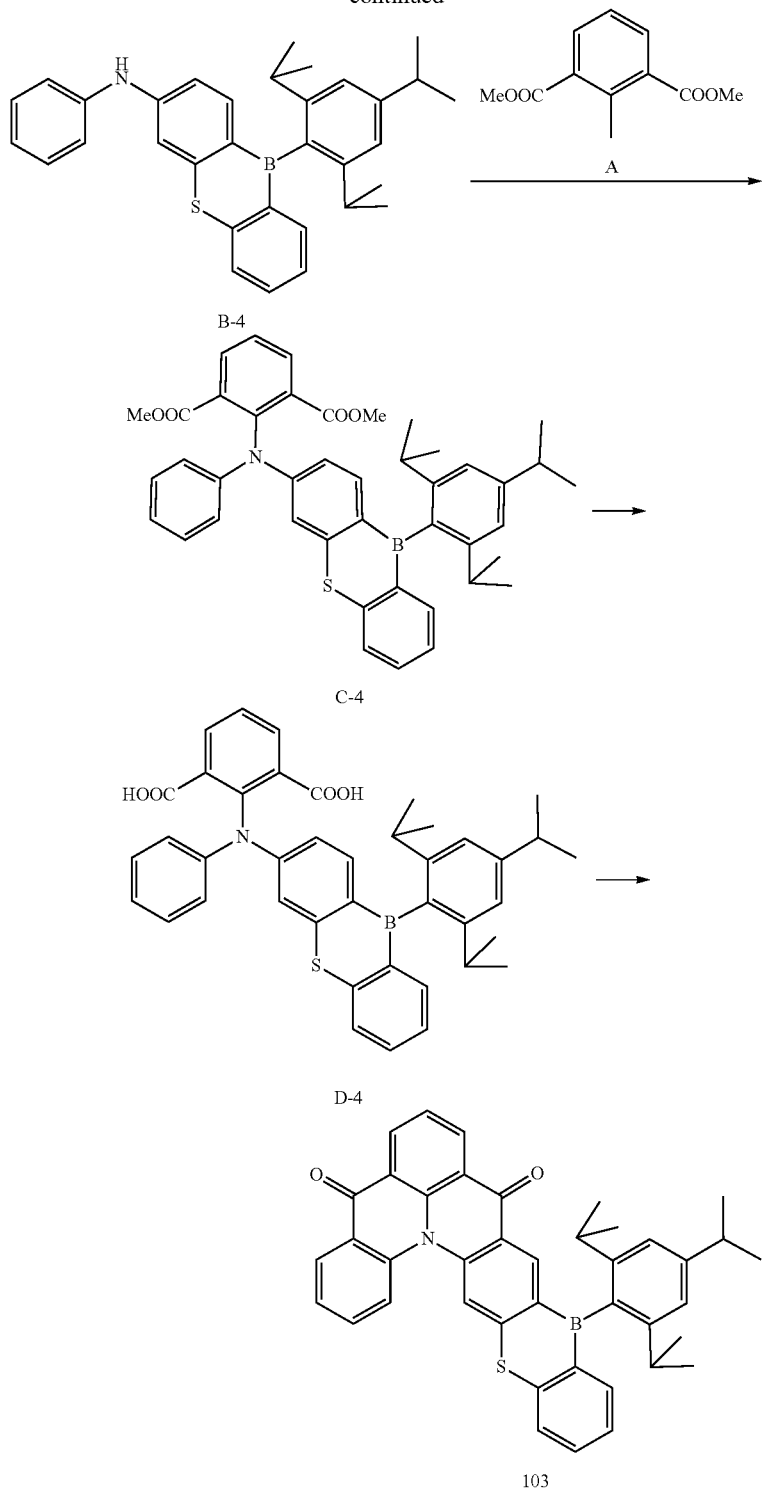

<Synthesis of Intermediate B-4>

Reactant E-4 which is a thiaborinine derivative was synthesized referring to a document (*Adv. Funct. Mater.* 2018, 28, 1802031). Intermediate B-4 was synthesized (amount: 11.4 g, yield 54%) by the same method as the synthesis method of Intermediate B-3 except for using Reactant E-4 instead of Reactant E-3. As a result of analyzing Intermediate B-4 by FAB-MS, the mass number was 489.

<Synthesis of Intermediate C-4>

Intermediate C-4 was synthesized (amount: 6.2 g, yield 28%) by the same method as the synthesis method of Intermediate C-3 except for using Intermediate B-4 instead of Intermediate B-3. As a result of analyzing Intermediate C-4 by FAB-MS, a mass number was 681.

<Synthesis of Intermediate D-4>

Intermediate D-4 was synthesized (amount: 5.2 g, yield 80%) by the same method as the synthesis method of Intermediate D-3 except for using Intermediate C-4 instead of Intermediate C-3. As a result of analyzing Intermediate D-4 by FAB-MS, a mass number was 462.

<Synthesis of Compound 103>

Compound 103 was synthesized (amount: 1.6 g, yield 65%) by the same method as the synthesis method of Compound 102 except for using Intermediate D-4 instead of Intermediate D-3. As a result of analyzing Compound 103 by FAB-MS, a mass number was 617.

(7) Synthesis of Compound 140

Compound 140 according to an embodiment may be synthesized by Reaction 7 below.

[Reaction 7]

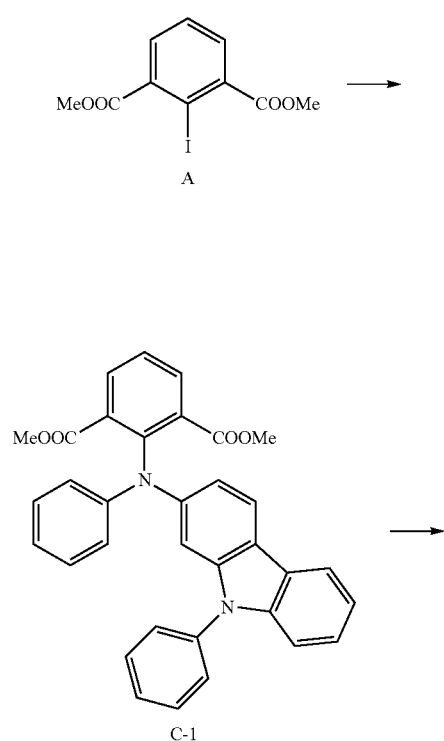

B-1

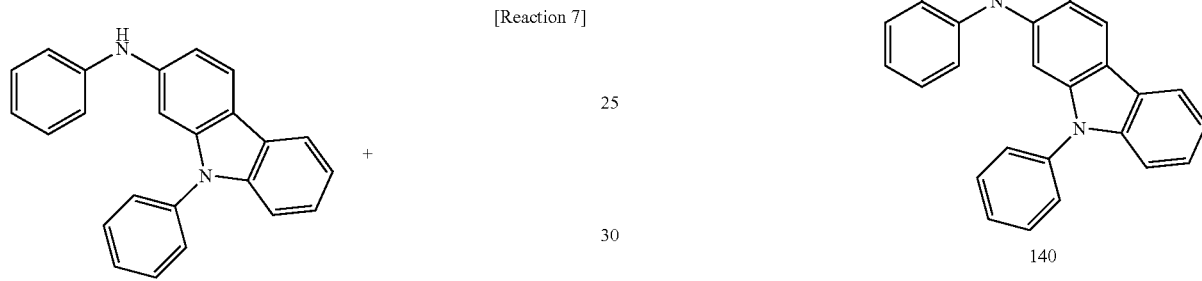

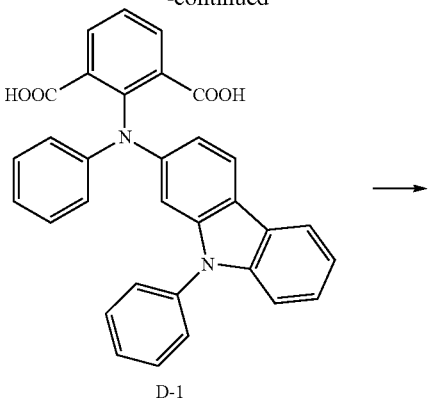

D-1

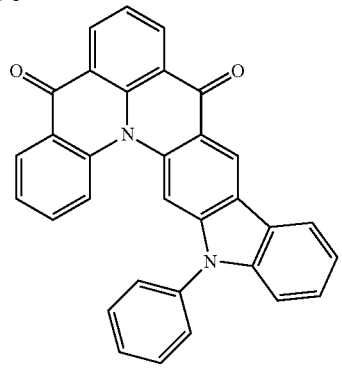

140

<Synthesis of Intermediate C-1>

Reactant B-1 which is an amine derivative was synthesized referring to a document (*J. Chem. Soc., Perkin Trans.* 1 2001, 22, 3064-3068). Under an argon atmosphere, to a 1,000 mL, three-neck flask, dimethyl 2-iodoisophthalate A (19 g) and Reactant B-1 (22 g) were dissolved in 1,2-dichlorobenzene (400 mL), and potassium carbonate (10 g) and copper powder (0.76 g) were added thereto, followed by heating and stirring at about 180° C. for about 48 hours. After cooling to room temperature, the reaction solution was filtered, and the resultant solvents were removed by distillation under a reduced pressure to obtain a crude product of Intermediate C-1. The crude product thus obtained was separated by silica gel column chromatography (eluent: hexane/dichloromethane=1/1) to obtain Intermediate C-1 (amount: 14 g, yield: 45%). As a result of analyzing Intermediate C-1 by FAB-MS, the mass number of a target material was 526.

<Synthesis of Intermediate D-1>

To a 1,000 mL, three-neck flask, Intermediate C-1 (10.5 g) and NaOH (4.0 g) were mixed in a solvent of ethanol/water (199 mL/100 mL), and heated and refluxed for about 10 hours. After cooling the reaction solution to room temperature, an aqueous solution of hydrochloric acid (6 mol/L) was added until the reaction solution was acidized, and precipitated Intermediate D-1 (amount: 6.4 g, yield 61%) was filtered and obtained. As a result of analyzing the target material by FAB-MS, the mass number of Intermediate D-1 was 498.

<Synthesis of Compound 140>

To a 500 mL, three-neck flask, Intermediate D-1 (2.67 g), dichloromethane (160 mL), N,N-dimethylformamide (30 µL), and oxalyl chloride (3.0 mL) were added, and heated and refluxed for about 30 minutes. Tin(IV) chloride (4.0 mL)

was added, and additionally heated and refluxed for about 4 hours. The reaction solution thus obtained was added dropwise to an aqueous solution of NaOH (1 mol/L, 300 mL), and an organic layer was extracted with $CH_2Cl_2$. The dichloromethane solution thus obtained was dried with $MgSO_4$, and solvents were removed by distillation under a reduced pressure. The crude product thus obtained was separated by silica gel column chromatography (eluent: hexane/dichloromethane=¼) to obtain Compound 140 (amount: 2.5 g, yield 34%). As a result of analyzing the target material by FAB-MS, the mass number of Compound 140 was 462.

(8) Synthesis of Compound 269

Compound 269 according to an embodiment may be synthesized by Reaction 8 below.

[Reaction 8]

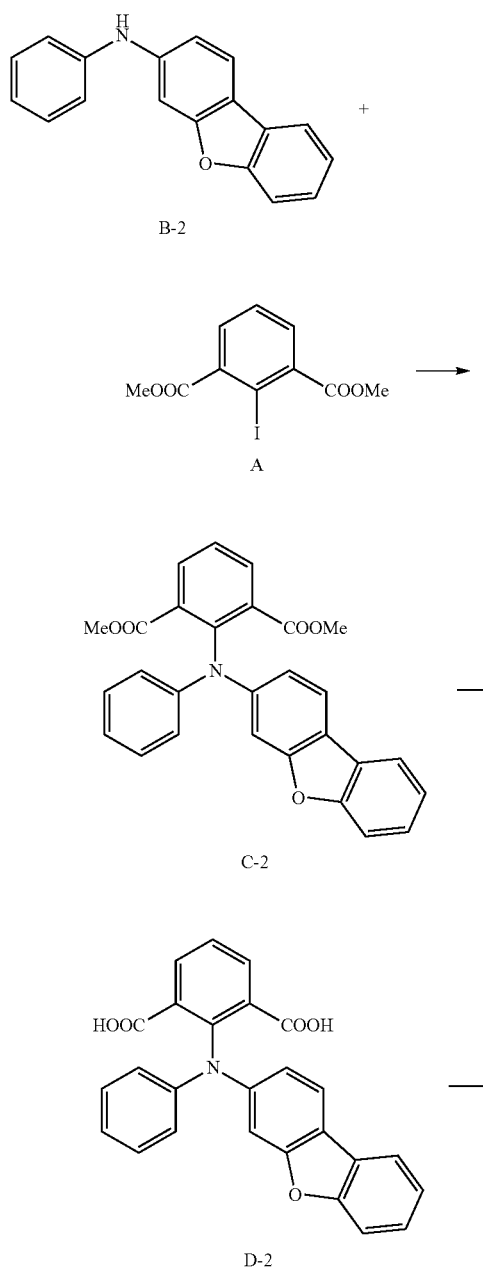

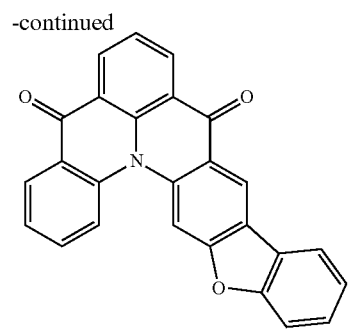

269

<Synthesis of Intermediate C-2>

Intermediate C-2 was synthesized (amount: 12 g, yield 46%) by the same method as the synthesis method of Intermediate C-1 except for using Reactant B-2 instead of Reactant B-1. As a result of analyzing Intermediate C-2 by FAB-MS, a mass number was 451.

<Synthesis of Intermediate D-2>

Intermediate D-2 was synthesized (amount: 5.2 g, yield 56%) by the same method as the synthesis method of Intermediate D-1 except for using Intermediate C-2 instead of Intermediate C-1. As a result of analyzing Intermediate D-2 by FAB-MS, a mass number was 462.

<Synthesis of Compound 269>

Compound 269 was synthesized (amount: 1.9 g, yield 31%) by the same method as the synthesis method of Compound 140 except for using Intermediate D-2 instead of Intermediate D-1. As a result of analyzing Compound 269 by FAB-MS, a mass number was 387.

2. Manufacture of Organic Electroluminescence Device

On a glass substrate, ITO with a thickness of about 1,500 Å was patterned and washed with ultra-pure water, cleaned with ultrasonic waves, exposed to UV for about 30 minutes and treated with ozone. HAT-CN was deposited to a thickness of about 100 Å, α-NPD was deposited to about 800 Å, and mCP was deposited to a thickness of about 50 Å to form a hole transport region.

The polycyclic compound of an embodiment or the Comparative Compound and mCBP were co-deposited in a ratio of 1:99 to form a layer into a thickness of about 200 Å and to form an emission layer. The emission layer formed by the co-deposition was formed by mixing Compounds 2, 11, 31, 33, 102, 103, 140, and 169 with mCBP in Example 1 to Example 8, respectively, or Comparative Compounds X-1 and X-6 with mCBP in Comparative Example 1 to Comparative Example 6, respectively.

After that, on the emission layer, a layer with a thickness of about 300 Å was formed using TPBi, and a layer with a thickness of about 5 Å was formed using LiF to form an electron transport region. A second electrode with a thickness of about 1,000 Å was formed using aluminum (Al).

In the Examples, the hole transport region, the emission layer, the electron transport region, and the second electrode were formed using a vacuum deposition apparatus.

The compounds used in Examples 1 to 8, and Comparative Examples 1 to 6 are shown in Table 1.

TABLE 1
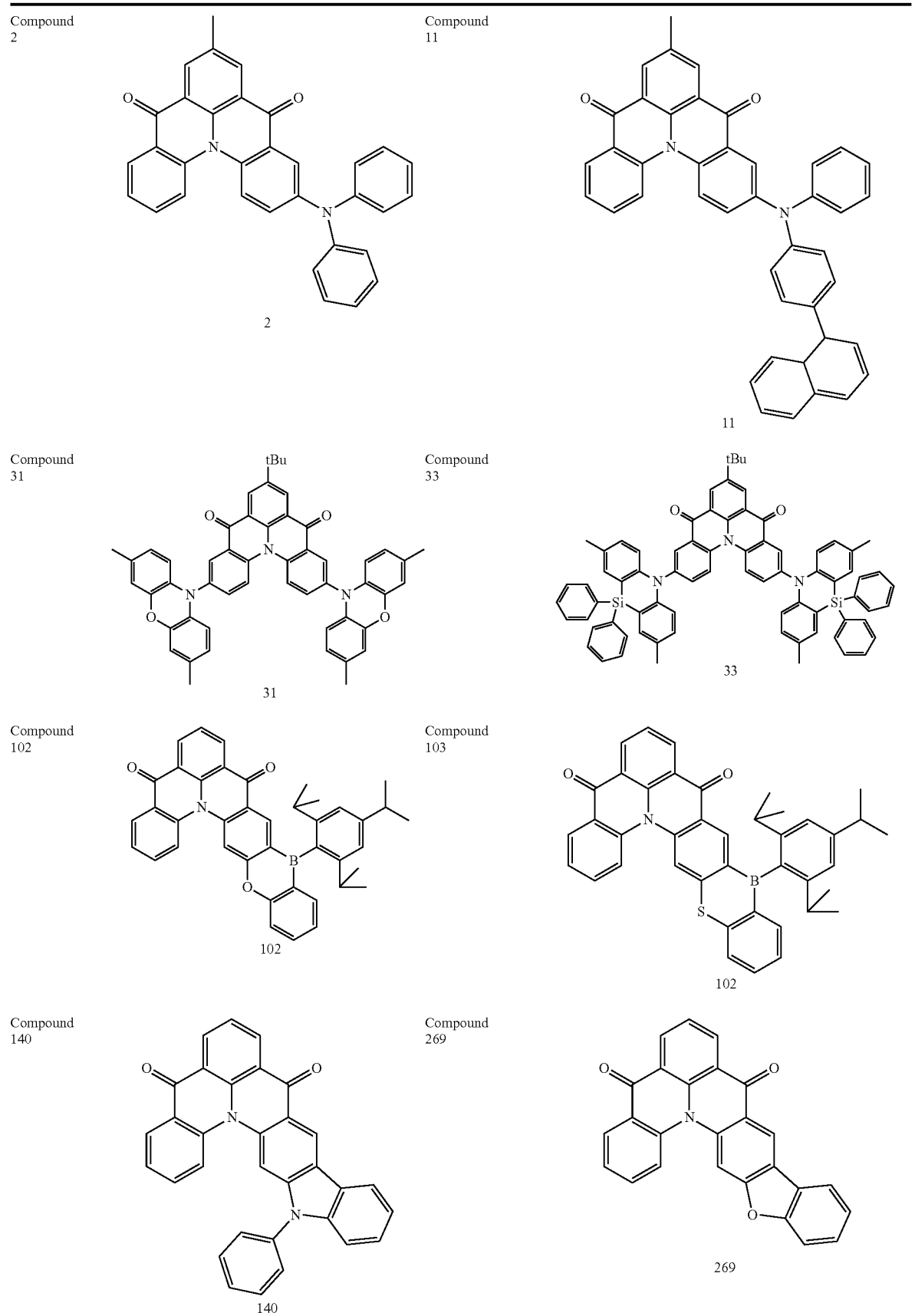

TABLE 1-continued

Comparative Compound X-1
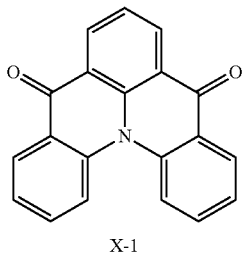
X-1

Comparative Compound X-2
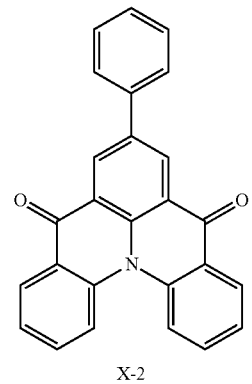
X-2

Comparative Compound X-3
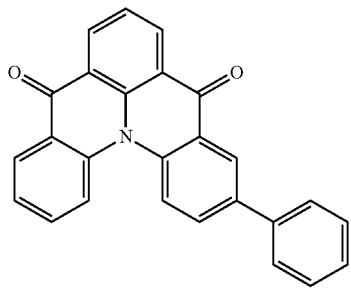
X-3

Comparative Compound X-4
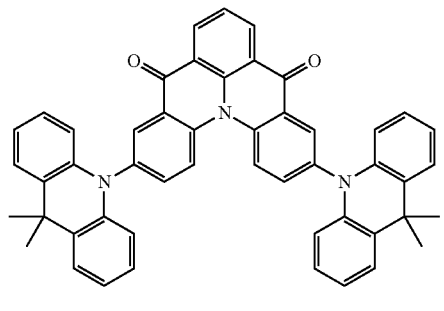
X-4

Comparative Compound X-5
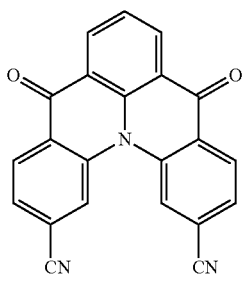
X-5

Comparative Compound X-6
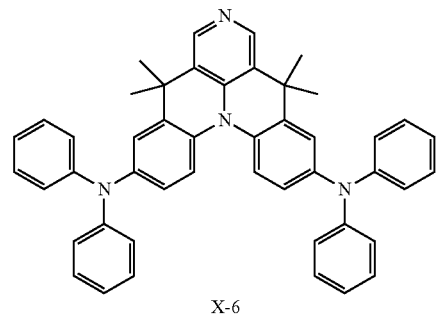 [SMILES: CC1(C)c2cc(N(c3ccccc3)c3ccccc3)ccc2N2c3ccc(N(c4ccccc4)c4ccccc4)cc3C(C)(C)c3cncc1c32 ; "X-6"]
X-6

3. Evaluation of Properties of Organic Electroluminescence Device

In Table 2, the evaluation results of organic electroluminescence devices of Example 1 to Example 8, Comparative Example 1 to Comparative Example 6 are shown. In Table 2, maximum emission wavelength ($\lambda_{max}$) and external quantum efficiency ($EQE_{max,\ 1000nit}$) in the organic electroluminescence devices thus manufactured are compared and shown. In the evaluation results for the Examples and the Comparative Examples, shown in Table 2, the maximum emission wavelength ($\lambda_{max}$) shows a wavelength showing the maximum value in emission spectrum and the external quantum efficiency ($EQE_{max,\ 1000nit}$) shows external quantum efficiency when a luminance shows 1,000 cd/m².

TABLE 2

| Division | Dopant material | $\lambda_{max}$ (nm) | $EQE_{max,\ 1000\ nit}$ (%) |
|---|---|---|---|
| Example 1 | Compound 2 | 463 | 11 |
| Example 2 | Compound 11 | 465 | 12 |
| Example 3 | Compound 31 | 472 | 12 |
| Example 4 | Compound 33 | 468 | 12 |
| Example 5 | Compound 102 | 472 | 13 |
| Example 6 | Compound 103 | 466 | 15 |
| Example 7 | Compound 140 | 475 | 14 |
| Example 8 | Compound 269 | 470 | 15 |
| Comparative Example 1 | Comparative Compound X-1 | 466 | 5 |
| Comparative Example 2 | Comparative Compound X-2 | 468 | 5 |
| Comparative Example 3 | Comparative Compound X-3 | 467 | 4 |
| Comparative Example 4 | Comparative Compound X-4 | 482 | 6 |
| Comparative Example 5 | Comparative Compound X-5 | 465 | 1 |
| Comparative Example 6 | Comparative Compound X-6 | 581 | 1 |

Referring to Table 2, it could be found that the organic electroluminescence devices of Example 1 to Example 8 emitted blue light. Different from the organic electroluminescence devices of Comparative Examples 1 to 5, it could be found that the organic electroluminescence device of Comparative Example 6 emitted red light. When compared with the organic electroluminescence devices of Comparative Examples 1 to 6, it could be confirmed that the organic electroluminescence devices of Examples 1 to 8 showed improved external quantum efficiency (EQE) at a luminance of 1,000 nit (=1,000 cd/m$^2$). It could be found that the organic electroluminescence device of an embodiment, including the polycyclic compound of an embodiment showed about 10% to about 20% of the external quantum efficiency at a luminance of 1000 nit (=1000 cd/m$^2$).

Example Compounds 2, 11, 31, and 33 include electron donors including a nitrogen atom, and the electron donor may contribute to the delocalization of multiple resonance in a polycyclic aromatic ring. Since the multiple resonance is delocalized in Example Compounds 2, 11, 31, and 33, it is thought that improved external quantum efficiency is shown in the organic electroluminescence devices of Examples 1 to 4.

The organic electroluminescence devices of Examples 5 to 8 are thought to show stronger delocalization properties of multiple resonance when compared with Comparative Examples 1 to 6 and Examples 1 to 4, because a cyclic group of five rings including a nitrogen atom and a carbonyl group and a ring group including an oxygen atom form a fused ring of seven rings.

It could be found that the organic electroluminescence devices of Comparative Example 4 and Comparative Example 5 showed smaller values of the external quantum efficiency at a luminance of 1000 nit. Due to the instability of quaternary carbon included in acridine which is a substituent included in Comparative Compound X-4, it is thought that the external quantum efficiency at a luminance of 1000 nit showed a small value. Since Comparative Compound X-5 includes a cyano group which is an electron withdrawing substituent, it is thought that the external quantum efficiency at a luminance of 1000 nit showed a small value.

The polycyclic compound of an embodiment may include an electron donor as a substituent in a ring group of five rings including a nitrogen atom as a ring-forming atom, or form a fused ring with a substituent connected with the ring group of five rings, and multiple resonance may be delocalized. Since the multiple resonance is delocalized in the polycyclic compound, improved emission efficiency may be shown.

The organic electroluminescence device of an embodiment includes the polycyclic compound of an embodiment in an emission layer, and excellent emission efficiency may be shown.

The organic electroluminescence device of an embodiment may show improved device properties of high efficiency in a blue wavelength region.

The polycyclic compound of an embodiment is included in the emission layer of an organic electroluminescence device, thereby contributing to the increase of efficiency of the organic electroluminescence device.

Although the embodiments of the invention have been described, it is understood that the invention should not be limited to these embodiments, but that various changes and modifications can be made by one of ordinary skill in the art within the spirit and scope of the invention as claimed.

Intermediate D-2 was synthesized (amount: 5.2 g, yield 56%) by the same method as the synthesis method of Intermediate D-1 except for using Intermediate C-2 instead of Intermediate C-1. As a result of analyzing Intermediate D-2 by FAB-MS, a mass number was 462.

<Synthesis of Compound 269>

Compound 269 was synthesized (amount: 1.9 g, yield 31%) by the same method as the synthesis method of Compound 140 except for using Intermediate D-2 instead of Intermediate D-1. As a result of analyzing Compound 269 by FAB-MS, a mass number was 387.

2. Manufacture of Organic Electroluminescence Device

On a glass substrate, ITO with a thickness of about 1,500 Å was patterned and washed with ultra-pure water, cleaned with ultrasonic waves, exposed to UV for about 30 minutes and treated with ozone. HAT-CN was deposited to a thickness of about 100 Å, α-NPD was deposited to about 800 Å, and mCP was deposited to a thickness of about 50 Å to form a hole transport region.

The polycyclic compound of an embodiment or the Comparative Compound and mCBP were co-deposited in a ratio of 1:99 to form a layer into a thickness of about 200 Å and to form an emission layer. The emission layer formed by the co-deposition was formed by mixing Compounds 2, 11, 31, 33, 102, 103, 140, and 169 with mCBP in Example 1 to Example 8, respectively, or Comparative Compounds X-1 and X-6 with mCBP in Comparative Example 1 to Comparative Example 6, respectively.

After that, on the emission layer, a layer with a thickness of about 300 Å was formed using TPBi, and a layer with a thickness of about 5 Å was formed using LiF to form an electron transport region. A second electrode with a thickness of about 1,000 Å was formed using aluminum (Al).

In the Examples, the hole transport region, the emission layer, the electron transport region, and the second electrode were formed using a vacuum deposition apparatus.

The compounds used in Examples 1 to 8, and Comparative Examples 1 to 6 are shown in Table 1.

What is claimed is:

1. An organic electroluminescence device, comprising:
a first electrode;
a second electrode disposed on the first electrode; and
an emission layer disposed between the first electrode and the second electrode and comprising a polycyclic compound represented by Formula 1:

[Formula 1]

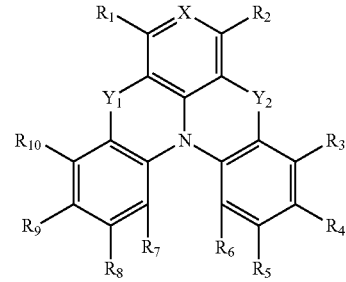

wherein in Formula 1,
X is N or —C(R$_{11}$),
Y$_1$ and Y$_2$ are each independently —C=O, —C=S, or —S=O, R$_1$ to R$_6$ are each independently a hydrogen atom, a deuterium atom, a halogen atom, a cyano group, a nitro group, a carbonyl group, a substituted or unsubstituted thio group, a substituted or unsubstituted amine group, a substituted or unsubstituted oxy group, a substituted or unsubstituted silyl group, a substituted or unsubstituted boryl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring,
provided that:
two adjacent groups among R$_1$, R$_2$ and R$_{11}$ are optionally combined to form a ring; or
two adjacent groups among R$_3$ to R$_6$ are optionally combined to form a ring,
R$_7$ to R$_{10}$ are each independently a hydrogen atom, a deuterium atom, a halogen atom, a cyano group, a nitro group, a carbonyl group, a substituted or unsubstituted thio group, a substituted or unsubstituted amine group, a substituted or unsubstituted oxy group, a substituted or unsubstituted silyl group, a substituted or unsubstituted boryl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms,
at least one of R$_1$ to R$_{11}$ is represented by Formula 2 or Formula 3, and
when at least one of R$_1$ to R$_{10}$ is represented by Formula 2, X is —C(R$_{11}$) and R$_{11}$ is a deuterium atom, a methyl group, an isopropyl group, a t-butyl group, a substituted amine group, or a substituted phenyl group, or combined with an adjacent group to form a ring:

[Formula 2]

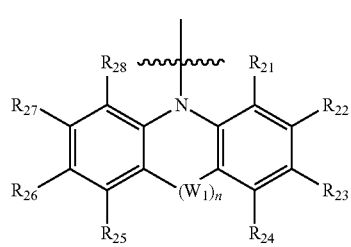

[Formula 3]

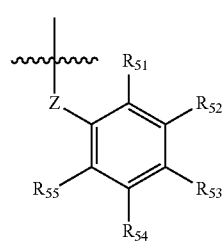

wherein in Formula 2,
n is 0 or 1,
W$_1$ is a direct linkage, —B(R$_{29}$), —C=O, O, S, —SO, —SO$_2$, —N(R$_{30}$), —P=O, —P(R$_{31}$), or —Si(R$_{32}$)(R$_{33}$),
wherein in Formula 3,
Z is —B(R$_{56}$), —C=O, O, S, —SO, —SO$_2$, —N(R$_{57}$), —P=O, —P(R$_{58}$), or —Si(R$_{59}$)(R$_{60}$), wherein in Formula 2 and Formula 3,
R$_{21}$ to R$_{33}$, and R$_{51}$ to R$_{60}$ are each independently a hydrogen atom, a deuterium atom, a halogen atom, a cyano group, a nitro group, a carbonyl group, a substituted or unsubstituted silyl group, a substituted or unsubstituted boryl group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group selected from R$_1$ to R$_6$, R$_{11}$, R$_{21}$ to R$_{33}$, and R$_{51}$ to R$_{60}$ to form a ring.

2. The organic electroluminescence device of claim 1, wherein Formula 1 is represented by one of Formula 1-A1 to Formula 1-A6:

[Formula 1-A1]

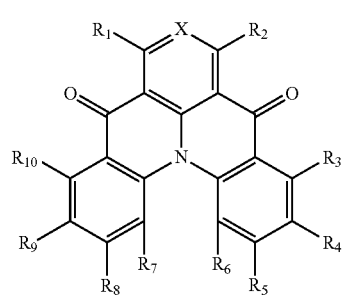

[Formula 1-A2]

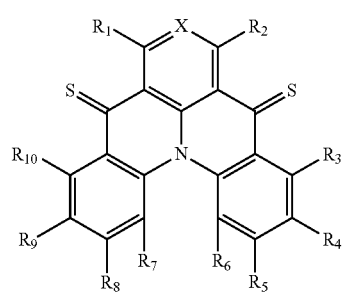

[Formula 1-A3]

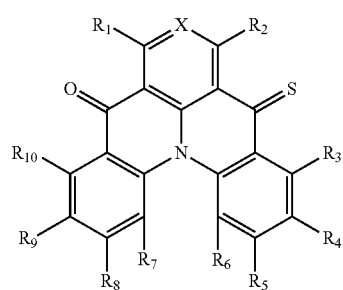

[Formula 1-A4]

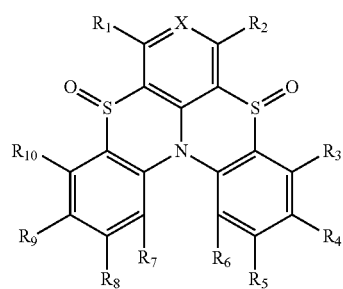

[Formula 1-A5]

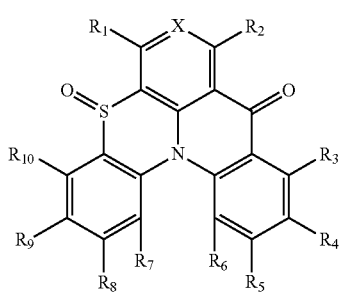

[Formula 1-A6]

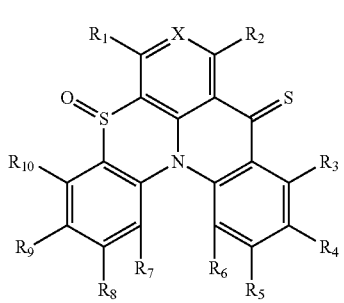

wherein in Formula 1-A1 to Formula 1-A6,
R₁ to R₁₁, and X are the same as defined in Formula 1.

3. The organic electroluminescence device of claim 1, wherein Formula 1 is represented by Formula 1-C:

[Formula 1-C]

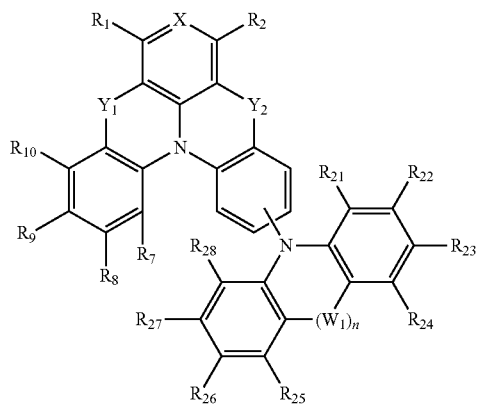

wherein in Formula 1-C,
$R_1$, $R_2$, $R_7$ to $R_{10}$, X, $Y_1$, $Y_2$, $R_{21}$ to $R_{28}$, n, and $W_1$ are the same as defined in Formula 1 and Formula 2.

4. The organic electroluminescence device of claim 1, wherein the organic electroluminescence device has an external quantum efficiency in a range of about 10% to about 20%, at a luminance of about 1,000 cd/m².

5. The organic electroluminescence device of claim 1, wherein the emission layer emits delayed fluorescence.

6. The organic electroluminescence device of claim 1, wherein the emission layer comprises at least one polycyclic compound selected from Compound Group 1:

[Compound Group 1]

1

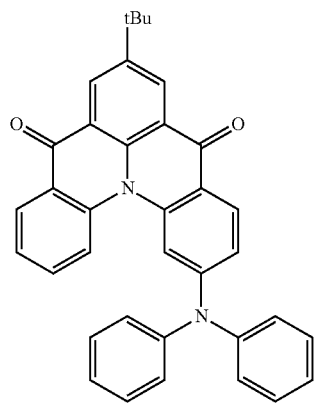

2

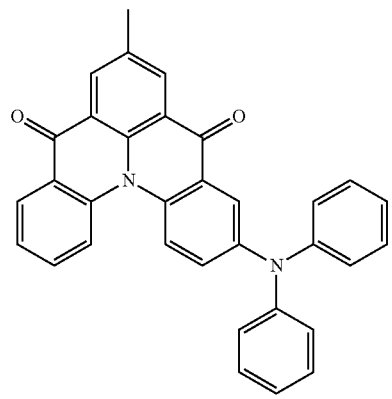

3

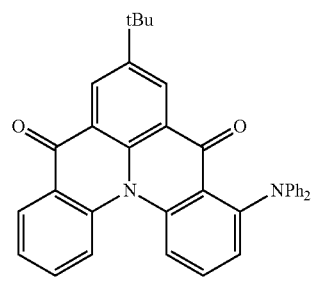

4

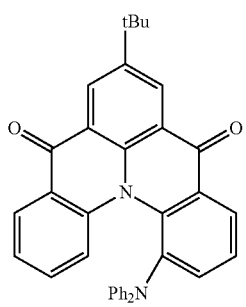

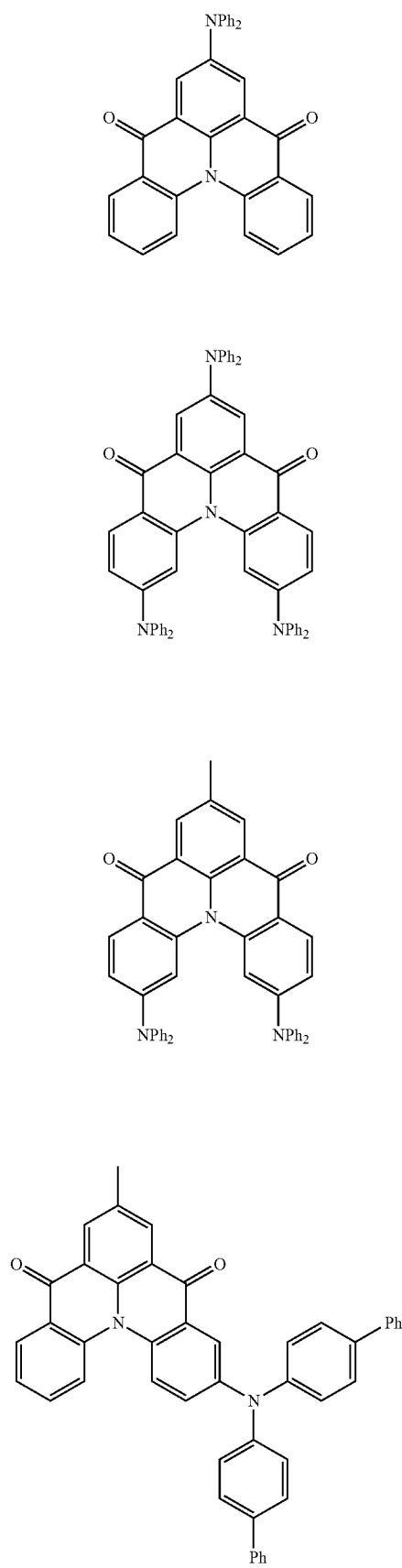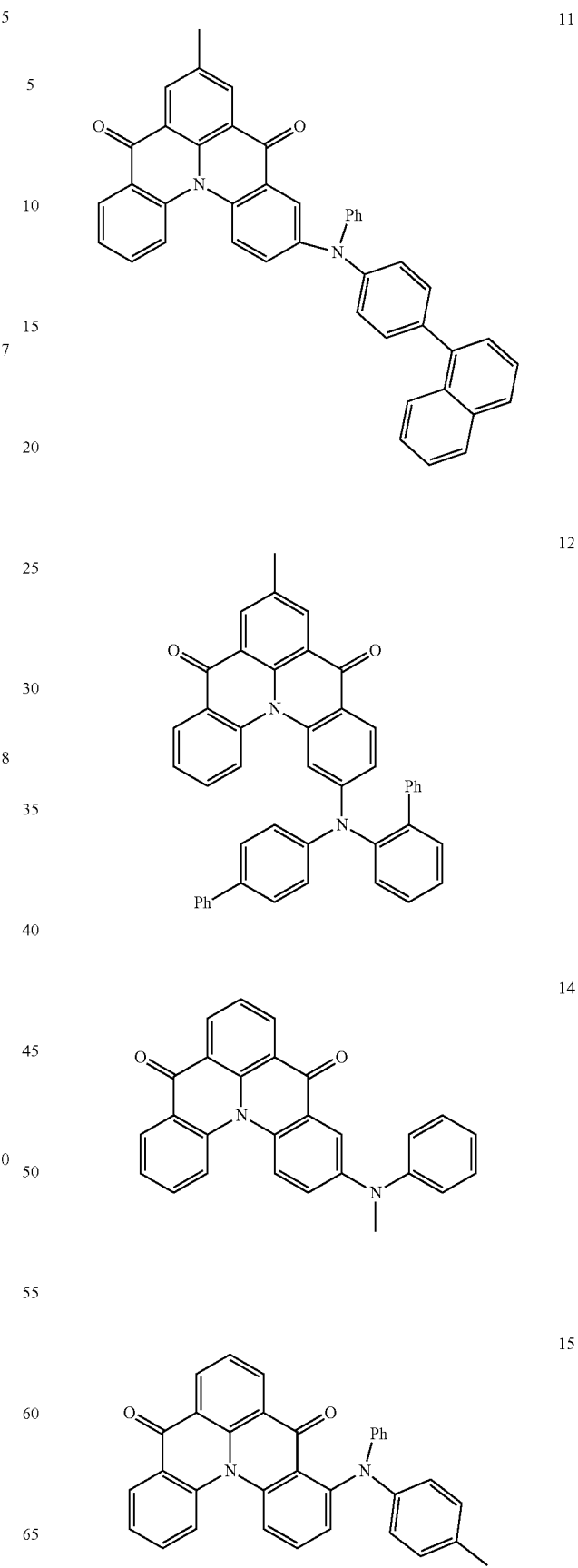

16
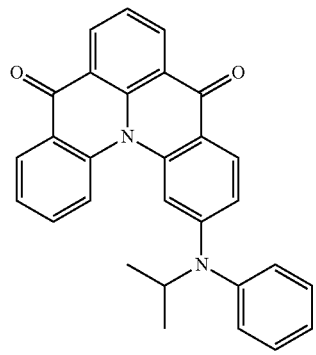
19
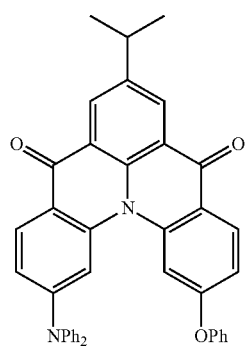
22
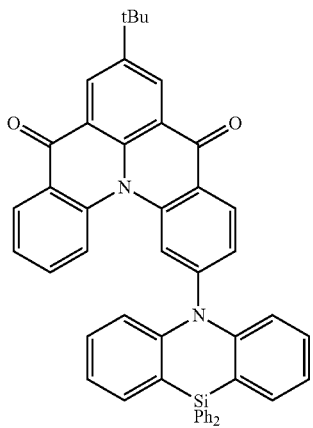
23
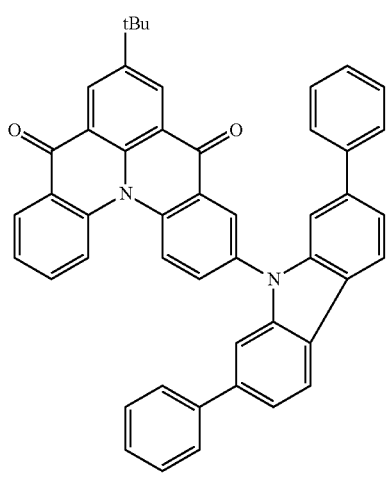
24
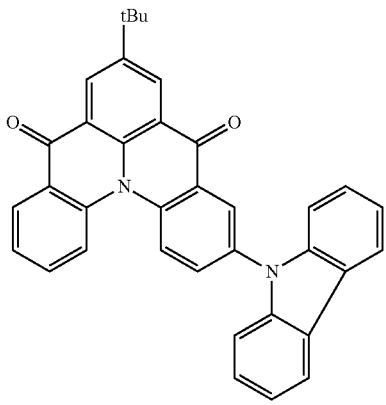
31
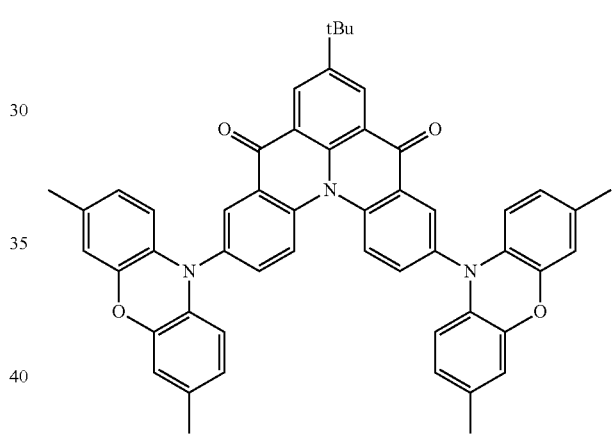
32
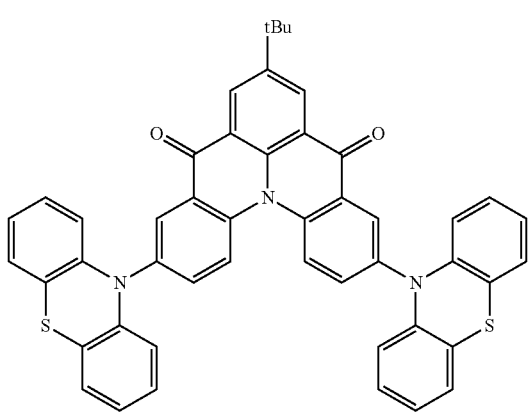

33
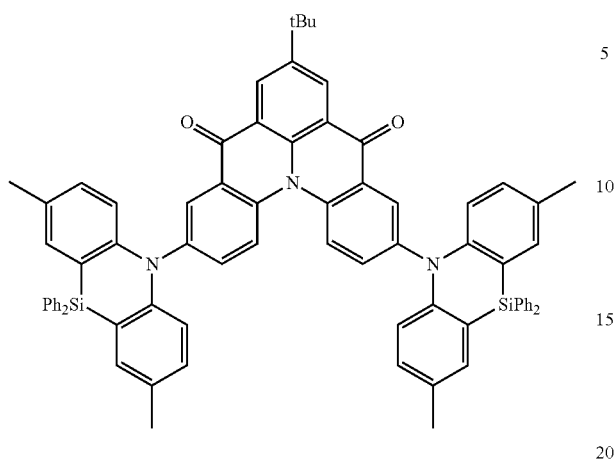
35
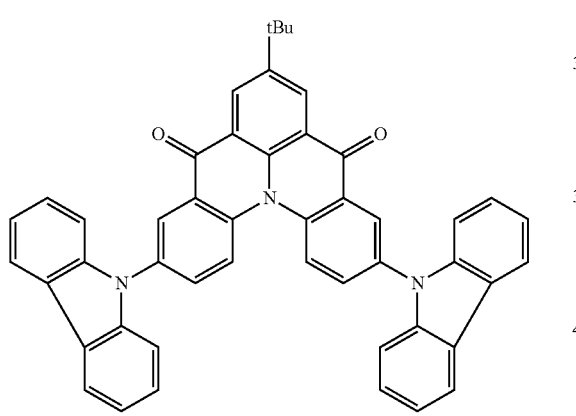
38
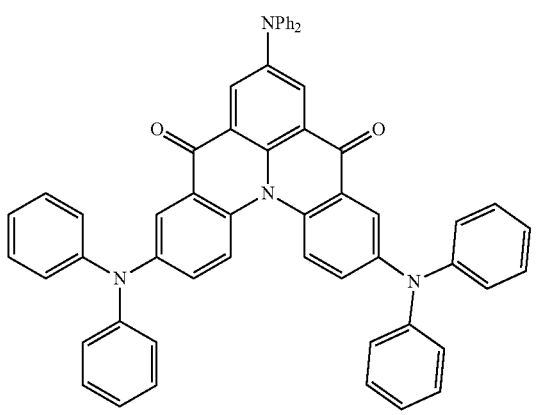
39
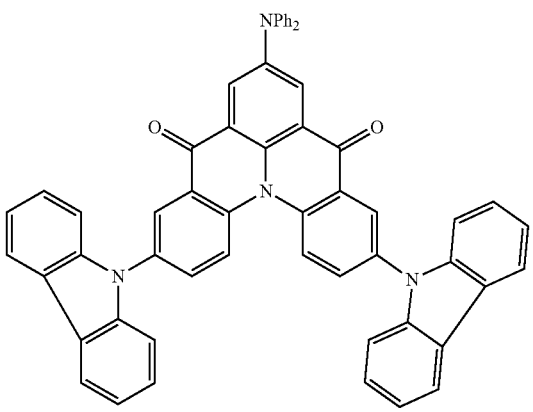
44
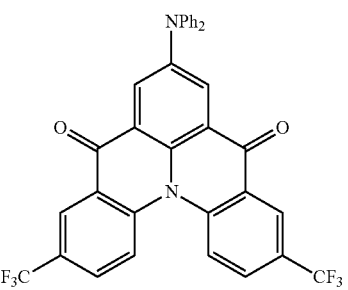
45
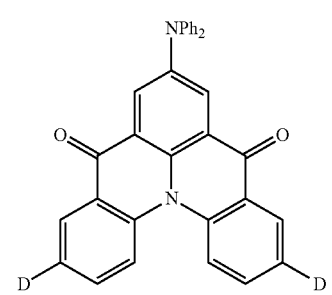
47
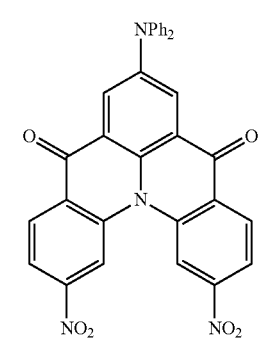

53
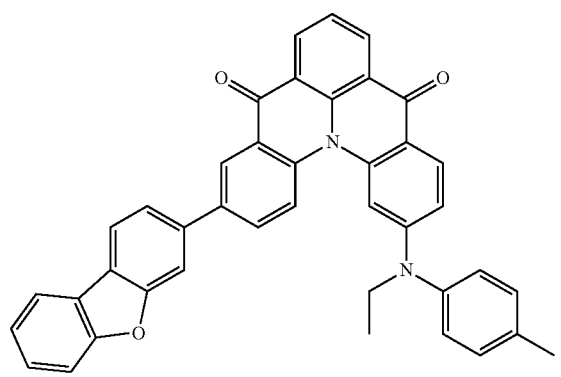
54
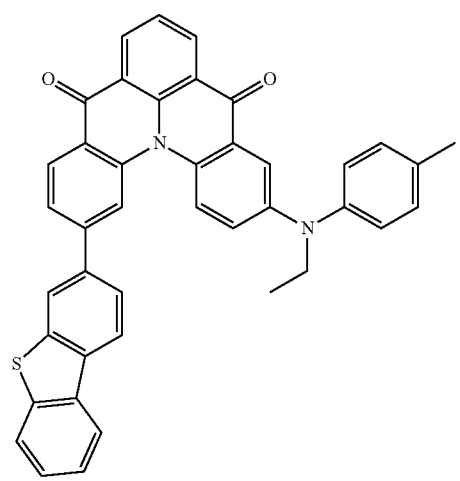
56
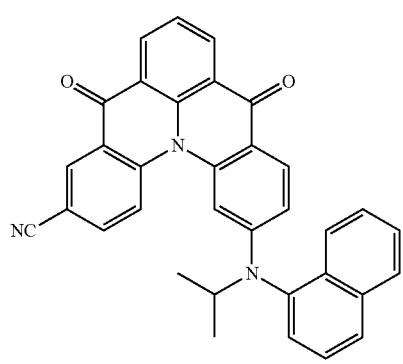
65
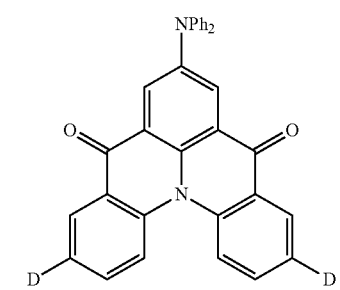
68
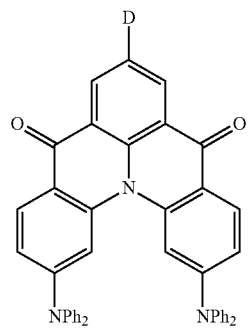
73
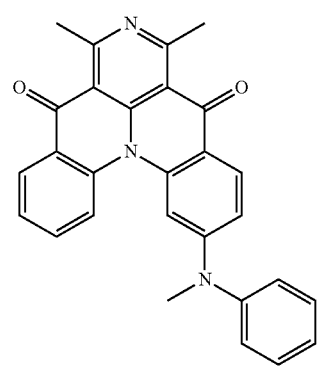
74
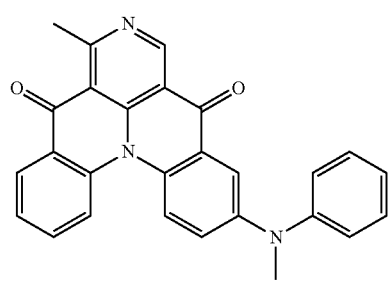
76
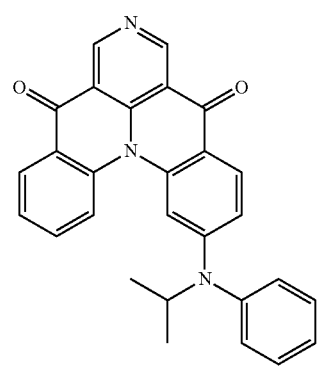

78
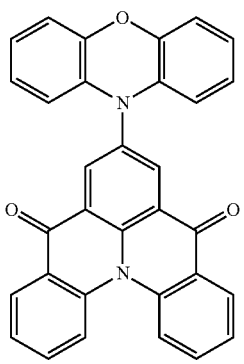
79
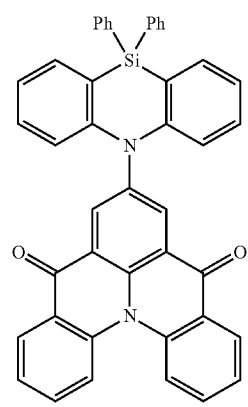
80
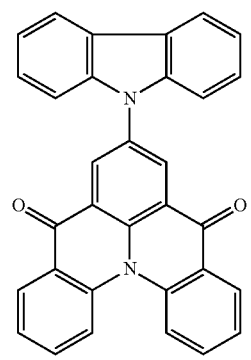
85
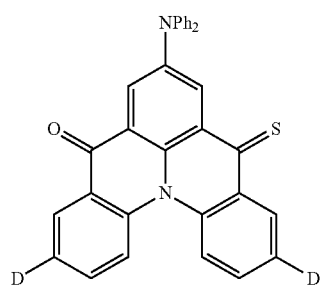
88
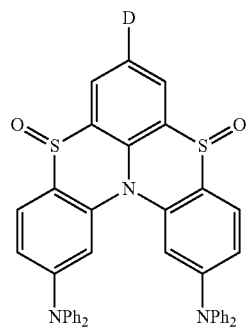
92
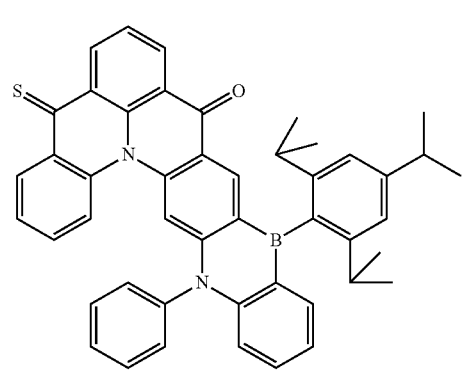
93
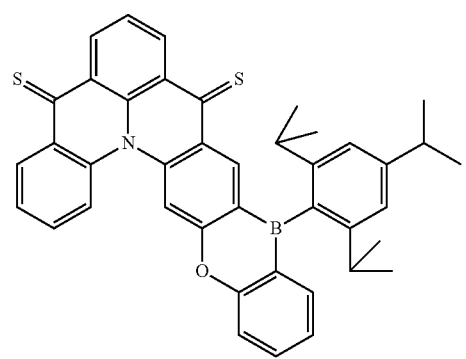
94
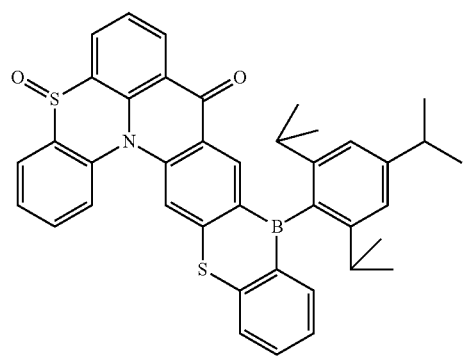

-continued
| | |
|---|---|
| 95 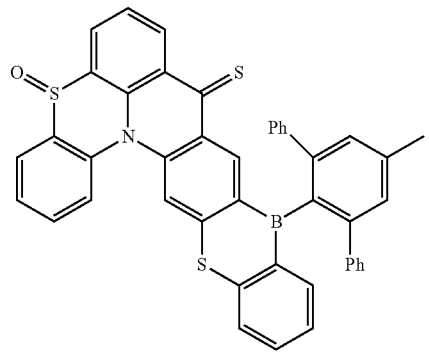 | 99 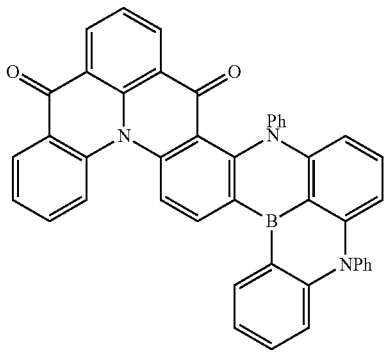 |
| 96 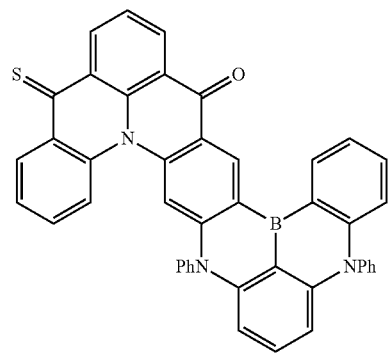 | 100 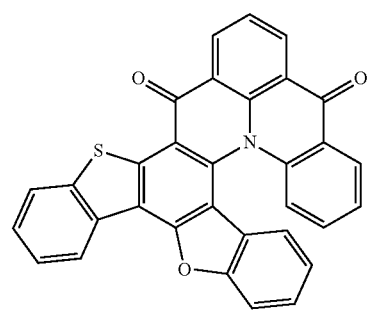 |
| 97 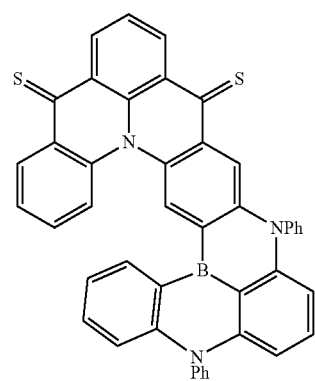 | 101 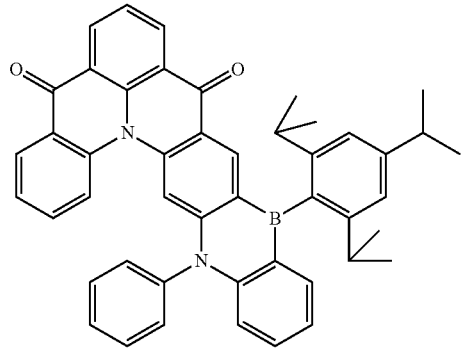 |
| 98 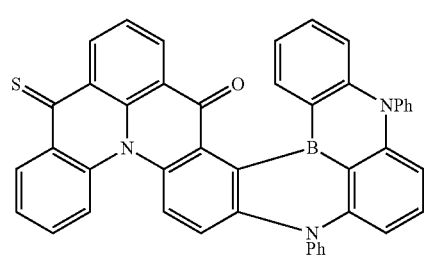 | 102 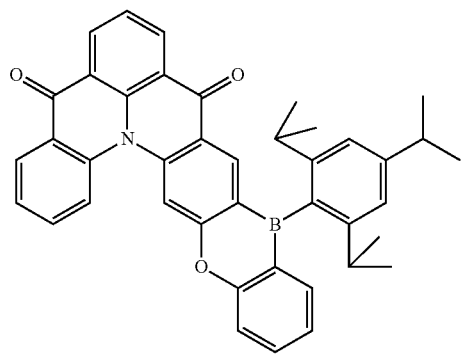 |

-continued
103
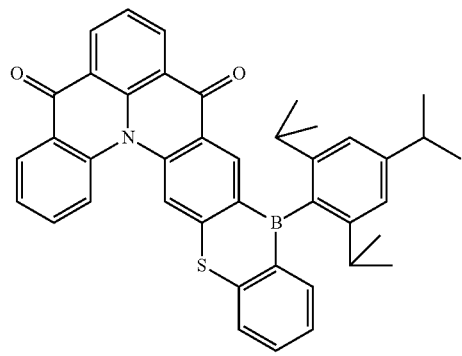
104
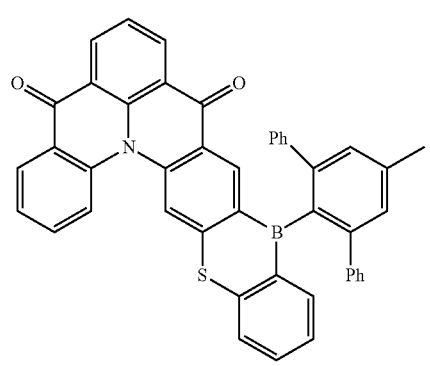
105
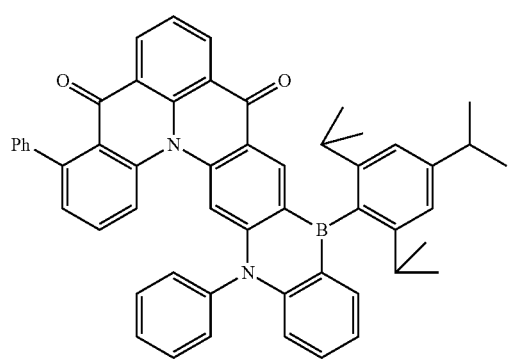
106
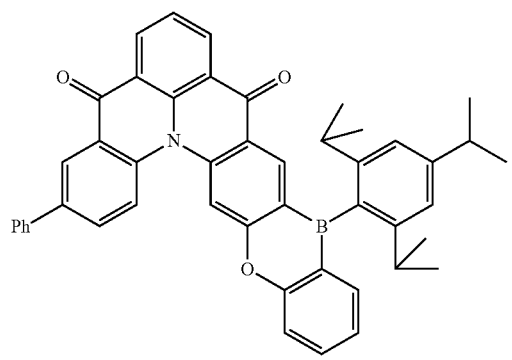
-continued
107
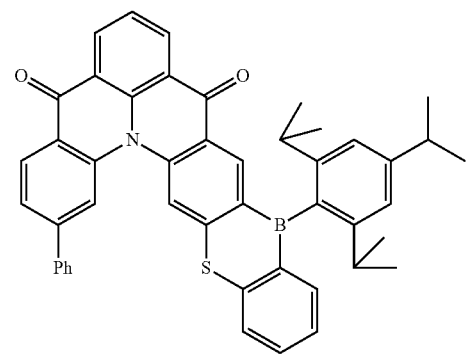
108
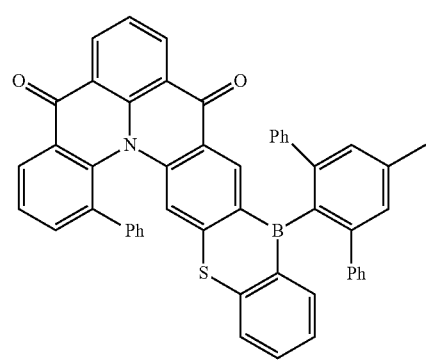
109
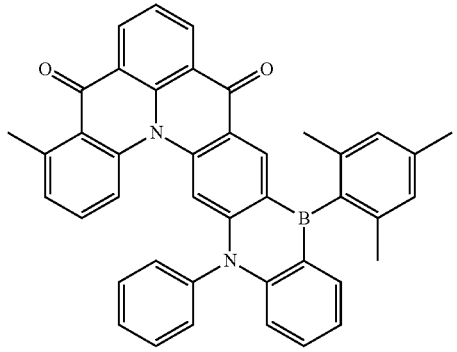
110
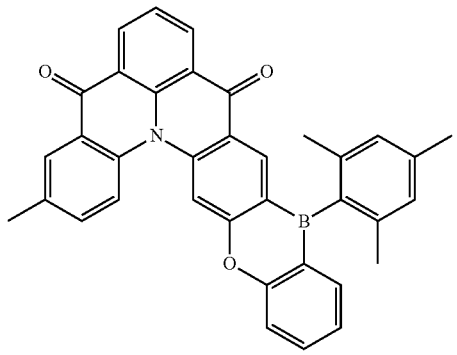

111
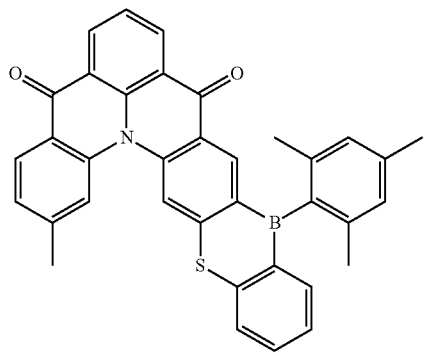
112
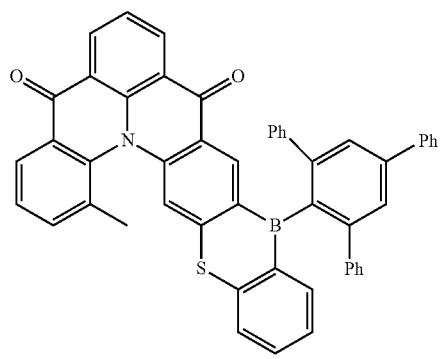
113
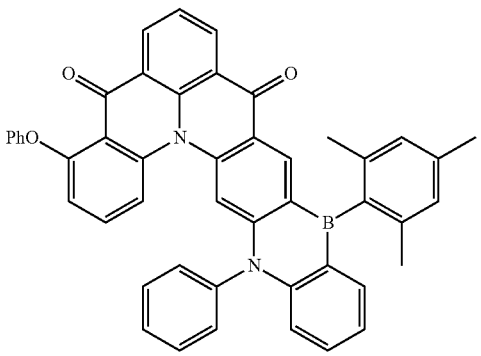
115
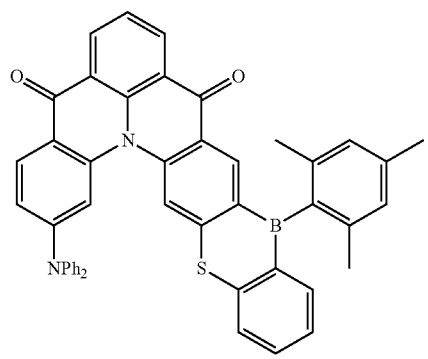
116
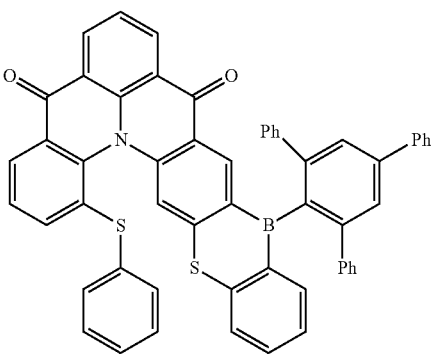
117
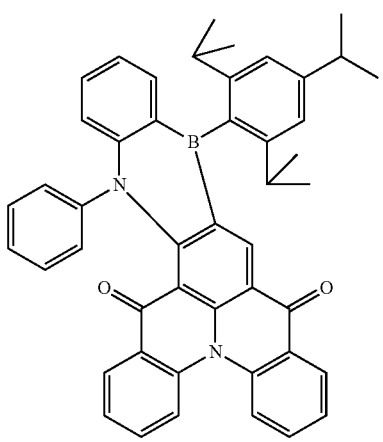
118
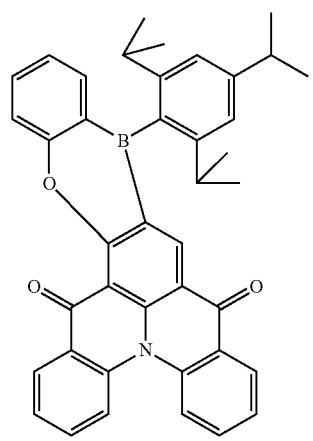

119
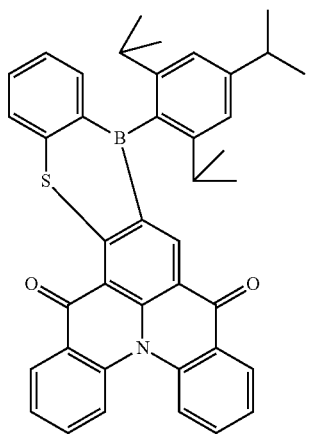
120
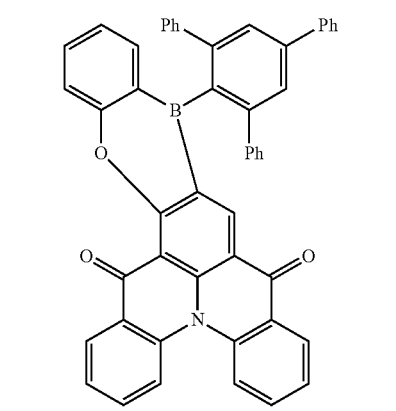
121
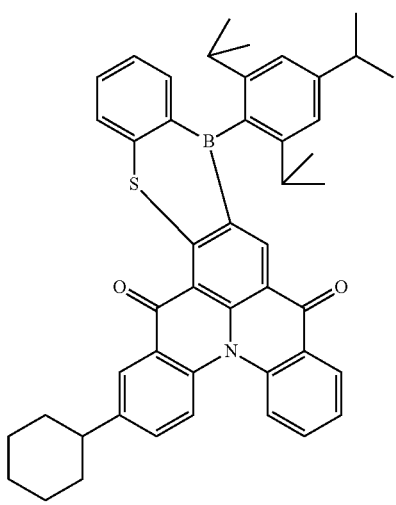
122
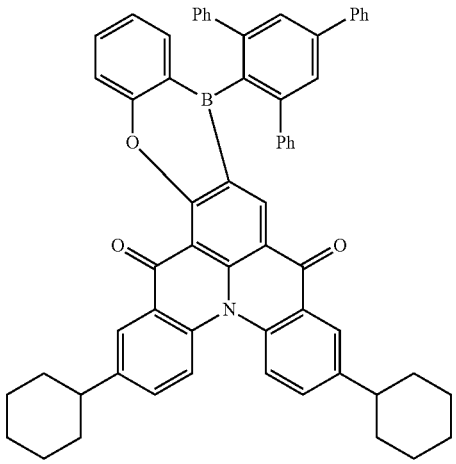
123
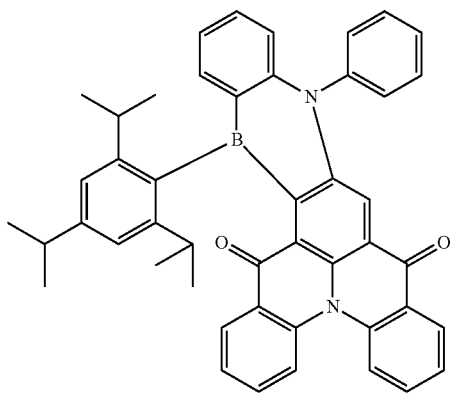
124
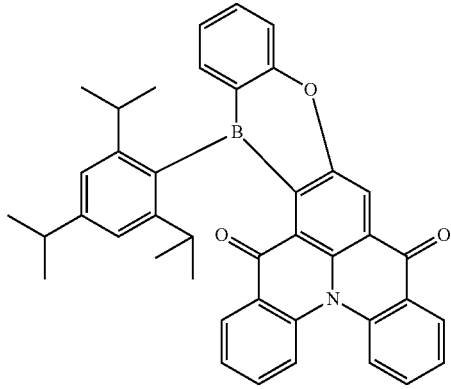
125
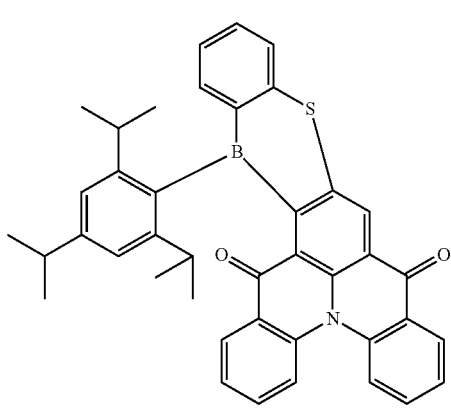

126
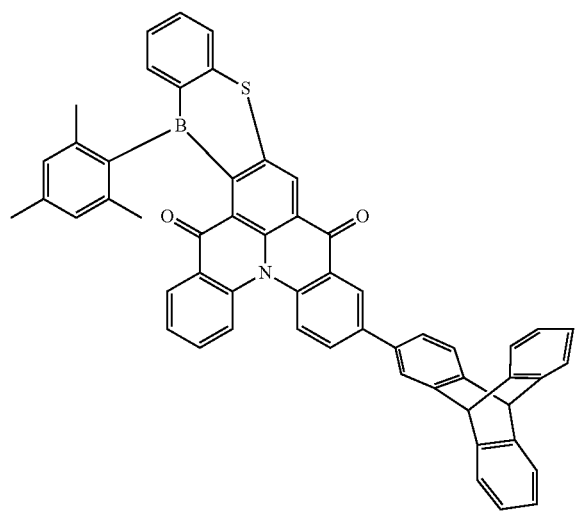
127
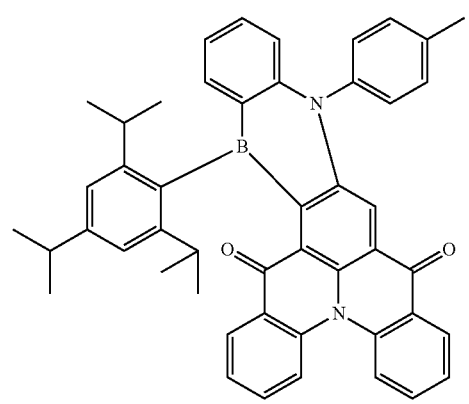
128
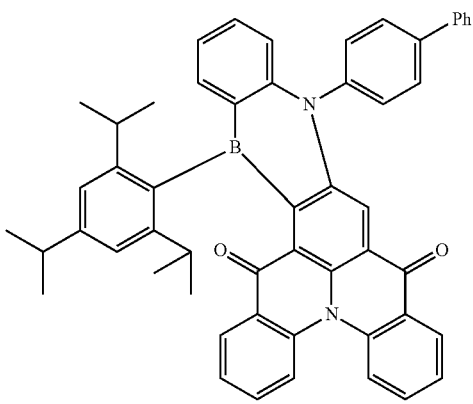
129
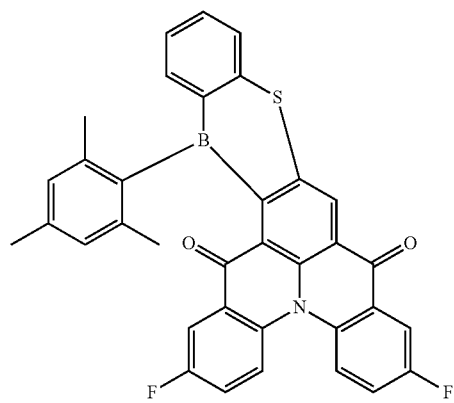
130
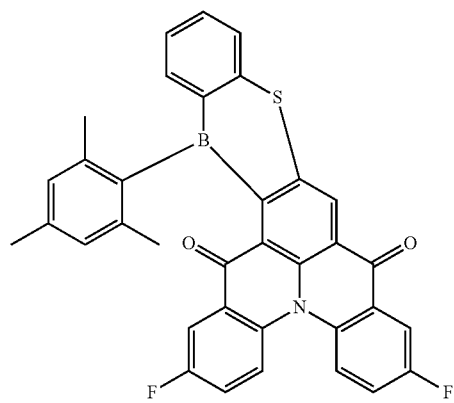
131
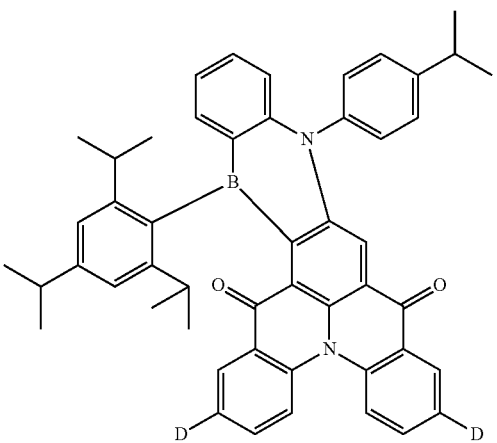

132
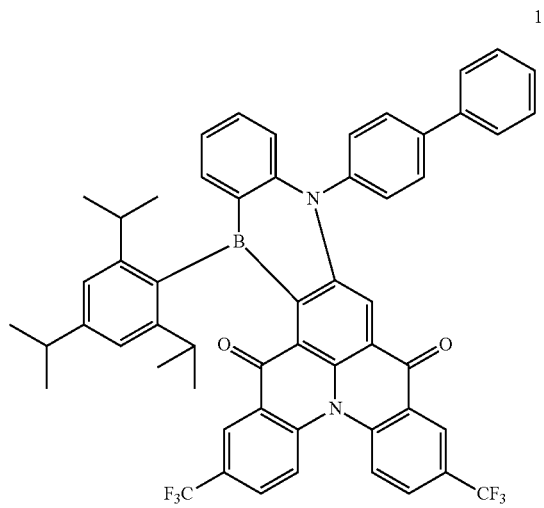
135
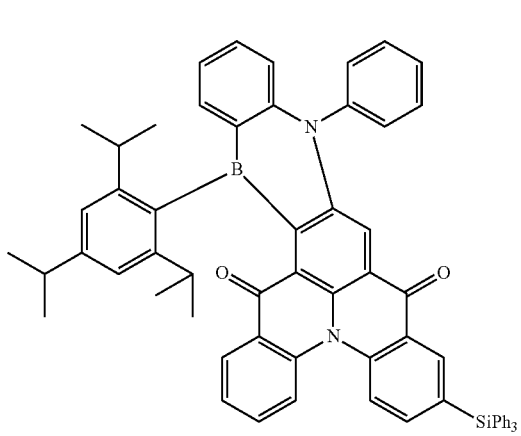
133
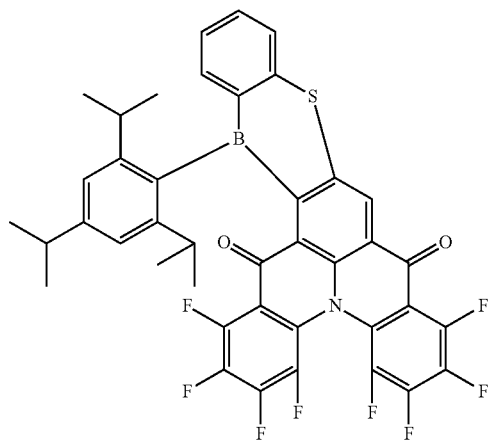
136
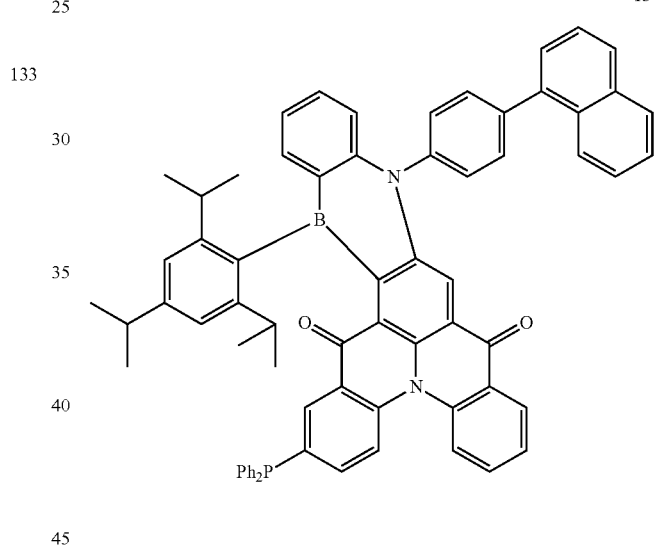
134
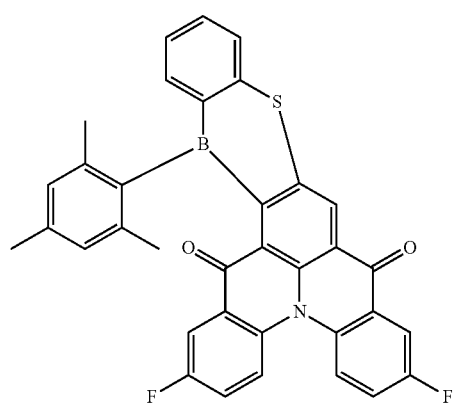
137
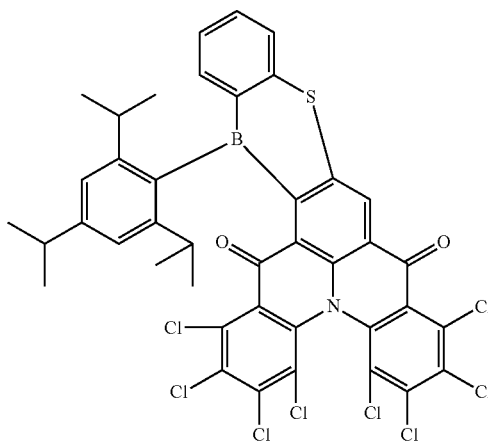

138 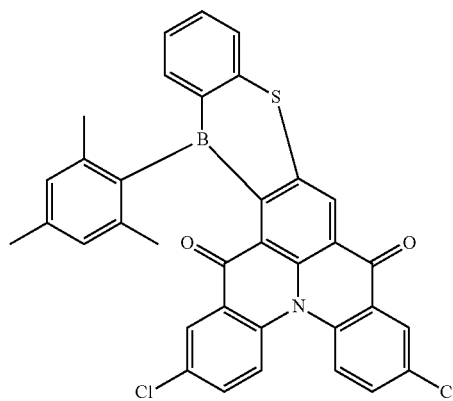
139 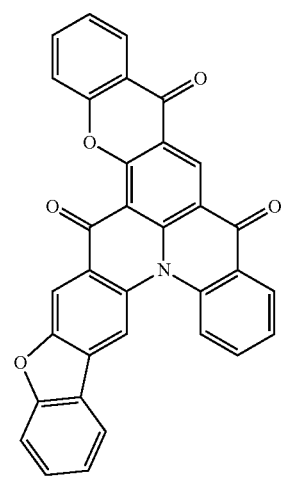
146 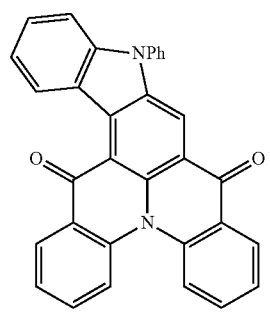
147 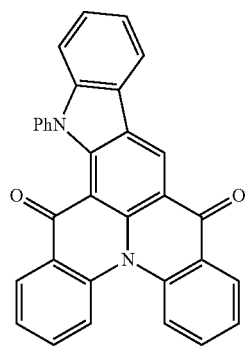
171 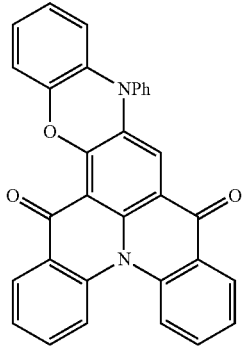
172 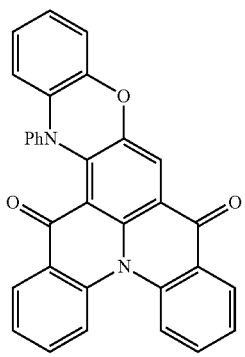
173 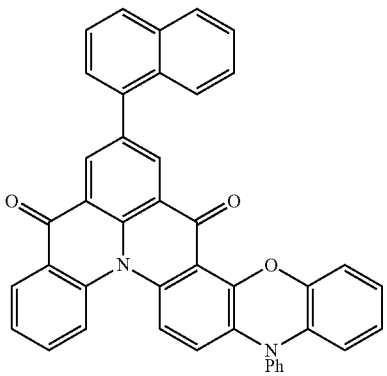
190 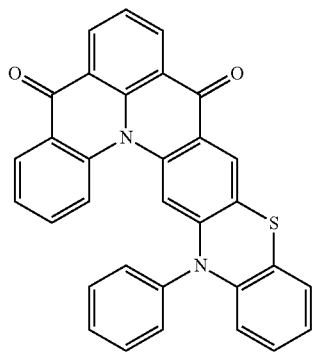

191
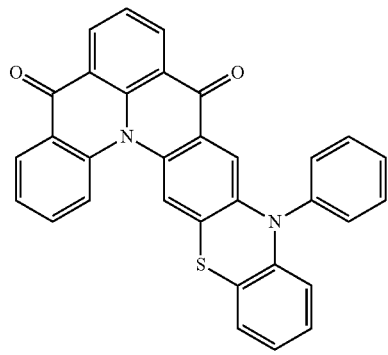
192
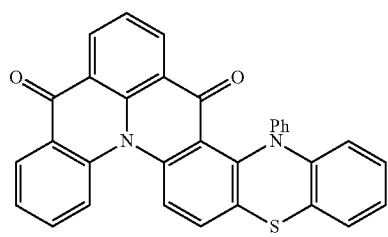
193
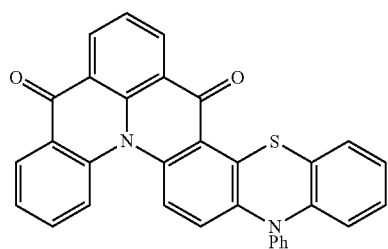
194
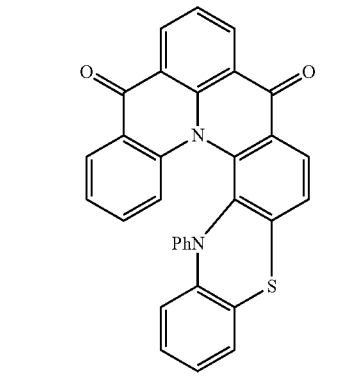
195
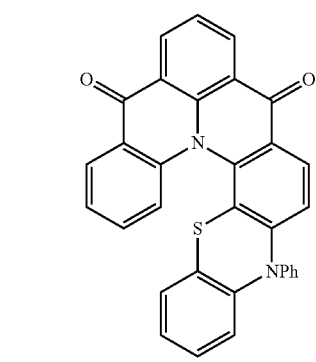
196
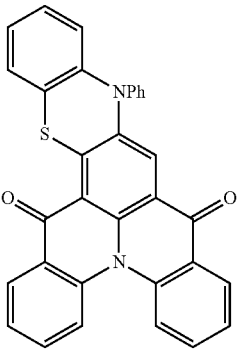
197
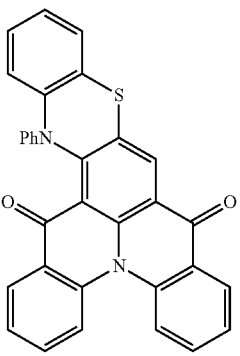
198
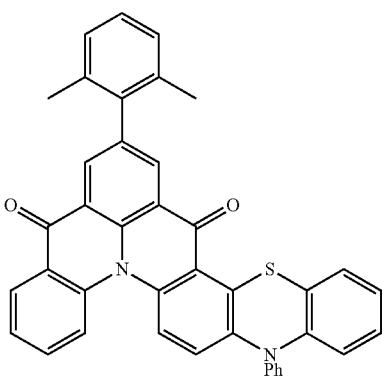
199
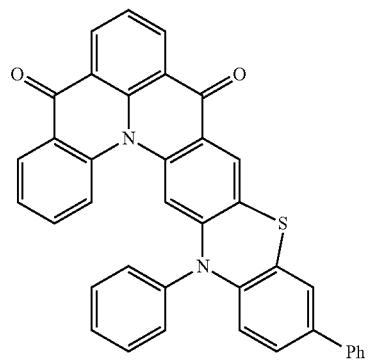

200 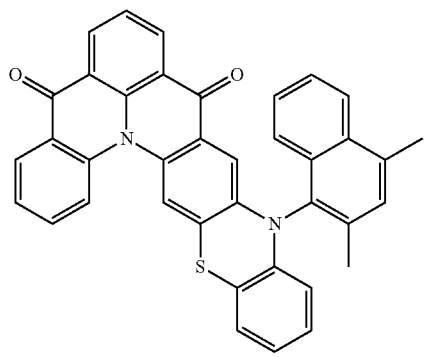
201 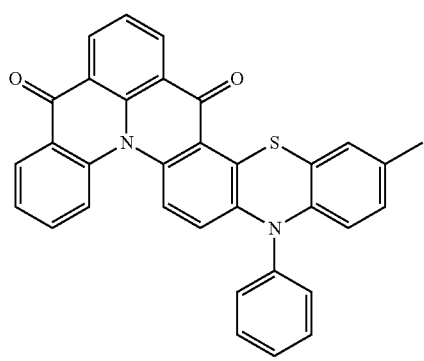
202 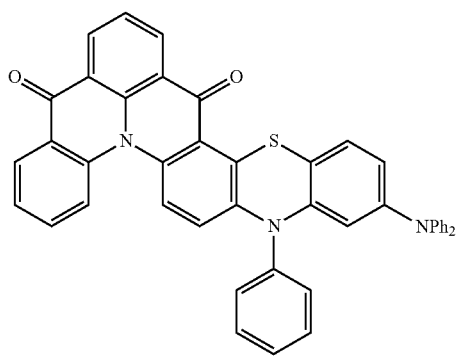
203 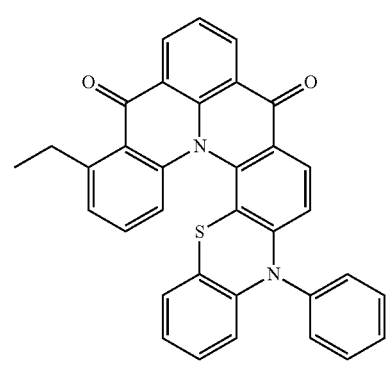
204 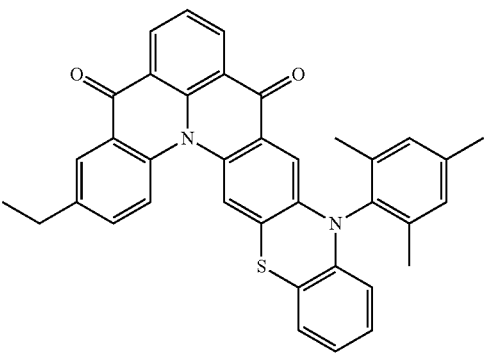
205 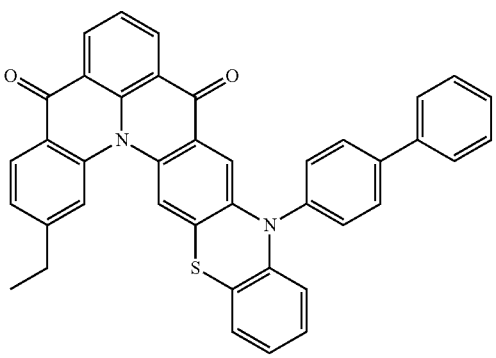
206 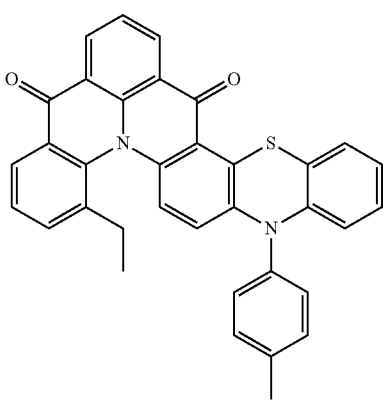
207 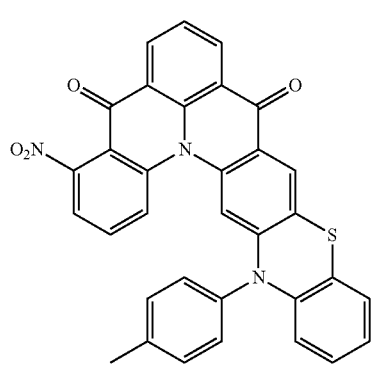

208
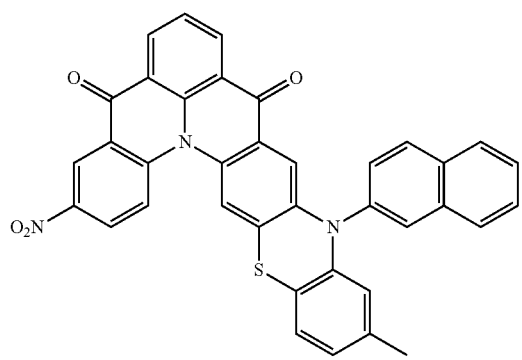
209
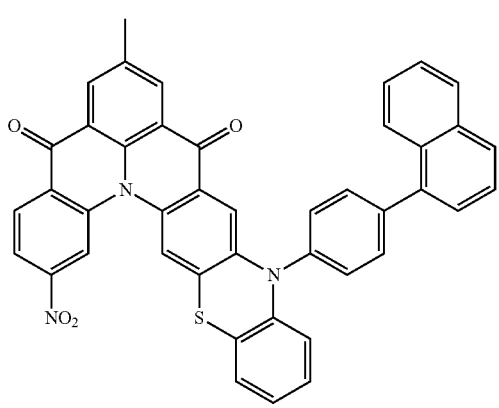
210
212
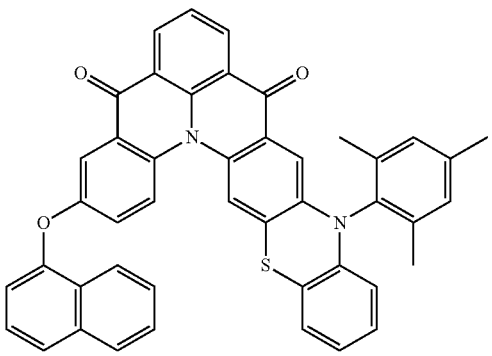
213
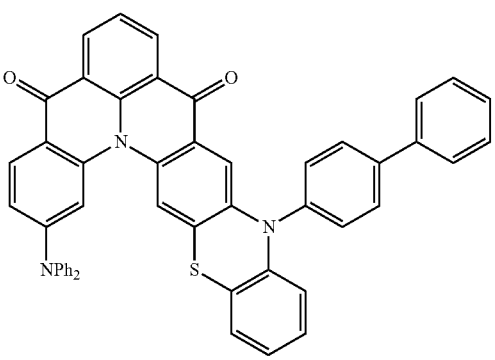
221
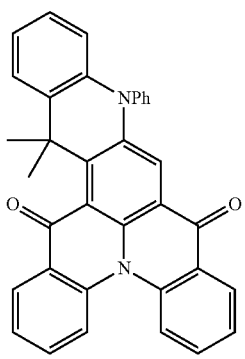
211
222
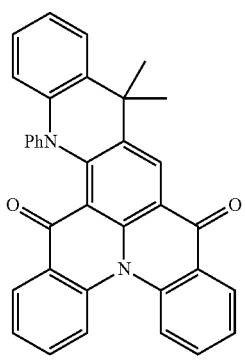

-continued
223
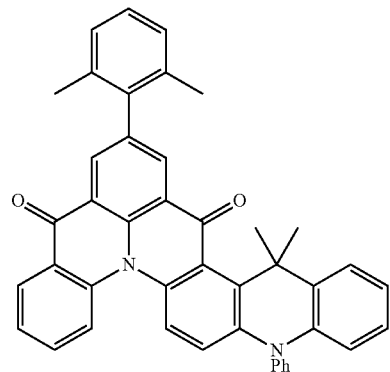
230
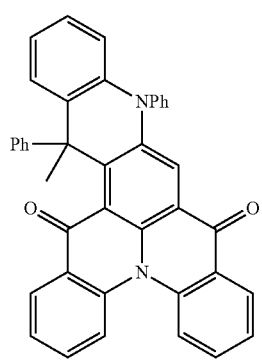
231
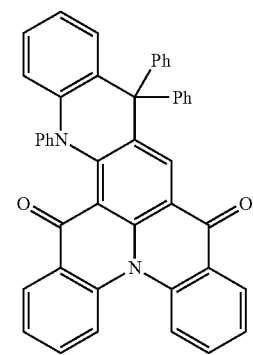
232
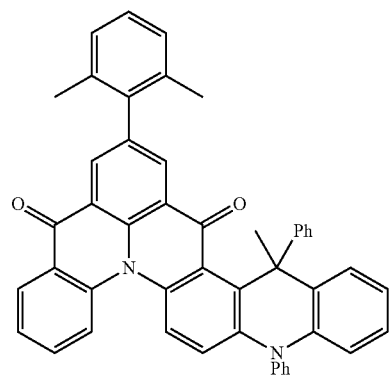
-continued
239
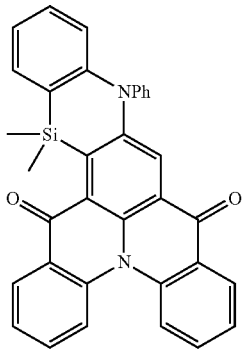
240
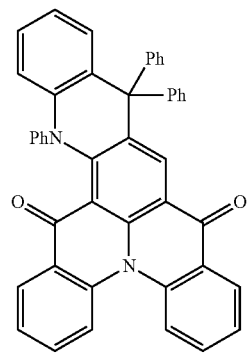
241
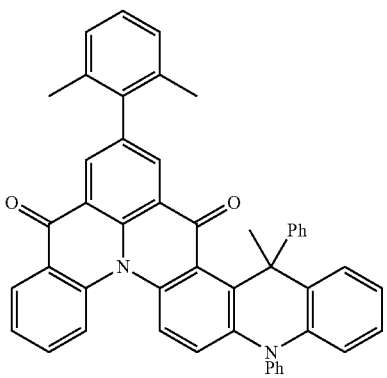
242
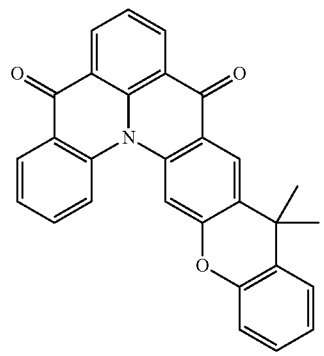

| | |
|---|---|
| 248 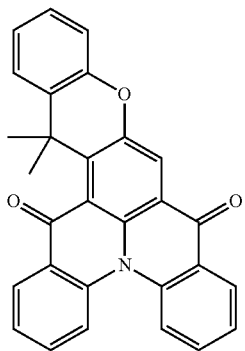 | 252 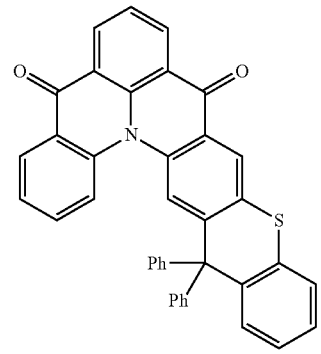 |
| 249 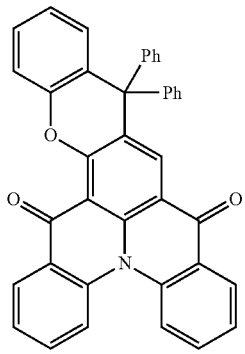 | 253 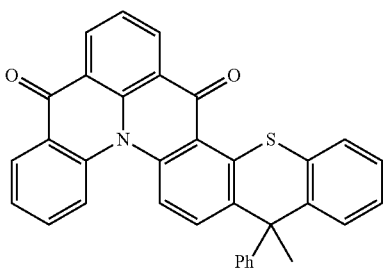 |
| 250 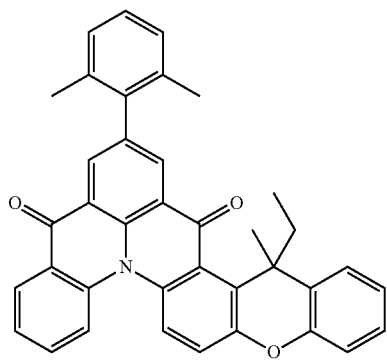 | 254 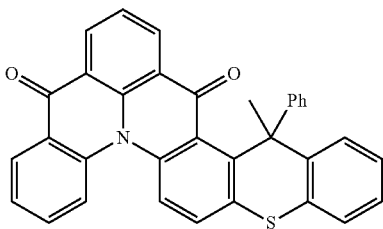 |
| 251 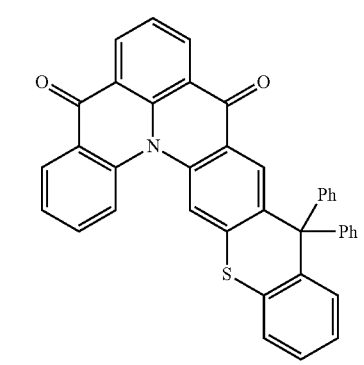 | 255 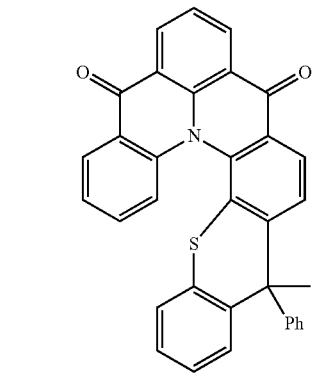 |
| | 256 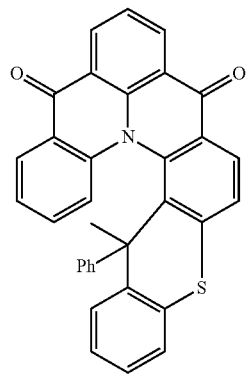 |

257 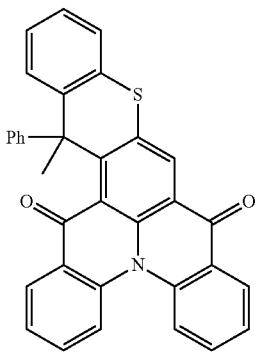
258 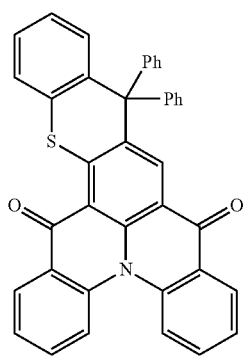
259 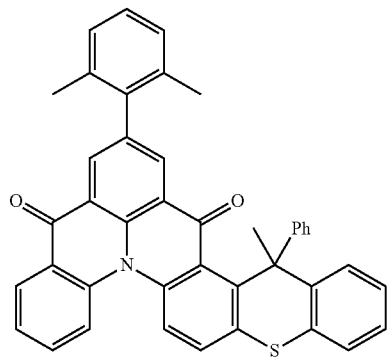
260 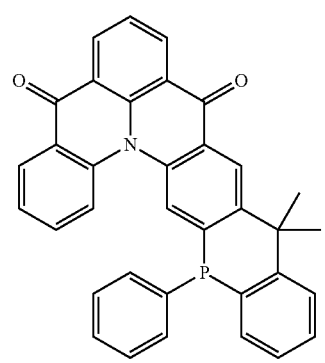
261 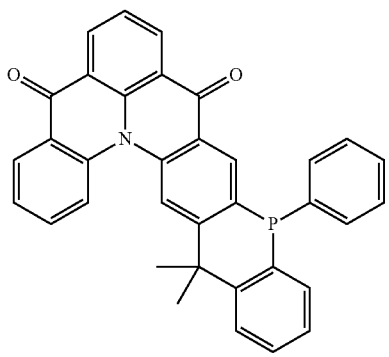
262 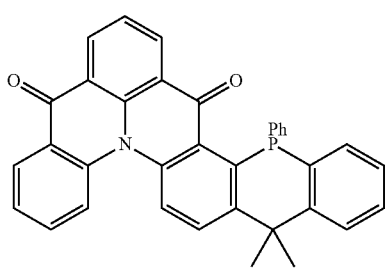
263 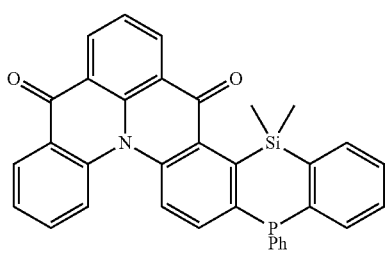
264 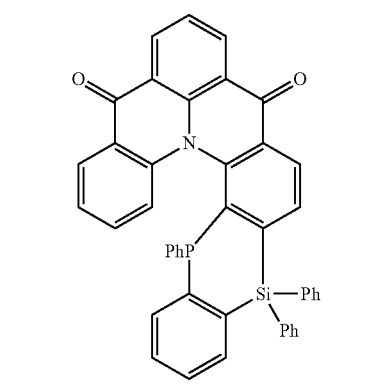
265 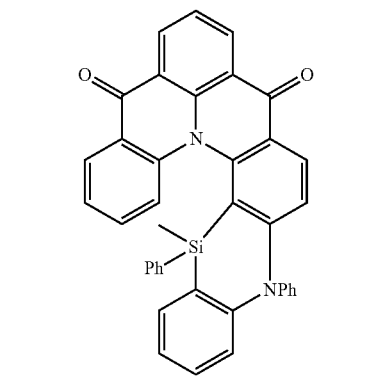

266 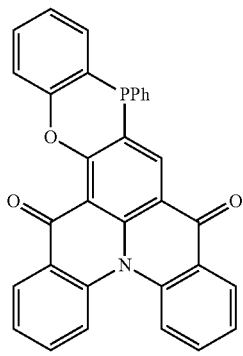
267 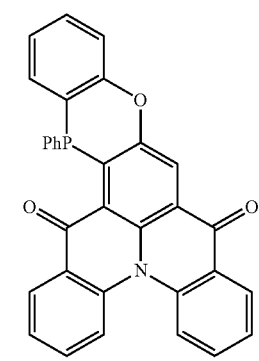
268 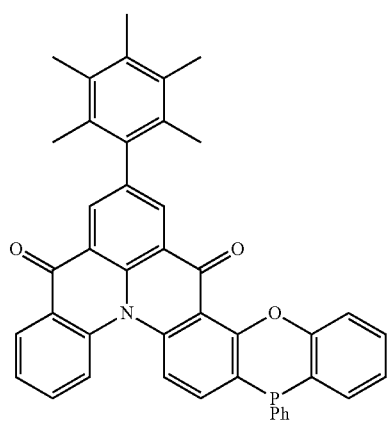
269 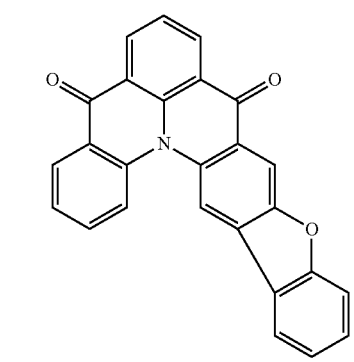
270 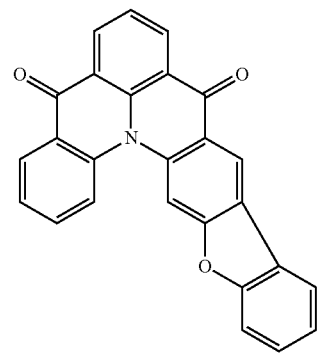
271 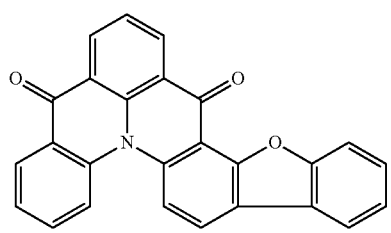
272 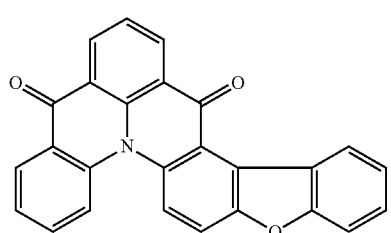
273 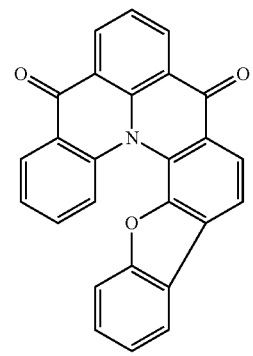
274 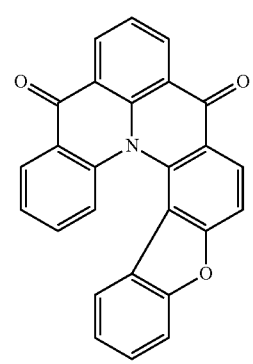

275 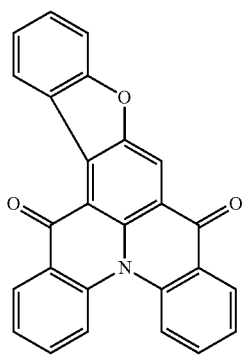
276 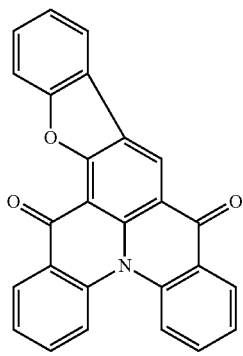
277 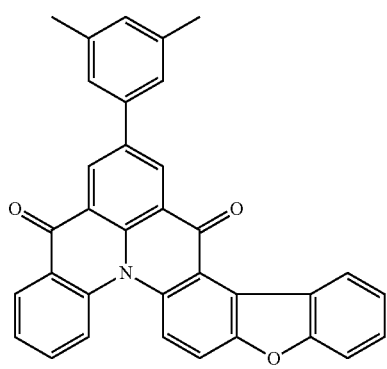
278 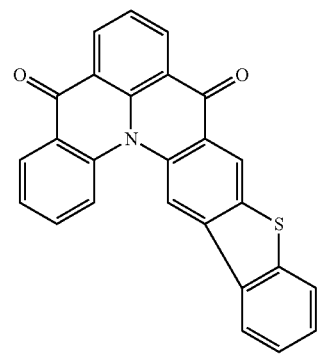
279 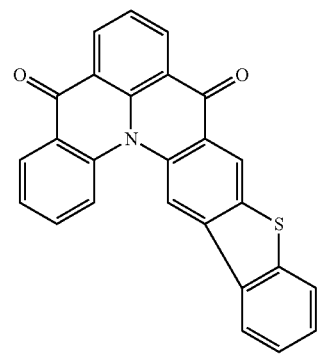
280 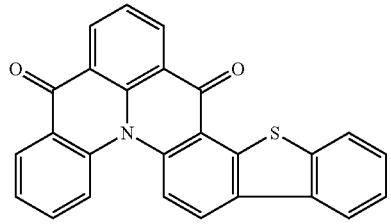
281 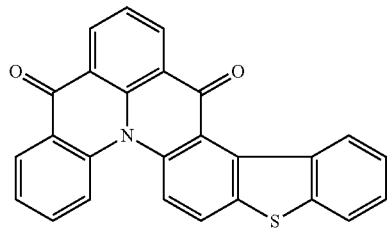
282 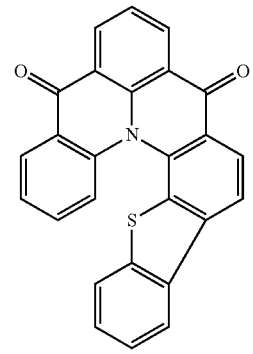
283 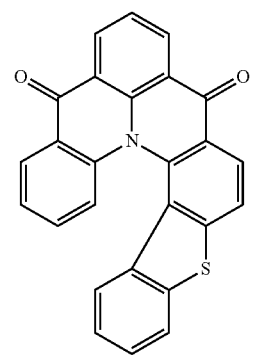

| 284 | 292 |
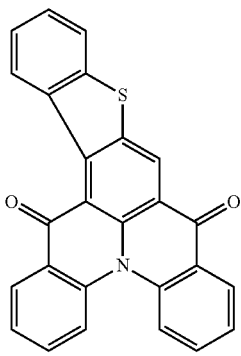
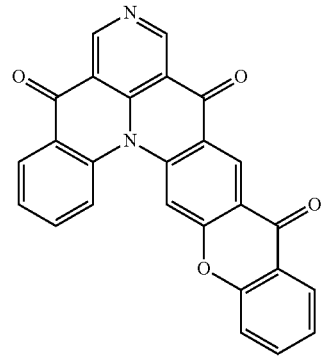
| 285 | 293 |
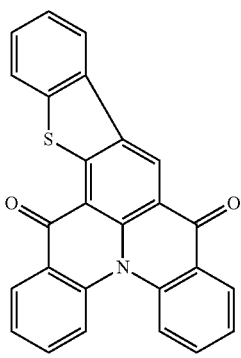
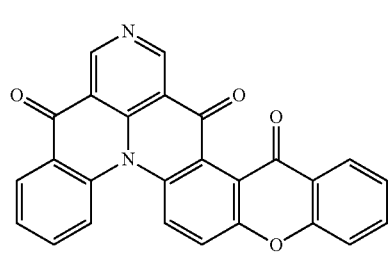
| 286 | 294 |
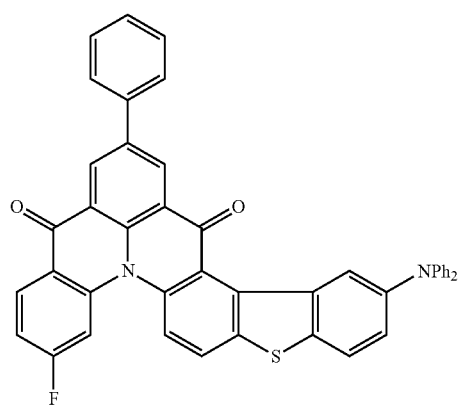
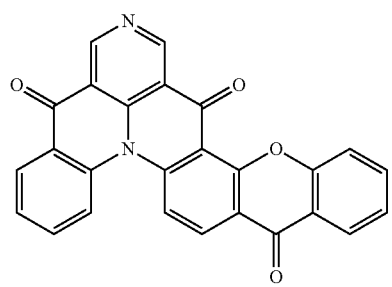
| 291 | 295 |
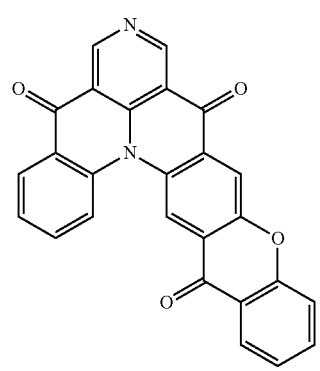
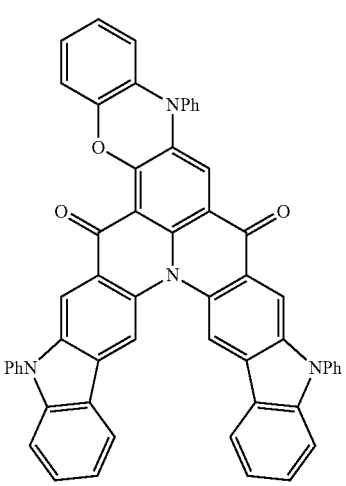

-continued

304

305

306

307

308

-continued

309

310

311

312

313

| | |
|---|---|
| 314 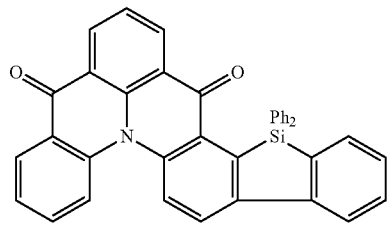 | 319 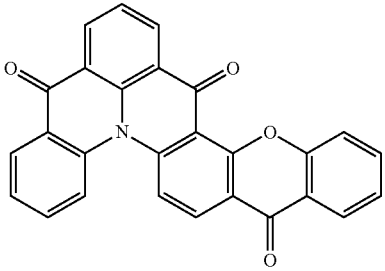 |
| 315 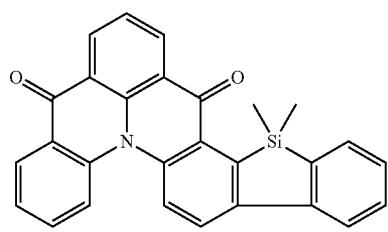 | 320 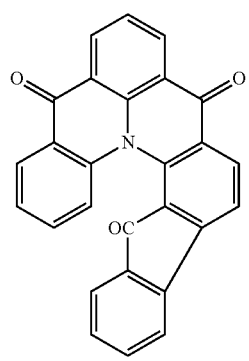 |
| 316 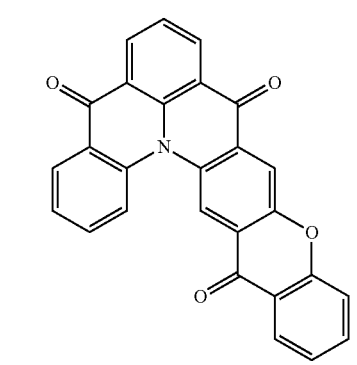 | 321 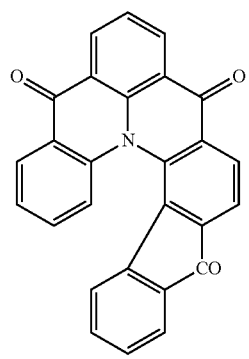 |
| 317 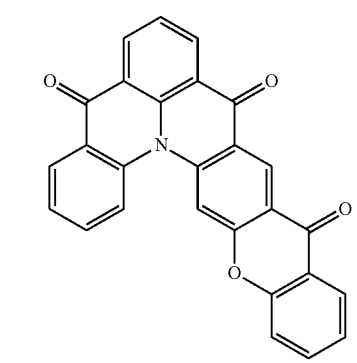 | 322 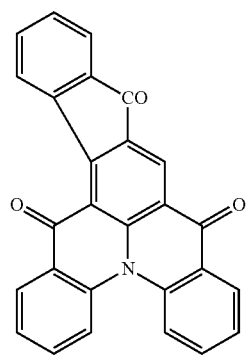 |
| 318 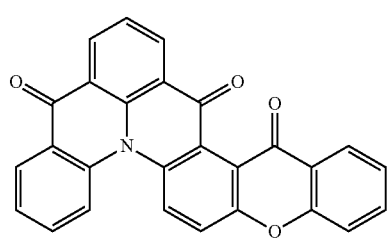 | |

-continued
323
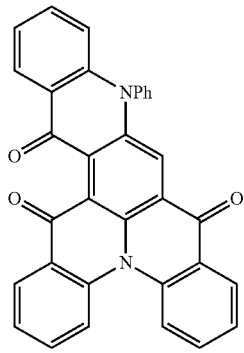
324
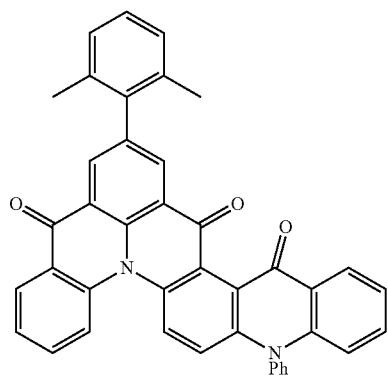
325
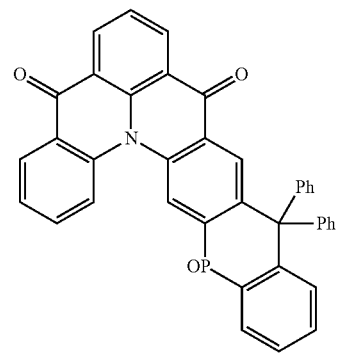
326
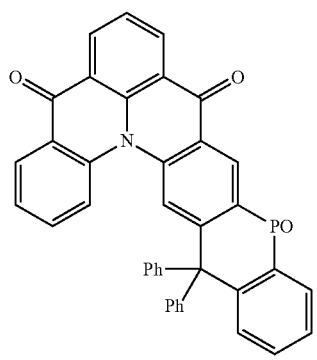
-continued
327
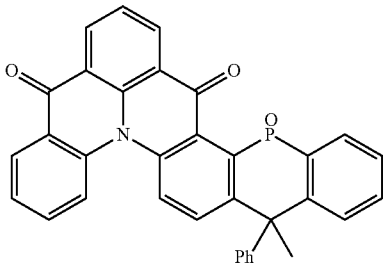
328
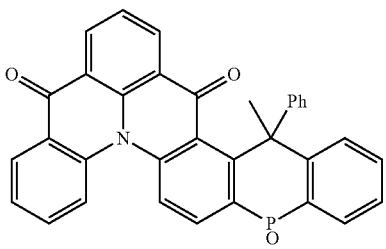
330
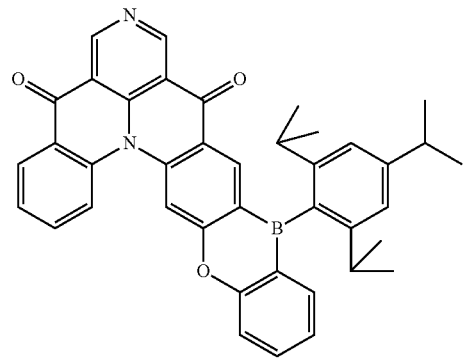
331
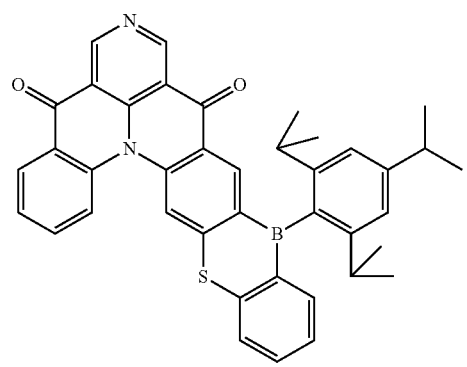

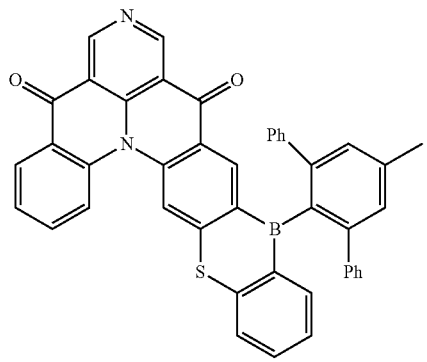
332
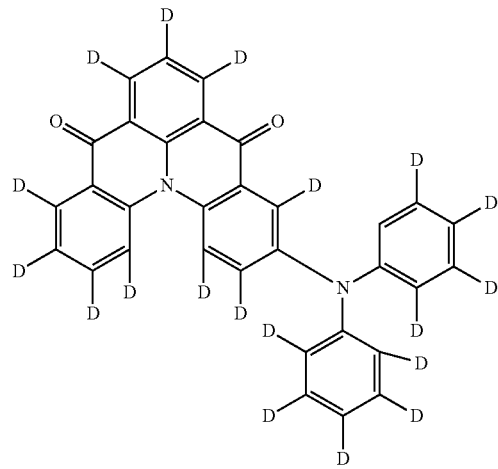
337
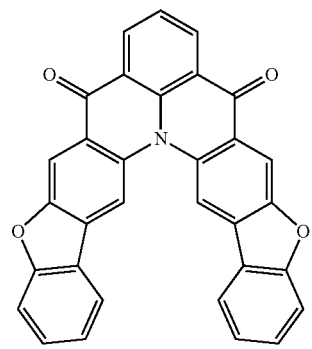
334
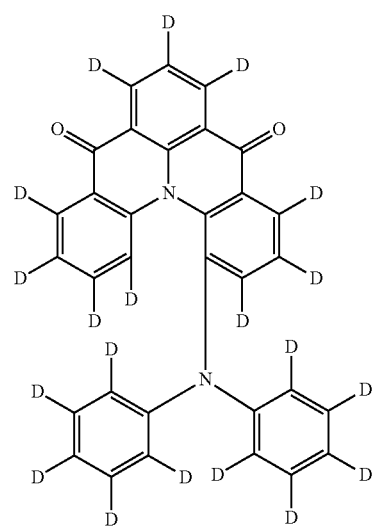
338
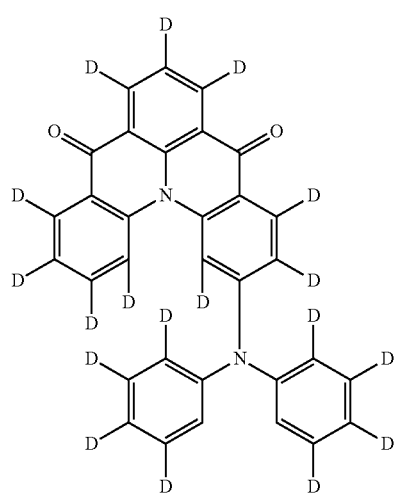
336
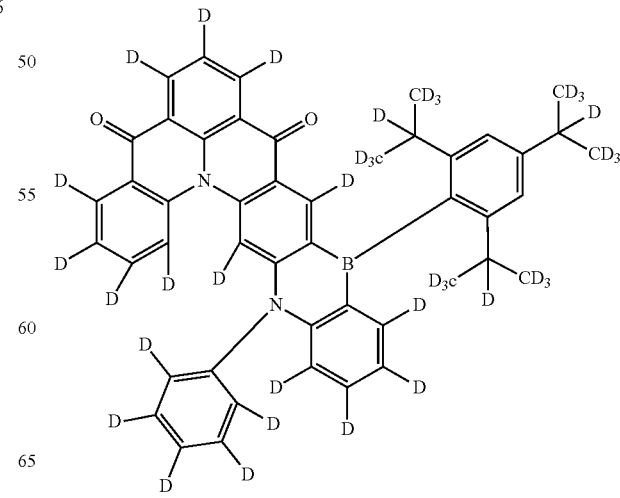
339

-continued

340

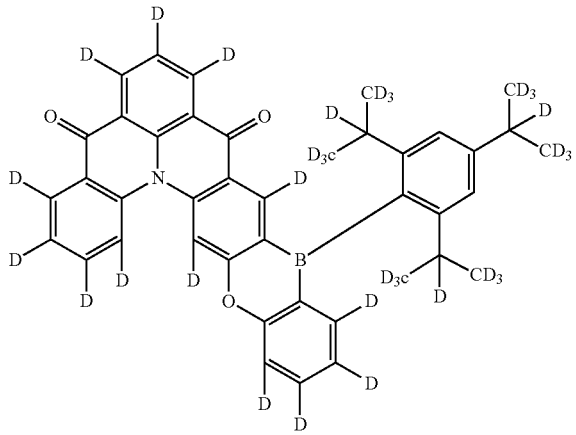

341

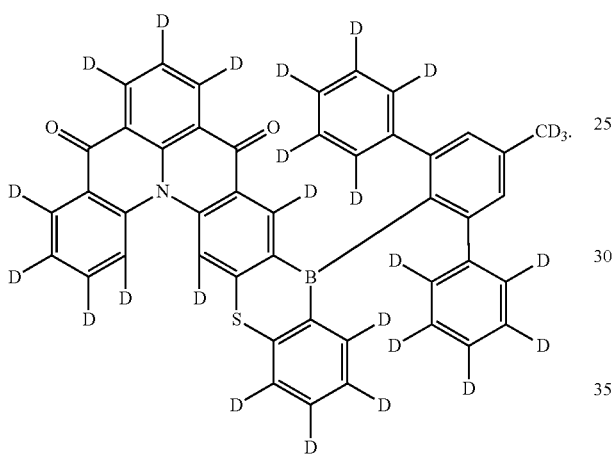

7. An organic electroluminescence device, comprising:
a first electrode;
a second electrode disposed on the first electrode; and
an emission layer disposed between the first electrode and the second electrode and comprising a polycyclic compound represented by Formula 1, wherein
the polycyclic compound has an external quantum efficiency in a range of about 10% to about 20% at a luminance of about 1,000 cd/m²:

[Formula 1]

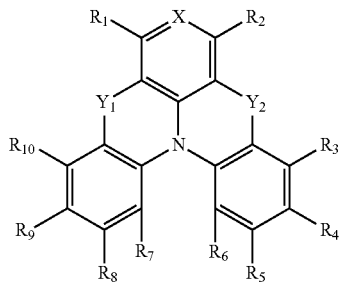

wherein in Formula 1,
X is N or —C($R_{11}$),
$Y_1$ and $Y_2$ are each independently —C=O, —C=S, or —S=O, $R_1$ to $R_6$, are each independently a hydrogen atom, a deuterium atom, a halogen atom, a cyano group, a nitro group, a carbonyl group, a substituted or unsubstituted thio group, a substituted or unsubstituted amine group, a substituted or unsubstituted oxy group, a substituted or unsubstituted silyl group, a substituted or unsubstituted boryl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring,
provided that:
two adjacent groups among $R_1$, $R_2$, and $R_{11}$ are optionally to form a ring; or
two adjacent groups among $R_3$ to $R_6$ are optionally combined to form a ring,
$R_7$ to $R_{10}$ are each indecently a hydrogen atom, a deuterium atom, a halogen atom, a cyano group, a nitro group, a carbonyl group, a substituted or unsubstituted thio group, a substituted or unsubstituted amine group, a substituted or unsubstituted oxy group, a substituted or unsubstituted silyl group, a substituted or unsubstituted boryl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms,
at least one of $R_1$ to $R_{11}$ is represented by Formula 2 or Formula 3, and
when at least one of $R_1$ to $R_{10}$ is represented by Formula 2, X is —C($R_{11}$) and $R_{11}$ is a deuterium atom, a methyl group, a isopropyl group, a t-butyl group, a substituted amine group, or a substituted phenyl group, or combined with an adjacent group to form a ring:

[Formula 2]

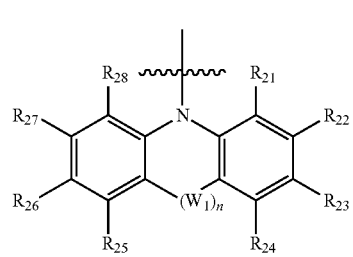

[Formula 3]

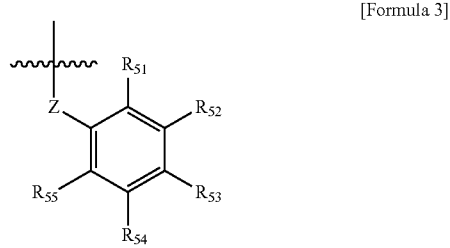

wherein in Formula 2,
n is 0 or 1,
$W_1$ is a direct linkage, —B($R_{29}$), —C=O, O, S, —SO, —SO$_2$, —N($R_{30}$), —P=O, —P($R_{31}$), or —Si($R_{32}$)($R_{33}$),
wherein in Formula 3,
Z is —B($R_{56}$), —C=O, O, S, —SO, —SO$_2$, —N($R_{57}$), —P=O, —P($R_{58}$), or —Si($R_{59}$)($R_{60}$), wherein in Formula 2 and Formula 3, $R_{21}$ to $R_{33}$, and $R_{51}$ to $R_{60}$ are each independently a hydrogen atom, a deuterium atom, a halogen atom, a cyano group, a nitro group, a carbonyl group, a substituted or unsubstituted silyl group, a substituted or unsubstituted boryl group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group selected from $R_1$ to $R_6$, $R_{11}$, $R_{21}$ to $R_{33}$, and $R_{51}$ to $R_{60}$ to form a ring.

* * * * *